(12) United States Patent
Juds et al.

(10) Patent No.: US 9,819,118 B2
(45) Date of Patent: Nov. 14, 2017

(54) SWITCHING POWER CONNECTOR AND ELECTRICAL CONNECTION ELEMENT WITH SAFETY INTERLOCK

(71) Applicant: Eaton Corporation, Cleveland, OH (US)

(72) Inventors: Mark Allan Juds, New Berlin, WI (US); Paul Jason Rollmann, Menomonee Falls, WI (US); Jerome Kenneth Hastings, Sussex, WI (US); Kurt von Eckroth, Wales, WI (US); Jeffrey Troy Johnson, Greenfield, WI (US); Roger James Briggs, Colgate, WI (US); Kaushik Naidu Kona, Andhra pradesh (IN); Karthik Satyanarayanan, Tamilnadu (IN); Abhijeet Rathi, Dist-Buldhana (IN)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 15/331,960

(22) Filed: Oct. 24, 2016

(65) Prior Publication Data

US 2017/0098908 A1    Apr. 6, 2017

Related U.S. Application Data

(63) Continuation-in-part of application No. 15/215,918, filed on Jul. 21, 2016, which is a continuation of
(Continued)

(51) Int. Cl.
*H01H 3/02* (2006.01)
*H01R 13/53* (2006.01)
(Continued)

(52) U.S. Cl.
CPC ............... *H01R 13/53* (2013.01); *H01F 7/06* (2013.01); *H01R 13/62977* (2013.01);
(Continued)

(58) Field of Classification Search
CPC  H01H 3/02; H01H 3/043; H01H 3/46; H01H 23/14
(Continued)

(56) References Cited

U.S. PATENT DOCUMENTS 3,330,920 A    7/1967  Appleton
3,500,291 A    3/1970  Hubbell et al.
(Continued)

*Primary Examiner* — Gary Paumen
(74) *Attorney, Agent, or Firm* — Eckert Seamans; David Jenkins; Grant Coffield

(57) ABSTRACT

An electrical connection element is for a power connector. The power connector includes an electrical component having a number of first electrical mating members. The electrical connection element comprises: a housing including a number of second electrical mating members structured to be electrically connected to the number of first electrical mating members; a contact assembly enclosed by the housing and being electrically connected to the number of second electrical mating members; and an operating mechanism for opening and closing the contact assembly. The contact assembly is structured to electrically connect and disconnect power while the number of first electrical mating members remain mechanically coupled to the number of second electrical mating members.

16 Claims, 25 Drawing Sheets

Related U.S. Application Data application No. 14/800,768, filed on Jul. 16, 2015, now Pat. No. 9,478,900.

(51) Int. Cl.

| | | |
|---|---|---|
| *H01R 13/629* | (2006.01) | |
| *H01F 7/06* | (2006.01) | |
| *H03K 17/28* | (2006.01) | |
| *H01R 13/635* | (2006.01) | |
| *H01R 13/703* | (2006.01) | |
| *H01R 105/00* | (2006.01) | |
| *H01R 13/66* | (2006.01) | |
| *H01R 24/28* | (2011.01) | |
| *H01R 107/00* | (2006.01) | |

(52) U.S. Cl.
CPC ....... *H01R 13/635* (2013.01); *H01R 13/7036* (2013.01); *H03K 17/28* (2013.01); *H01R 13/6666* (2013.01); *H01R 24/28* (2013.01); *H01R 2105/00* (2013.01); *H01R 2107/00* (2013.01)

(58) Field of Classification Search
USPC .............. 200/239–232, 335, 337, 341, 401
See application file for complete search history.

(56) References Cited

U.S. PATENT DOCUMENTS

| | | |
|---|---|---|
| 3,828,224 A | 8/1974 | Hulshizer |
| 3,853,376 A | 12/1974 | Marechal |
| 3,982,804 A | 9/1976 | Marechal |
| 4,249,787 A | 2/1981 | Welu |
| 4,281,228 A | 7/1981 | Harmon |
| 4,525,610 A | 6/1985 | Le Magourou |
| 4,553,000 A | 11/1985 | Appleton |
| 5,234,350 A | 8/1993 | Marechal et al. |
| 5,697,798 A | 12/1997 | Marechal |
| 6,111,210 A | 8/2000 | Allison |
| 6,201,197 B1 | 3/2001 | Mori et al. |
| 6,201,460 B1* | 3/2001 | Winslett ................ H01H 83/12 335/132 |
| 6,382,990 B1 | 5/2002 | Marechal et al. |
| 6,416,362 B1 | 7/2002 | Conrad et al. |
| 6,802,741 B1 | 10/2004 | Shatkin |
| 6,998,549 B1* | 2/2006 | Bender ................ H02B 11/133 200/401 |
| 7,182,614 B2 | 2/2007 | Crestin |
| 7,491,080 B2 | 2/2009 | Houir Alami et al. |
| 7,497,740 B2 | 3/2009 | Mei et al. |
| 8,151,016 B2 | 4/2012 | McCoy |
| 8,415,579 B2 | 4/2013 | Muench et al. |
| 8,440,929 B2 | 5/2013 | Rosenkrans et al. |
| 8,641,456 B2 | 2/2014 | Wu |
| 8,821,184 B2 | 9/2014 | Yu et al. |
| 2007/0012554 A1* | 1/2007 | Lui .......................... H01H 1/20 200/341 |
| 2008/0305693 A1 | 12/2008 | Mei et al. |
| 2013/0037401 A1 | 2/2013 | Yuba et al. |
| 2014/0127926 A1 | 5/2014 | Condo et al. |
| 2014/0251774 A1* | 9/2014 | Gouhl ..................... H01H 1/50 200/401 |
| 2015/0101914 A1* | 4/2015 | Sorenson, Sr. ........ H01H 71/12 200/331 |
| 2015/0137915 A1* | 5/2015 | Mills ...................... H01H 71/12 335/11 |

* cited by examiner

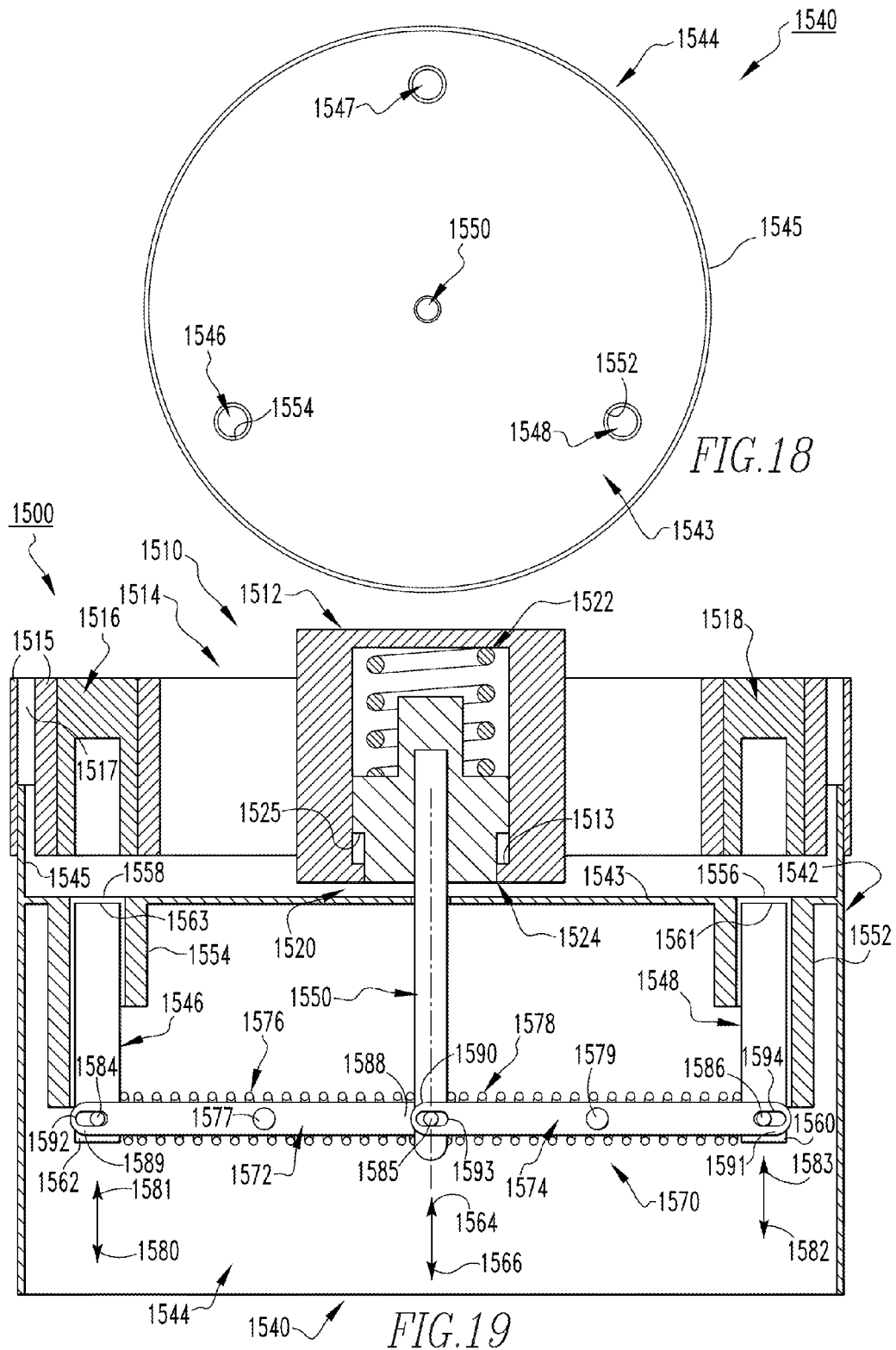

SWITCHING POWER CONNECTOR AND ELECTRICAL CONNECTION ELEMENT WITH SAFETY INTERLOCK

CROSS-REFERENCE TO RELATED APPLICATIONS

This application is a continuation-in-part patent application and claims priority to U.S. patent application Ser. No. 15/215,918, filed Jul. 21, 2016, which application is a continuation of U.S. patent application Ser. No. 14/800,768, filed on Jul. 16, 2015, and entitled "POWER CONNECTOR, AND ELECTRICAL CONNECTION ELEMENT AND OPERATING METHOD THEREFOR."

BACKGROUND

Field

The disclosed concept pertains generally to power connectors. The disclosed concept also pertains to electrical connection elements for power connectors. The disclosed concept further pertains to methods of operating power connectors.

Background Information

Power connectors are used in many different electrical applications, such as, for example, in commercial applications (e.g., employed with stoves and fryers) and in shipping industries (e.g., with refrigeration equipment). Typically, power connectors include a line side receptacle, which is electrically connected to a power source, and a load side receptacle. The line side receptacle has a number of metallic sleeves. The load side receptacle has a number of metallic pins. In operation, the pins are inserted into the sleeves in order to provide an electrical pathway between the line side receptacle and the load side receptacle.

A substantial drawback with power connectors is known as "hot plugging," which occurs when there is a live electrical connection or disconnection made between the pins and the sleeves, and the integrity of the pins and sleeves is compromised. For example, when the pins are inserted into the sleeves, electricity is permitted to flow therethrough. When this connection is made, a significant amount of switching energy is focused on the pins and the sleeves, which can undesirably result in the pins and sleeves melting, and/or being welded together, and/or damage to the surfaces of the pins and the sleeves, and/or an arc flash (e.g., "hot plugging").

There is, thus, room for improvement in power connectors and in electrical connection elements therefor.

There is also room for improvement in methods of operating power connectors.

SUMMARY

These needs and others are met by embodiments of the disclosed concept, which are directed to a power connector, and electrical connection element and operating method therefor in which a contact assembly electrically connects and disconnects power while separate mating members remain mechanically coupled.

In accordance with one aspect of the disclosed concept, an electrical connection element for a power connector is provided. The power connector includes an electrical component having a number of first electrical mating members. The electrical connection element comprises: a housing including a number of second electrical mating members structured to be electrically connected to the number of first electrical mating members; a contact assembly enclosed by the housing and being electrically connected to the number of second electrical mating members; and an operating mechanism for opening and closing the contact assembly. The contact assembly is structured to electrically connect and disconnect power while the number of first electrical mating members remain mechanically coupled to the number of second electrical mating members.

In accordance with another aspect of the disclosed concept, a power connector comprises: an electrical component having a number of first electrical mating members; and an electrical connection element comprising: a housing including a number of second electrical mating members electrically connected to the number of first electrical mating members, a contact assembly enclosed by the housing and being electrically connected to the number of second electrical mating members, and an operating mechanism for opening and closing the contact assembly. The contact assembly is structured to electrically connect and disconnect power while the number of first electrical mating members remain mechanically coupled to the number of second electrical mating members.

In accordance with another aspect of the disclosed concept, a method of operating a power connector is provided. The power connectors comprise an electrical component and an electrical connection element. The electrical component has a number of first electrical mating members. The electrical connection element comprises a housing including a number of second electrical mating members, a contact assembly enclosed by the housing and being electrically connected to the number of second electrical mating members, and an operating mechanism for opening and closing the contact assembly. The method comprises the steps of: mechanically coupling the number of first electrical mating members to the number of second electrical mating members; closing the contact assembly in order to electrically connect power after the number of first electrical mating members are mechanically coupled to the number of second electrical mating members; and opening the contact assembly in order to electrically disconnect power while the number of first electrical mating members are mechanically coupled to the number of second electrical mating members.

BRIEF DESCRIPTION OF THE DRAWINGS

A full understanding of the disclosed concept can be gained from the following description of the preferred embodiments when read in conjunction with the accompanying drawings in which:

FIG. 18 is a top plan view of the electrical connection element of FIG. 17;

FIG. 19 is a simplified view of the portion of the power connector and electrical connection element therefor of FIG. 17, showing the second mating assembly in a third position;

DESCRIPTION OF THE PREFERRED EMBODIMENTS

Figure 1:
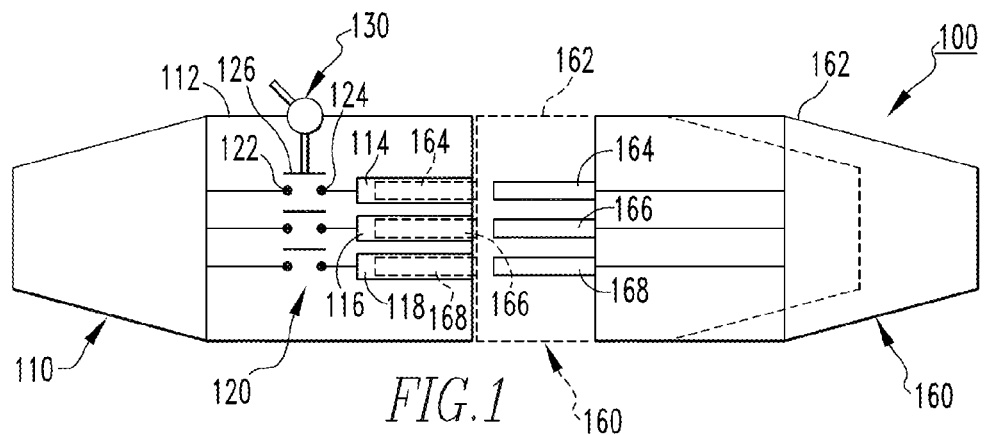
FIG. 1 is a simplified view of a power connector and electrical connection element therefor, in accordance with a non-limiting embodiment of the disclosed concept.

For purposes of the description hereinafter, directional phrases used herein such as, for example, "clockwise," "counterclockwise," "up," "down," and derivatives thereof shall relate to the disclosed concept, as it is oriented in the drawings. It is to be understood that the specific elements illustrated in the drawings and described in the following specification are simply exemplary embodiments of the disclosed concept. Therefore, specific orientations and other physical characteristics related to the embodiments disclosed herein are not to be considered limiting with respect to the scope of the disclosed concept.

As employed herein, the term "number" shall mean one or an integer greater than one (i.e., a plurality).

As employed herein, the singular form of "a," "an," and "the" include plural references unless the context clearly dictates otherwise.

As employed herein, the term "conductor" shall mean a member, such as a copper conductor, an aluminum conductor, a suitable metal conductor, or other suitable material or object that permits an electric current to flow easily.

As employed herein, the statement that two or more parts are "connected" or "coupled" together shall mean that the parts are joined together either directly or joined through one or more intermediate parts. As used herein, "directly coupled" or "directly connected" means that two elements are directly in contact with each other. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof. Further, an object resting on another object held in place only by gravity is not "coupled" to the lower object unless the upper object is otherwise maintained substantially in place. That is, for example, a book on a table is not coupled thereto, but a book glued to a table is coupled thereto.

As used herein, the phrase "removably coupled" means that one component is coupled with another component in an essentially temporary manner. That is, the two components are coupled in such a way that the joining or separation of the components is easy and would not damage the components. For example, two components secured to each other with a limited number of readily accessible fasteners, i.e., fasteners that are not difficult to access, are "removably coupled" whereas two components that are welded together or joined by difficult to access fasteners are not "removably coupled." A "difficult to access fastener" is one that requires the removal of one or more other components prior to accessing the fastener wherein the "other component" is not an access device such as, but not limited to, a door.

As employed herein, the statement that two or more parts or components "engage" one another shall mean that the parts touch and/or exert a force against one another either directly or through one or more intermediate parts or components. Further, as used herein with regard to moving parts, a moving part may "engage" another element during the motion from one position to another and/or may "engage" another element once in the described position. Thus, it is understood that the statements, "when element A moves to element A first position, element A engages element B," and "when element A is in element A first position, element A engages element B" are equivalent statements and mean that element A either engages element B while moving to element A first position and/or element A either engages element B while in element A first position.

As used herein, "operatively engage" means "engage and move." That is, "operatively engage" when used in relation to a first component that is structured to move a movable or rotatable second component means that the first component applies a force sufficient to cause the second component to move. For example, a screwdriver may be placed into contact with a screw. When no force is applied to the screwdriver, the screwdriver is merely "coupled" to the screw. If an axial force is applied to the screwdriver, the screwdriver is pressed against the screw and "engages" the screw. However, when a rotational force is applied to the screwdriver, the screwdriver "operatively engages" the screw and causes the screw to rotate. Further, with electronic components, "operatively engage" means that one component controls another component by a control signal or current.

As used herein, "operatively coupled" means that a number of elements or assemblies, each of which is movable between a first position and a second position, or a first configuration and a second configuration, are coupled so that as the first element moves from one position/configuration to the other, the second element moves between positions/configurations as well. It is noted that a first element may be "operatively coupled" to another without the opposite being true.

As used herein, a "coupling assembly" includes two or more couplings or coupling components. The components of a coupling or coupling assembly are generally not part of the same element or other component. As such, the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are to fit "snugly" together. In that situation, the difference between the size of the components is even smaller whereby the amount of friction increases. If the element defining the opening and/or the component inserted into the opening are made from a deformable or compressible material, the opening may even be slightly smaller than the component being inserted into the opening. Further, as used herein, "loosely correspond" means that a slot or opening is sized to be larger than an element disposed therein. This means that the increased size of the slot or opening is intentional and is more than a manufacturing tolerance. With regard to surfaces, shapes, and lines, two, or more, "corresponding" surfaces, shapes, or lines have generally the same size, shape, and contours.

As used herein, a "path of travel" or "path," when used in association with an element that moves, includes the space an element moves through when in motion. As such, any element that moves inherently has a "path of travel" or "path." When used in association with an electrical current, a "path" includes the elements through which the current travels.

As used herein, "structured to [verb]" means that the identified element or assembly has a structure that is shaped, sized, disposed, coupled and/or configured to perform the identified verb. For example, a member that is "structured to move" is movably coupled to another element and includes elements that cause the member to move or the member is otherwise configured to move in response to other elements or assemblies. As such, as used herein, "structured to [verb]" recites structure and not function. Further, as used herein, "structured to [verb]" means that the identified element or assembly is intended to, and is designed to, perform the identified verb. Thus, an element that is merely capable of performing the identified verb but which is not intended to, and is not designed to, perform the identified verb is not "structured to [verb]."

As used herein, "associated" means that the elements are part of the same assembly and/or operate together, or, act upon/with each other in some manner. For example, an automobile has four tires and four hub caps. While all the elements are coupled as part of the automobile, it is understood that each hubcap is "associated" with a specific tire.

As used herein, in the phrase "[x] moves between its first position and second position," or, "[y] is structured to move [x] between its first position and second position," "[x]" is the name of an element or assembly. Further, when [x] is an element or assembly that moves between a number of positions, the pronoun "its" means "[x]," i.e., the named element or assembly that precedes the pronoun "its."

As used herein, the word "unitary" means a component that is created as a single piece or unit. That is, a component that includes pieces that are created separately and then coupled together as a unit is not a "unitary" component or body.

As used herein, "about" in a phrase such as "disposed about [an element, point or axis]" or "extend about [an element, point or axis]" or "[X] degrees about an [an element, point or axis]," means encircle, extend around, or measured around. When used in reference to a measurement or in a similar manner, "about" means "approximately," i.e., in an approximate range relevant to the measurement as would be understood by one of ordinary skill in the art.

As used herein, "generally" means "in a general manner" relevant to the term being modified as would be understood by one of ordinary skill in the art.

As used herein, "substantially" means for the most part, by a large amount or degree, as would be understood by one of ordinary skill in the art. Thus, for example, a first element "substantially" disposed in a second element is, for the most part, disposed in the second element.

As used herein, a "snap-action" means an action resulting from temporarily stored mechanical energy being released. As a non-limiting example, a compressed spring held by a latch which is then released provides a "snap-action." Similarly, a toggle assembly or elements in a toggle configuration temporarily store mechanical energy as the elements move to the toggle point and that energy is released when the elements pass the toggle point or, if the elements are held at, or just past, the toggle point, the energy is released when the elements reverse direction and move through the toggle point. Thus, as used herein, a "snap-action mechanism" is a mechanism that operates using a "snap-action."

FIG. 1 shows a simplified view of a power connector 100, employing an electrical connection element (e.g., without limitation, line side electrical receptacle 110) and an electrical component (e.g., without limitation, load side electrical receptacle 160) in accordance with one non-limiting example embodiment of the disclosed concept. In the example shown, the line side electrical receptacle 110 includes a housing 112 that has a number of electrical mating members, such as the example female conductors (e.g., without limitation, sleeves 114,116,118). The load side electrical receptacle 160 has a housing 162 that has a number of electrical mating members, such as the example male conductors (e.g., without limitation, pins 164,166,168).

The load side electrical receptacle 160 is also shown in dashed line drawing mechanically coupled to the line side electrical receptacle 110. In operation, and as shown in dashed line drawing, each of the pins 164,166,168 is located within (i.e., as a result of being inserted into) a corresponding one of the sleeves 114,116,118 in order to mechanically couple the load side electrical receptacle 160 to the line side electrical receptacle 110. In known power connectors (not shown), inserting pins (not shown) into corresponding sleeves (not shown) may result in "hot plugging," as discussed above. However, in accordance with the disclosed concept, and as will be discussed in greater detail below, the line side electrical receptacle 110 further includes a contact assembly 120 and an operating mechanism (e.g., without limitation, manual operating lever 130) that advantageously allow the switching energy, which occurs when current first begins to flow freely or first stops flowing freely, to be located in the contact assembly 120, rather than at the connection between the pins 164,166,168 and the sleeves 114,116,118. In this manner, the pins 164,166,168 and the sleeves 114,116,118 are advantageously well-protected against undesirable melting, and/or being welded together, and/or damage to the respective surfaces, and/or an arc flash.

The contact assembly 120 is enclosed by the housing 112 and is electrically connected to the sleeves 114,116,118. In the non-limiting example shown, the manual operating lever 130 is coupled to the housing 112 and the contact assembly 120. Furthermore, the manual operating lever 130 opens and closes the contact assembly 120. The contact assembly 120 is structured to electrically connect and disconnect power when the pins 164,166,168 remain mechanically coupled to (i.e., are inserted within) the sleeves 114,116,118. That is, the pins 164,166,168 and the sleeves 114,116,118 engage before the contact assembly 120 is closed, and disengage after the contact assembly 120 is opened. As a result, current is prevented from switching directly from (i.e., "jumping from," "arcing from") the sleeves 114,116,118 to the pins 164,166,168. Rather, because the pins 164,166,168 and the sleeves 114,116,118 are already engaged, current advantageously experiences relatively little electrical resistance when flowing from the sleeves 114,116,118 to the pins 164,166,168, distinct from known power connectors (not shown) in which initial alignment and engagement of pins (not shown) with electrically hot (e.g., electrically live) sleeves (not shown) results in undesirably large electrical arc energy.

A method of operating the power connector 100 includes the steps of mechanically coupling the pins 164,166,168 to the sleeves 114,116,118 (i.e., inserting the pins 164,166,168 into the sleeves 114,116,118); closing the contact assembly 120 in order to electrically connect power after the pins 164,166,168 are mechanically coupled to the sleeves 114,116,118; and opening the contact assembly 120 in order to electrically disconnect power while the pins 164,166,168 are mechanically coupled to (i.e., remain inserted within) the sleeves 114,116,118. In this manner, the relatively high switching energy associated with electrically connecting power are advantageously not located at the connection between the pins 164,166,168 and the sleeves 114,116,118.

Figure 2:
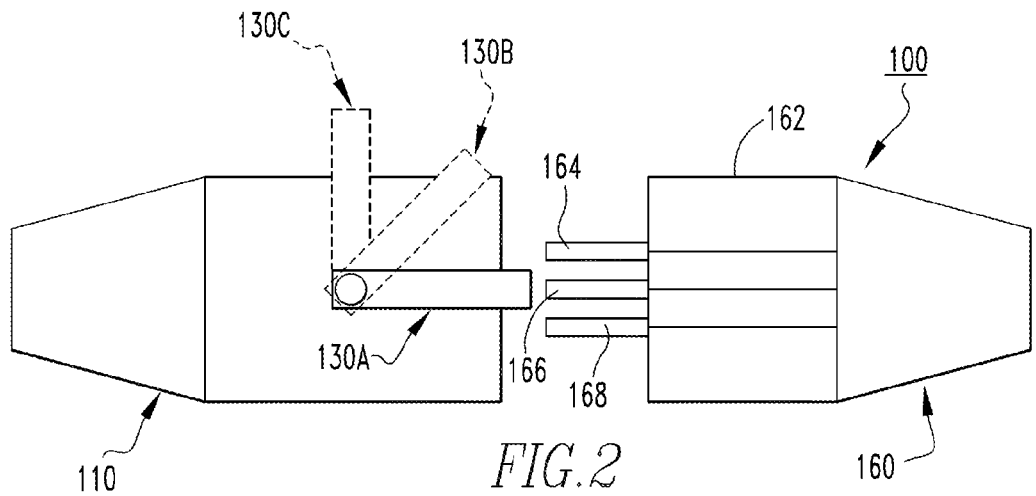
FIG. 2 is another simplified view of the power connector and electrical connection element therefor of FIG. 1, showing the operating lever in various positions in dashed line drawing.

FIG. 2 shows the power connector 100 in an alternative simplified view for ease of illustration. Specifically, FIG. 2 shows the manual operating lever 130 in a first position 130A (i.e., an ON position), a second position 130B (i.e., an OFF position) (shown in dashed line drawing), and a third position 130C (i.e., an EJECT position) (shown in dashed line drawing). When the pins 164,166,168 are mechanically coupled to the sleeves 114,116,118 (FIG. 1), and the manual operating lever 130 moves from the ON position 130A toward the OFF position 130B, the manual operating lever 130 opens the contact assembly 120 (FIG. 1) in order to disconnect power. When the manual operating lever 130 moves from the OFF position 130B toward the EJECT position 130C, the manual operating lever 130 may assist disengagement of the pins 164,166,168 and the sleeves 114,116,118 (FIG. 1). Similarly, when the manual operating lever 130 moves from the EJECT position 130C toward the OFF position 130B (i.e., when the contact assembly 120 is open and the pins 164,166,168 are not completely coupled to the sleeves 114,116,118), the manual operating lever 130 may assist engagement of the pins 164,166,168 and the sleeves 114,116,118. Finally, when the manual operating lever 130 moves from the OFF position 130B toward the ON position 130A (i.e., when the pins 164,166,168 are fully coupled to the sleeves 114,116,118), the manual operating lever 130 closes the contact assembly 120 (FIG. 1) in order to connect power.

Moreover, the operating mechanism of the line side electrical receptacle 110 provides an interlock that prevents engagement and disengagement of the pins 164,166,168 and the sleeves 114,116,118 when the manual operating lever 130 is in the ON position 130A. That is, when the contact assembly 120 is closed, the interlock of the manual operating lever 130 either ensures that the pins 164,166,168 and the sleeves 114,116,118 do not become disengaged (i.e., assuming the pins 164,166,168 and the sleeves 114,116,118 were engaged to begin with), or ensures that the pins 164,166,168 and the sleeves 114,116,118 do not become engaged (i.e., assuming the pins 164,166,168 and the sleeves 114,116,118 were disengaged to begin with). In one non-limiting embodiment, the interlock includes a pin or rim (not shown) with an expanded end. In this embodiment, the manual operating lever 130 includes a link member (not shown) that blocks the path for the respective pins 164,166, 168 or rim (not shown) to prevent engagement when the manual operating lever 130 in the ON position 130A.

Furthermore, in this embodiment the operating mechanism latches onto the expanded end and pulls the pins 164,166,168 and the sleeves 114,116,118 together to assist engagement when moving from the EJECT position 130C to the OFF position 130B. Additionally, the operating mechanism is maintained on the expanded end to prevent disengagement when the manual operating lever 130 is in the ON position 130A and pushes against the expanded end to assist disengagement when moving from the OFF position 130B to the EJECT position 130C.

Furthermore, the manual operating lever 130 advantageously opens and closes the contact assembly 120 by a snap-action mechanism. More specifically, in one non-limiting embodiment, the line side electrical receptacle 110 further includes a number of biasing elements (not shown) that cooperate with the manual operating lever 130 and the contact assembly 120 by releasing stored energy in order to allow the manual operating lever 130 to rapidly open and close the contact assembly 120.

Figure 3:
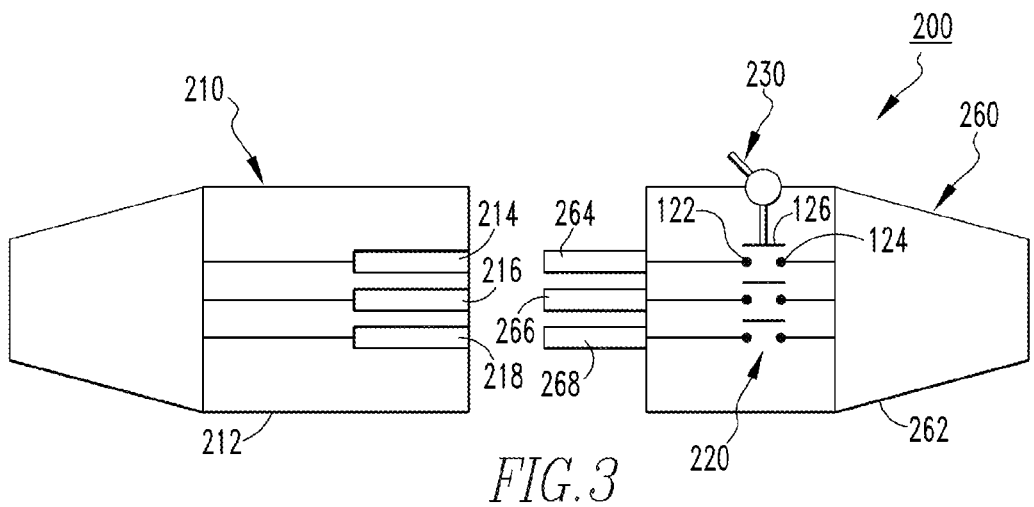
FIG. 3 is a simplified view of a power connector and electrical connection element therefor, in accordance with another non-limiting embodiment of the disclosed concept.

As seen in the non-limiting example of FIG. 3, the alternative power connector 200 includes many of the same components as the power connector 100 (FIGS. 1 and 2), and like components are labeled with like reference numerals. However, different from the power connector 100 (FIGS. 1 and 2), the load side electrical receptacle 260 includes the contact assembly 220 and the manual operating lever 230 for opening and closing the contact assembly 220. The contact assembly 220 is electrically connected to the pins 264,266,268 and has the same function as the contact assembly 120. Specifically, when the pins 264,266,268 are mechanically coupled to the sleeves 214,216,218, the contact assembly 220 is structured to electrically connect and disconnect power, advantageously allowing the location of the switching energy in the power connector 200 to be at the contact assembly 220, rather than at the connection between the pins 264,266,268 and the sleeves 214,216,218. It can thus be appreciated that advantages associated with employing the contact assembly 120 and the manual operating lever 130 in the line side electrical receptacle 110 for the power connector 100 likewise apply to employing the contact assembly 220 and the manual operating lever 230 in the load side receptacle 260 for the power connector 200.

Figure 4:
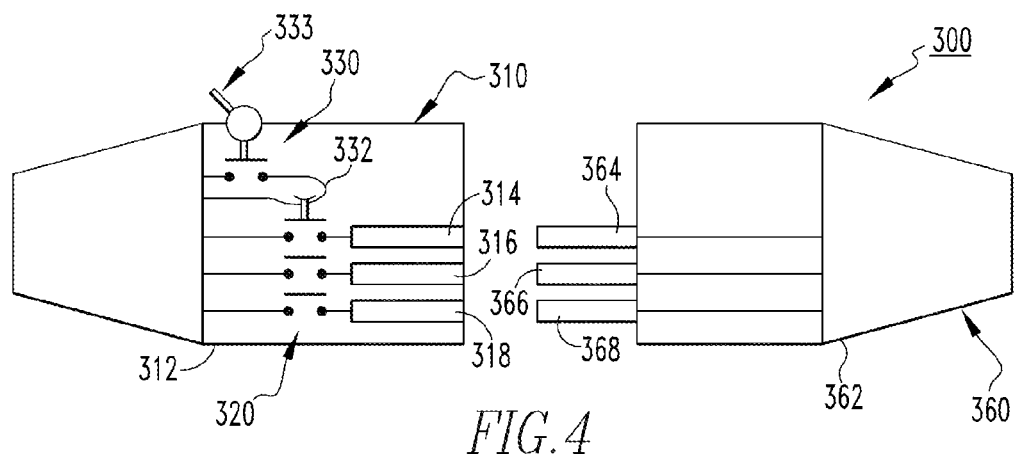
FIG. 4 is a simplified view of a power connector and electrical connection element therefor, in accordance with another non-limiting embodiment of the disclosed concept.

As seen in the non-limiting example of FIG. 4, the alternative power connector 300 includes many of the same components as the power connector 100 (FIGS. 1 and 2), and like components are labeled with like reference numerals. However, the line side electrical receptacle 310 includes an electromagnetic apparatus 330 as the operating mechanism for opening and closing the contact assembly 320 instead of the manual operating lever 130 (FIGS. 1 and 2). The electromagnetic apparatus 330 is coupled to the housing 312, and includes an electromagnet coil 332 and a manual coil power control switch 333. In operation, while the pins 364,366,368 are mechanically coupled to the sleeves 314, 316,318, the manual coil power control switch 333 is structured to move between an ON position and an OFF position in order to connect power and disconnect power, respectively. When the manual coil power control switch 333 moves to the ON position, power from the line side electrical receptacle 310 is provided to the electromagnet coil 332, which advantageously allows the contact assembly 320 to rapidly close by a snap-action mechanism and thereby connect power. Similarly, when the manual coil power control switch 333 moves to the OFF position, power to the electromagnet coil 332 is turned off, thereby rapidly opening the contact assembly 320 by a snap-action mechanism and disconnecting power. It can thus be appreciated that advantages associated with employing the contact assemblies 120,220 and the manual operating levers 130,230 in the power connectors 100,200 likewise apply to employing the contact assembly 320 and the electromagnetic apparatus 330 in the power connector 300.

Figure 5:
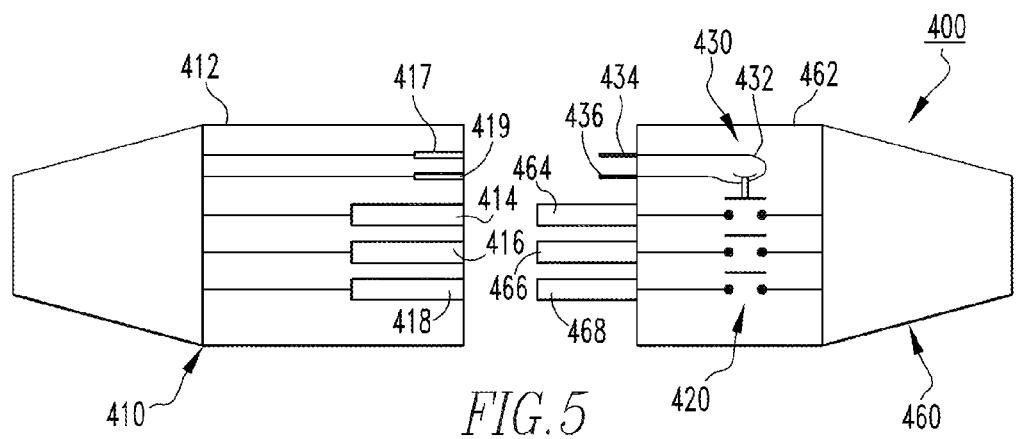
FIG. 5 is a simplified view of a power connector and electrical connection element therefor, in accordance with another non-limiting embodiment of the disclosed concept.

As seen in the non-limiting example of FIG. 5, the alternative power connector 400 includes many of the same components as the power connector 300 (FIG. 4), and like components are labeled with like reference numerals. However, the contact assembly 420 and an operating mechanism (e.g., without limitation, electromagnetic apparatus 430) for opening and closing the contact assembly 420 are located in the load side electrical receptacle 460. The electromagnetic apparatus 430 is coupled to the housing 462, and includes an electromagnetic coil 432 and a number of conductors (see, for example, two coil power pins 434,436) electrically connected to the electromagnetic coil 432. Furthermore, the housing 412 of the line side electrical receptacle 410 includes another number of conductors (see, for example two coil power sleeves 417,419). In operation, the pins 464,466,468 are first mechanically coupled to the sleeves 414,416,418. Next, the coil power pins 434,436 are engaged with (i.e., inserted into) the coil power sleeves 417,419 in order to provide power to the electromagnetic coil 432 to rapidly close the contact assembly 420 by a snap-action mechanism and thereby connect power. During disengagement, the coil power pins 434,436 are disengaged first from the coil power sleeves 417,419, thereby removing power from the electromagnetic coil 432 and rapidly opening the contact assembly 420 by a snap-action mechanism, while the pins 464,466,468 remain mechanically coupled to the sleeves 414,416,418.

It will be appreciated with reference to FIG. 5 that the pins 464,466,468 are structured to extend a greater distance into the housing 412 of the line side electrical receptacle 410 than the coil power pins 434,436, thereby allowing the pins 464,466,468 and the sleeves 414,416,418 to engage before the contact assembly 420 is closed, and disengage after the contact assembly 420 is opened. As a result, any electrical switching within the power connector 400 (i.e., when power is connected and when power is disconnected) occurs while the pins 464,466,468 and the sleeves 414,416,418 are mechanically coupled. Thus, advantages with respect to minimizing "hot plugging" likewise apply to the power connector 400.

Figure 6:
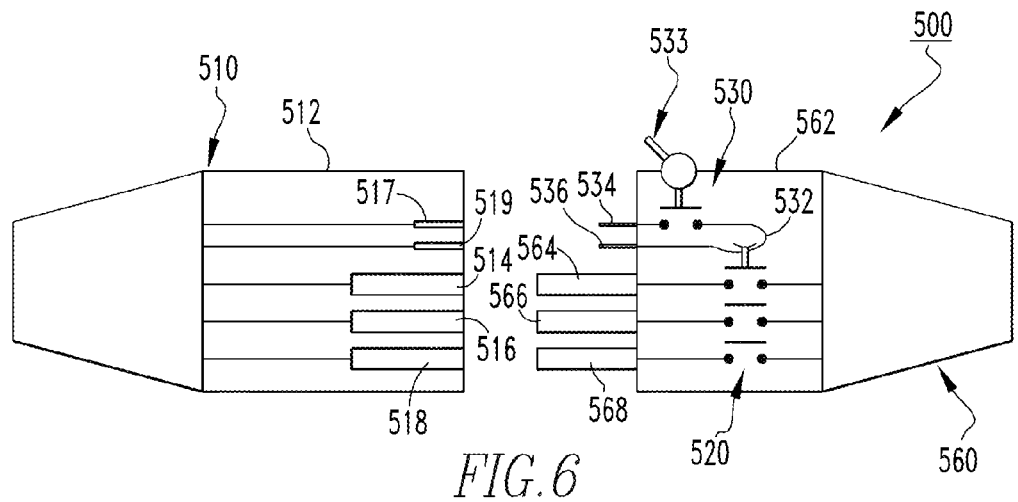
FIG. 6 is a simplified view of a power connector and electrical connection element therefor, in accordance with another non-limiting embodiment of the disclosed concept.

As seen in the non-limiting example of FIG. 6, the alternative power connector 500 includes many of the same components as the power connector 400 (FIG. 5), and like components are labeled with like reference numerals. However, the electromagnetic apparatus 530, which is coupled to the housing 562, includes a manual coil power control switch 533 that turns power to the electromagnetic coil 532 on and off. Specifically, when the pins 564,566,568 are mechanically coupled to the sleeves 514,516,518, and the coil power pins 534,536 are mechanically connected to (i.e., inserted into) the coil power sleeves 517,519, the manual coil power control switch 533 can either connect power by rapidly closing the contact assembly 520 by a snap-action mechanism, or disconnect power by rapidly opening the contact assembly 520 by a snap-action mechanism. Similar to the power connector 400, the pins 564,566,568 are structured to extend a greater distance into the line side electrical receptacle 510 than the coil power pins 534,536, thereby allowing the pins 564,566,568 and the sleeves 514,516,518 to engage before the contact assembly 520 is closed, and disengage after the contact assembly 520 is opened.

Figure 7:
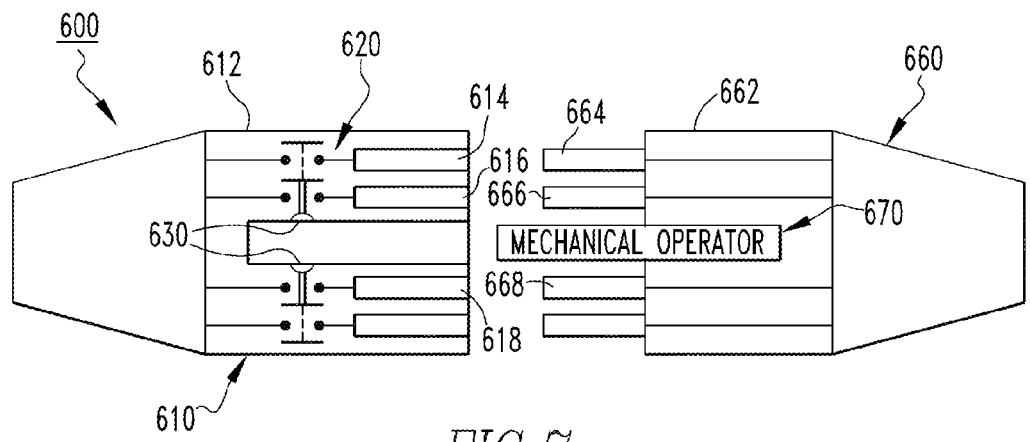
FIG. 7 is a simplified view of a power connector and electrical connection element therefor, in accordance with another non-limiting embodiment of the disclosed concept.

As seen in the non-limiting example of FIG. 7, the alternative power connector 600 includes many of the same components as the power connector 100 (FIGS. 1 and 2), and like components are labeled with like reference numerals. However, the operating mechanism 630 for opening and closing the contact assembly 620 is different. Additionally, the housing 662 further includes a driving member (e.g., without limitation, mechanical operator 670) that cooperates with the operating mechanism 630 to open and close the contact assembly 620.

Figure 8A:
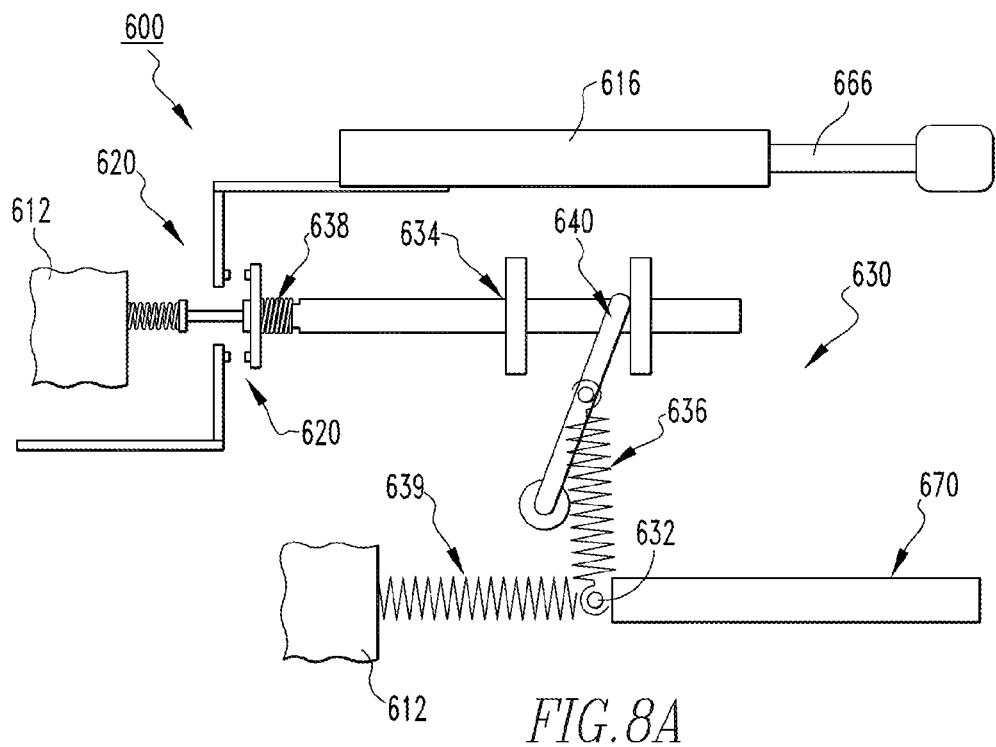
FIG. 8A is a simplified view of a portion of the power connector and electrical connection element therefor of FIG. 7, showing the operating mechanism in a position corresponding to the contact assembly being open.
Figure 8B:
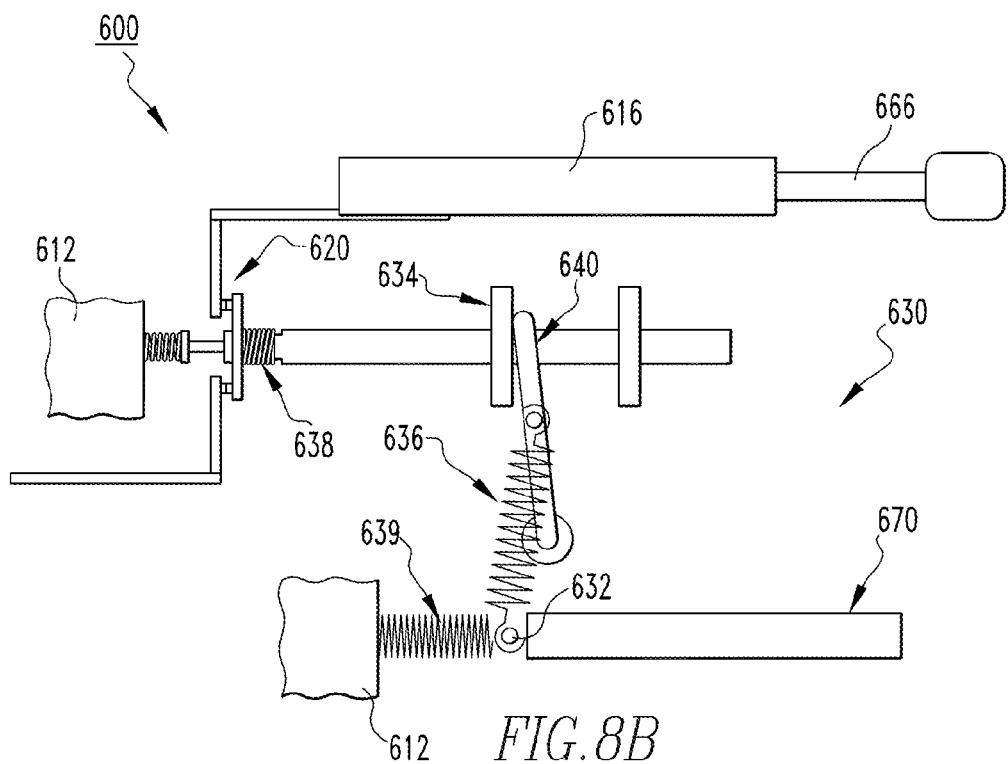
FIG. 8B is another simplified view of the portion of the power connector and electrical connection element therefor of FIG. 8A, showing the operating mechanism in a position corresponding to the contact assembly being closed.

Referring to the non-limiting example of FIGS. 8A and 8B, a portion of the power connector 600 is shown in an alternative simplified view for ease of illustration. As shown, the operating mechanism 630 includes a first sliding member 632, a second sliding member 634, a first biasing element (e.g., without limitation, spring 636), a second biasing element (e.g., without limitation, spring 638), a third biasing element (e.g., without limitation, spring 639), and a linking member 640 each coupled to the housing 612. As shown, the spring 636 couples the first sliding member 632 to the linking member 640. The spring 638 couples the second sliding member 634 to the contact assembly 620. FIG. 8A shows the operating mechanism 630 in a first position corresponding to the contact assembly 620 being open. FIG. 8B shows the operating mechanism 630 in a second position corresponding to the contact assembly 620 being closed.

The operating mechanism 630 moves from the first position (FIG. 8A) to the second position (FIG. 8B) as a result of the mechanical operator 670. More specifically, when the pins 664,666,668 are mechanically coupled to (i.e., inserted into) the sleeves 614,616,618 (see, for example, the pin 666 inserted into the sleeve 616 in FIGS. 8A and 8B), and the line side electrical receptacle 610 and the load side electrical receptacle 660 are pushed closer together, the mechanical operator 670 pushes the first sliding member 632 from the first position (FIG. 8A) toward the second position (FIG. 8B). Similarly, responsive to the first sliding member 632 moving from the first position (FIG. 8A) toward the second position (FIG. 8B), the spring 636 pulls the linking member 640 from the first position (FIG. 8A) toward the second position (FIG. 8B). When the linking member 640 moves from the first position (FIG. 8A) toward the second position (FIG. 8B), the linking member 640 drives the second sliding member 634, thereby causing the spring 638 to close the contact assembly 620.

When the mechanical operator 670 moves from the second position (FIG. 8B) toward the first position (i.e., when the line side electrical receptacle 610 and the load side electrical receptacle 660 begin to move away from each other, but the pins 664,666,668 remain mechanically coupled to (i.e., inserted into) the sleeves 614,616,618), the spring 639 pushes the first sliding member 632 toward the first position (FIG. 8A), and the spring 636 pulls the linking member 640 away from the contact assembly 620 in order to drive the second sliding member 634 toward the first position (FIG. 8A). When the second sliding member 634 moves from the second position (FIG. 8B) toward the first position (FIG. 8A), the spring 638 opens the contact assembly 620. Thus, because the pins 664,666,668 remain mechanically coupled to (i.e., inserted into) the sleeves 614,616,618 when the contact assembly 620 opens and closes, switching energies are advantageously focused on the contact assembly 620, resulting in the improvements with respect to "hot plugging," described hereinabove.

Figure 9:
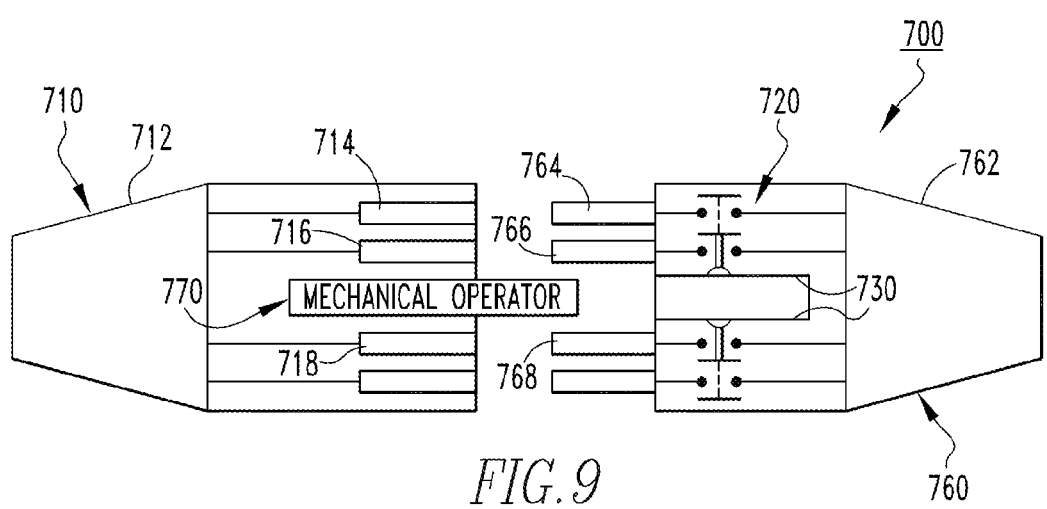
FIG. 9 is a simplified view of a power connector and electrical connection element therefor, in accordance with another non-limiting embodiment of the disclosed concept.

As seen in the non-limiting example of FIG. 9, the alternative power connector 700 includes many of the same components as the power connector 600 (FIGS. 7, 8A, and 8B), and like components are labeled with like reference numerals. However, different from the power connector 600 (FIGS. 7, 8A, and 8B), the housing 712 of the line side electrical receptacle 710 includes the mechanical operator 770, and the load side electrical receptacle 760 includes the contact assembly 720 and the operating mechanism 730. It will be appreciated that the mechanical operator 770 cooperates with the operating mechanism 730 to open and close the contact assembly 720 in substantially the same manner in which the mechanical operator 670 (FIGS. 7, 8A, and 8B) cooperates with the operating mechanism 630 (FIGS. 7, 8A, and 8B) to open and close the contact assembly 620. Thus, advantages of the power connector 600 (FIGS. 7, 8A, and 8B) associated with improvements in terms of "hot plugging" likewise apply to the power connector 700.

Figure 10:
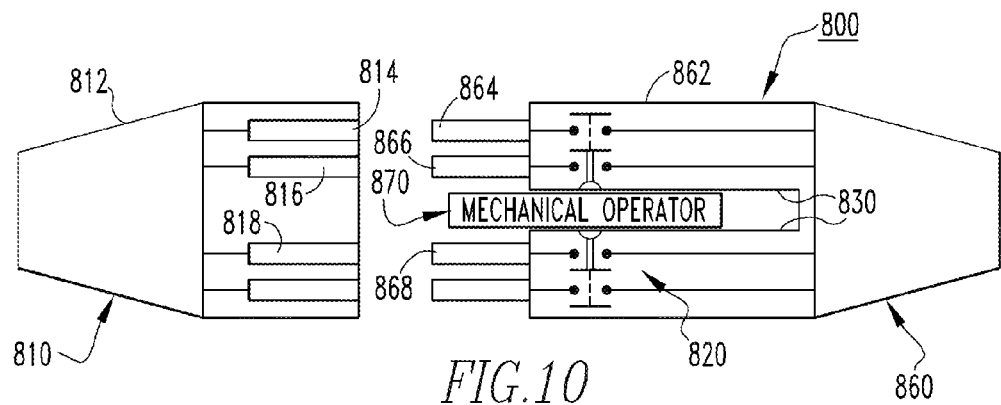
FIG. 10 is a simplified view of a power connector and electrical connection element therefor, in accordance with another non-limiting embodiment of the disclosed concept.

As seen in the non-limiting example of FIG. 10, the alternative power connector 800 includes many of the same components as the power connectors 600,700 (FIGS. 7-9), and like components are labeled with like reference numerals. However, different from the power connectors 600,700 (FIGS. 7-9), the mechanical operator 870 of the power connector 800 is movably coupled to the operating mechanism 830 of the load side electrical receptacle 860. That is, the mechanical operator 870 and the operating mechanism 830 are each components of the same receptacle (i.e., the load side electrical receptacle 860). It will be appreciated that the mechanical operator 870 cooperates with the operating mechanism 830 in substantially the same manner as the mechanical operators 670,770 and the operating mechanisms 630,730, described hereinabove. However, unlike the power connectors 600,700, the mechanical operator 870 is driven into the operating mechanism 830 by the housing 812 of the opposing receptacle (i.e., the line side electrical receptacle 810).

Furthermore, it will be appreciated that the pins 864,866,868 extend a greater distance away from the contact assembly 820 than the mechanical operator 870. Thus, as the line side electrical receptacle 810 is mechanically coupled to the load side electrical receptacle 860, the pins 864,866,868 will extend into and remain mechanically coupled to the respective sleeves 814,816,818 before the mechanical operator 870 engages the housing 812 of the line side electrical receptacle 810 (i.e., in order to connect power). Similarly, when the line side electrical receptacle 810 is disconnected from the load side electrical receptacle 860, the pins 864,866,868 will remain mechanically coupled to the respective sleeves 814,816,818 when the mechanical operator 870 disengages the housing 812 of the line side electrical receptacle 810 (i.e., and thus disconnects power).

Furthermore, it will be appreciated that the power connector 800 advantageously employs a known receptacle (i.e., the line side electrical receptacle 810) that requires no modification. Thus, manufacturing of the power connector 800 is simplified as a known line side electrical receptacle 810 is able to be employed.

Figure 11A:
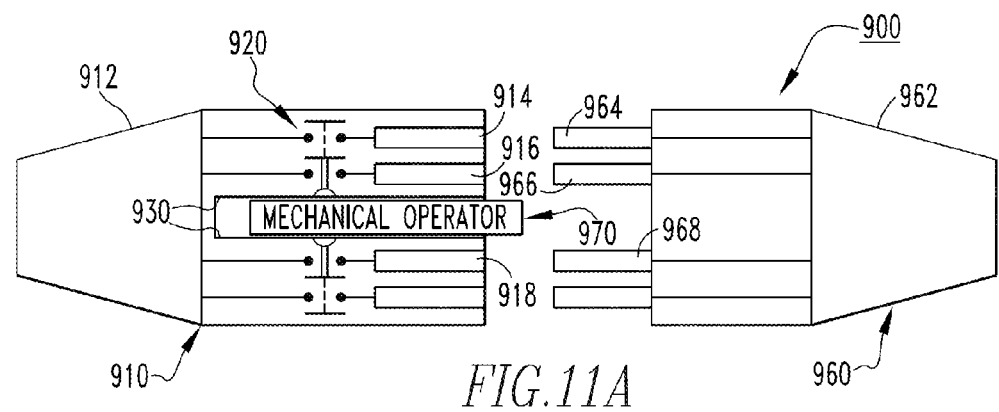
FIG. 11A is a simplified view of a power connector and electrical connection element therefor, in accordance with another non-limiting embodiment of the disclosed concept.
Figure 11B:
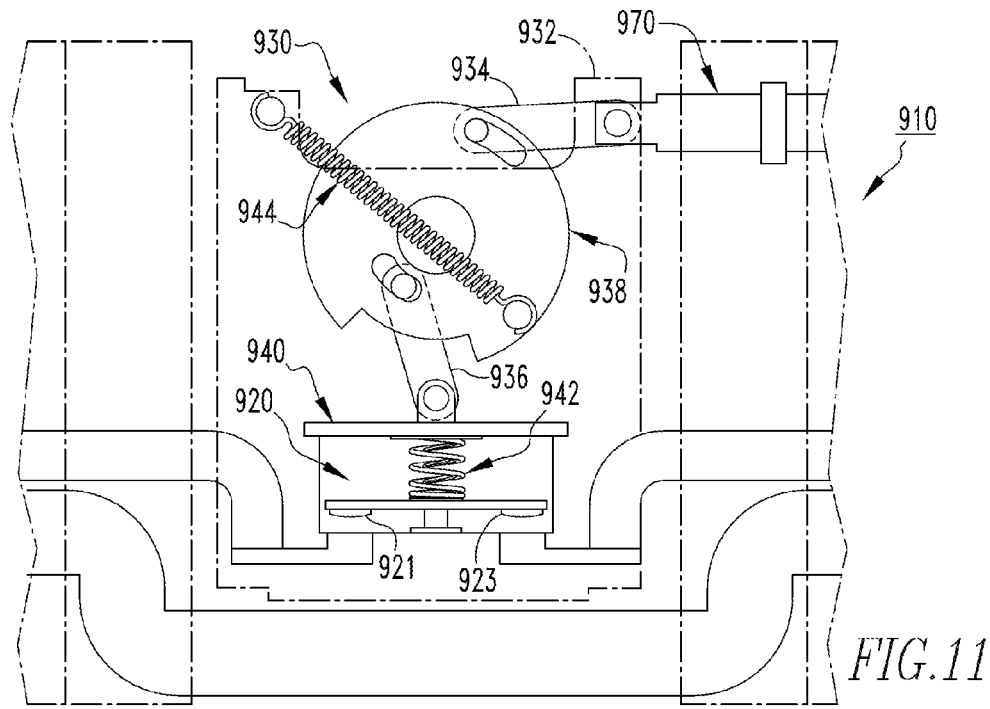
FIG. 11B is a schematic view of a portion of the electrical connection element of FIG. 11A, shown with portions removed in order to see hidden structures.

As seen in the non-limiting example of FIG. 11A, the alternative power connector 900 includes many of the same components as the power connector 800 (FIG. 10), and like components are labeled with like reference numerals. However, different from the power connector 800 (FIG. 10), the line side electrical receptacle 910 of the power connector 900 includes the operating mechanism 930 and the mechanical operator 970. The mechanical operator 970 is caused to cooperate with the operating mechanism 930 by the housing 962 of the load side electrical receptacle 960 (i.e., is driven inwardly with respect to the housing 912 by the housing 962). FIG. 11B shows one non-limiting example embodiment, shown schematically, of the mechanical operator 970 and the operating mechanism 930 of FIG. 11A. The operating mechanism 930 includes a housing 932 (shown in simplified form in phantom line drawing), a first link member 934, a second link member 936, a cam 938, a contact carrier 940, a first biasing element (e.g., contact spring 942), and a second biasing element (e.g., cam spring 944). The housing 932 is coupled to the housing 912 by any suitable mechanism. The first link member 934 couples the mechanical operator 970 to the cam 938. The second link member 936 couples the cam 938 to the contact carrier 940. The contact spring 942 is coupled to the contact carrier 940 and a pair of electrical contacts 921,923 of the contact assembly 920. The cam spring 944 is coupled to the housing 932 and the cam 938. The link members 934,936, the cam 938, the contact carrier 940, and the springs 942,944 cooperate with one another and with the mechanical operator 970 in order to open and close the contact assembly 920.

That is, the first link member 934, the second link member 936, the cam 938, the contact spring 942, the cam spring 944, and the contact carrier 940 are structured to move between a first position (shown in FIG. 11B) corresponding to the contact assembly 920 being open and a second position (not shown) corresponding to the contact assembly being closed. The mechanical operator 970 is structured to drive the first link member 934 from the first position to the second position. The first link member 934 and the cam spring 944 are structured to drive the cam 938 from the first position to the second position. Responsive to the cam 938 moving from the first position to the second position, the second link member 936 drives the contact carrier 940, thereby causing the contact spring 942 to close the contact assembly 920 by a mechanism with a snap-action motion.

Stated differently, responsive to movement of the mechanical operator 970 (i.e., in the depicted orientation the movement is to the left and is caused by the housing 962), the first link member 934 drives the cam 938, causing the cam 938 to rotate. After the cam 938 rotates a predetermined distance (i.e., the rotational distance which places the cam spring 944 in maximum tension), the cam spring 944 rapidly releases energy and continues to rotate the cam 938 in the same direction of rotation. When the cam spring 944 begins to release energy to drive the cam 938, the second link member 936 rapidly drives the contact carrier 940 (i.e., in the depicted orientation this is in the downward direction) in order to close the contact assembly 920. It will, however, be appreciated that the operating mechanism 930 may be replaced with a suitable alternative operating mechanism, such as the operating mechanism 630, discussed hereinabove. It will also be appreciated that the power connector 900 operates in a similar manner (i.e., pins 964,966,968 remaining mechanically coupled to sleeves 914,916,918 while mechanical operator 970 and housing 962 cause power to connect and disconnect) as the power connector 800 (FIG. 10). Furthermore, the power connector 900 advantageously employs a known receptacle (i.e., load side electrical receptacle 960) which requires no modification, thereby simplifying manufacturing. Additionally, the operating mechanism 830 (FIG. 10) of the power connector 800 (FIG. 10) may be replaced with the operating mechanism 930 and cooperate with the mechanical operator 870 in substantially the same manner as the operating mechanism 930 and the mechanical operator 970 cooperate with one another.

Figure 12:
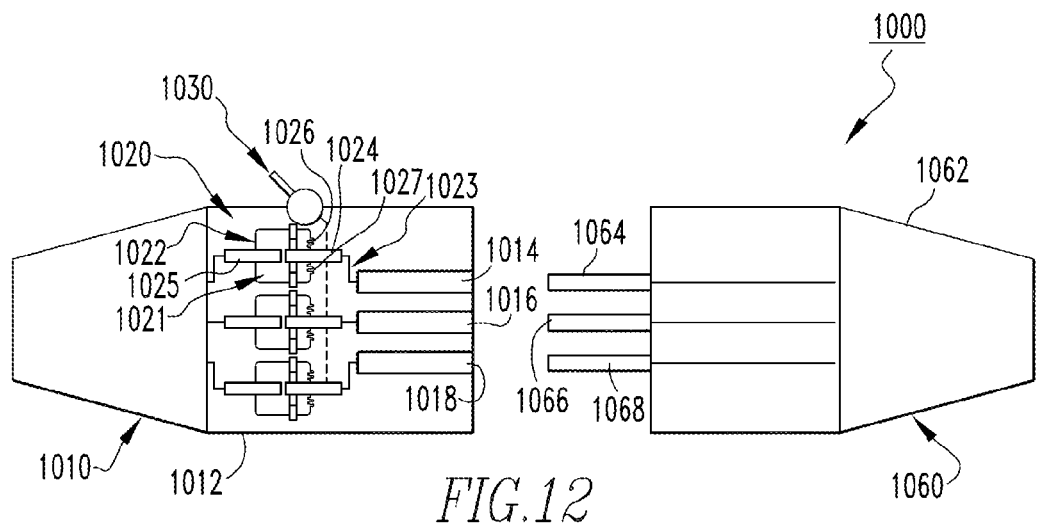
FIG. 12 is a simplified view of a power connector and electrical connection element therefor, in accordance with another non-limiting embodiment of the disclosed concept.

As seen in the non-limiting example of FIG. 12, the alternative power connector 1000 includes many of the same components as the power connector 100 (FIGS. 1 and 2), and like components are labeled with like reference numerals. However, the contact assembly 1020 of the line side electrical receptacle 1010 includes a number of sets of separable contacts 1021, a corresponding number of vacuum bottles 1022, and a corresponding number of flexible conductors 1023. For ease of illustration and economy of disclosure only the set of separable contacts 1021, the vacuum bottle 1022, and the flexible conductor 1023 will be described in detail, although it will be appreciated that the other sets of separable contacts, vacuum bottles, and flexible conductors shown are configured in substantially the same manner. The set of separable contacts 1021 includes a first contact 1024 and a second contact 1025. In operation, when the first contact 1024 engages the second contact 1025, an electrical pathway is created therebetween. However, the first contact 1024 is structured to move into and out of engagement with the second contact 1025 in order to open and close the contact assembly 1020.

More specifically, the operating mechanism is an operating lever 1030 that is coupled to each respective first contact 1024 and causes the respective first contacts 1024 to move into and out of engagement with the respective second contacts 1025. Additionally, the vacuum bottle 1022 and the flexible conductor 1023 advantageously allow the first contact 1024 to move into and out of engagement with the second contact 1025. The vacuum bottle 1022 includes a number of convolutions 1026, 1027 that are coupled to the first contact 1024. The convolutions 1026, 1027 allow the vacuum bottle 1022 to flex and move with the first contact 1024 in response to movement of the operating lever 1030, thus allowing the first contact 1024 and the second contact 1025 to open and close within the vacuum bottle 1022. Furthermore, the flexible conductor 1023 is mechanically coupled to and electrically connected in series in between the first contact 1024 and the sleeve 1014 in order to allow movement of the first contact 1024. As such, when the first contact 1024 moves, a mechanical and electrical connection is advantageously maintained between the first contact 1024 and the sleeve 1014. Thus, it will be appreciated that in addition to advantages associated with minimizing "hot plugging" in the power connector 1000 by employing the contact assembly 1020 and the operating lever 1030, the power connector 1000 has the significant additional advantage of achieving arc free operation by containing any electrical arcing within the vacuum bottles 1022. As a result, oil, gas, and mining industries that employ the power connector 1000 are significantly safer, as interaction with a potential arc and explosive materials is significantly minimized.

Figure 13:
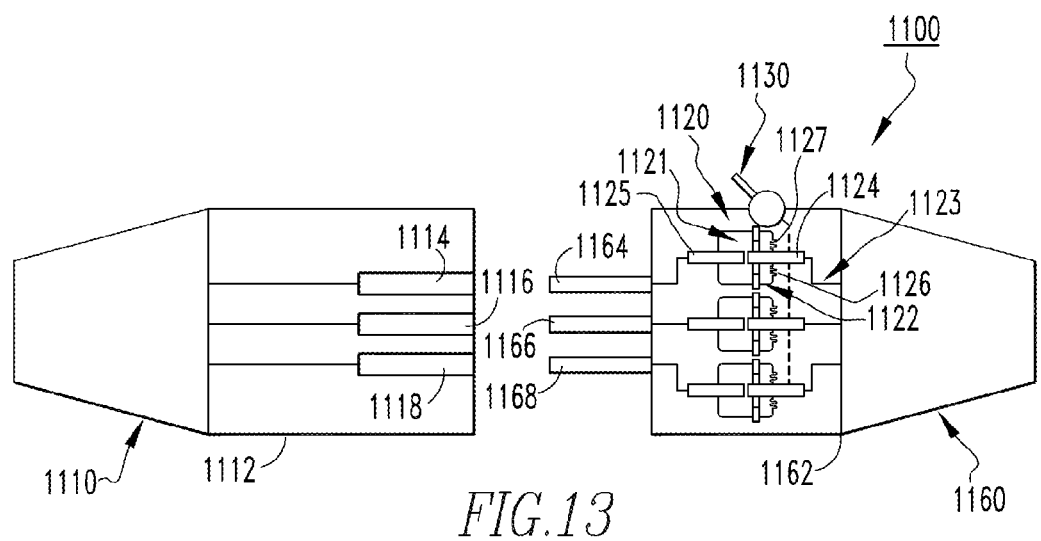
FIG. 13 is a simplified view of a power connector and electrical connection element therefor, in accordance with another non-limiting embodiment of the disclosed concept.

As seen in the non-limiting example of FIG. 13, the alternative power connector 1100 includes many of the same components as the power connector 1000 (FIG. 12), and like components are labeled with like reference numerals. However, the contact assembly 1120 and the operating lever 1130 are components of the load side electrical receptacle 1160 and not the line side electrical receptacle 1110. The operating lever 1130 moves the first contact 1124 into and out of engagement with the second contact 1125 within the vacuum bottle 1122 in substantially the same manner as the operating lever 1030 (FIG. 12). Thus, it will be appreciated that advantages associated with minimizing "hot plugging" and achieving arc free operation because of the vacuum bottles likewise applies to the power connector 1100.

Figure 14:
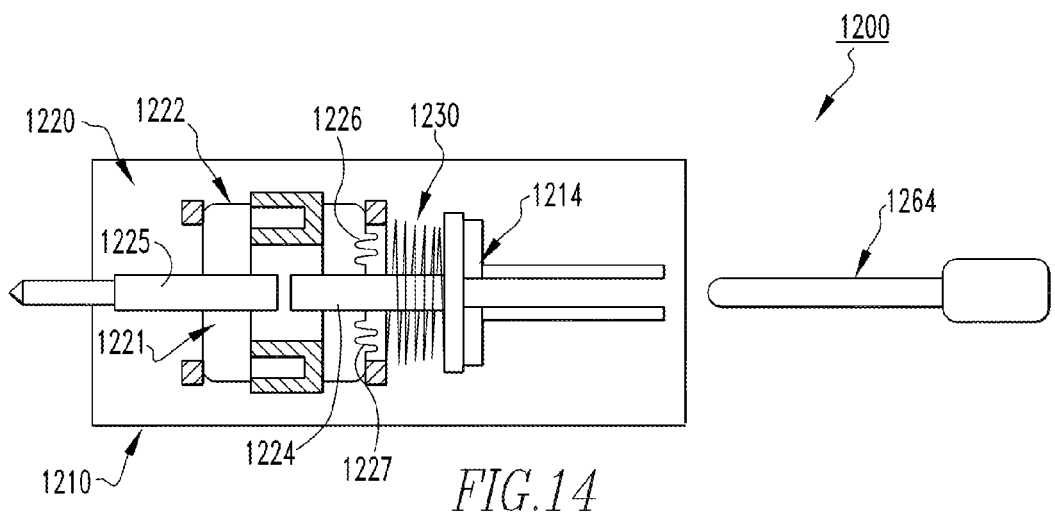
FIG. 14 is a simplified view of a portion of a power connector and electrical connection element therefor, in accordance with another non-limiting embodiment of the disclosed concept.

As seen in the non-limiting example of FIG. 14, the alternative portion of the power connector 1200 includes many of the same components as the power connectors 1000, 1100 (FIGS. 12 and 13), and like components are labeled with like reference numerals. However, the operating mechanism of the power connector 1200 includes a biasing element (e.g., spring 1230) that is coupled to the first contact 1224 and the sleeve 1214. In operation, when the pin 1264 is inserted into the sleeve 1214 and is fully engaged (i.e., is entirely inserted into and/or cannot be pushed into the sleeve 1214 anymore), the sleeve 1214 is structured to slide within the line side electrical receptacle 1210 (partially shown) and cause the spring 1230 to move the first contact 1224 into engagement with the second contact 1225. That is, the sleeve 1214 moves independently with respect to the second contact 1225 in order to allow the spring 1230 to close the contacts 1224, 1225. Similarly, when the pin 1264 is pulled away from the sleeve 1214, the spring 1230 pulls the first contact 1224 out of engagement with the second contact 1225, thereby disconnecting power. Because the pin 1264 and the sleeve 1214 remain mechanically coupled when the contact assembly 1220 is opened (and also remain coupled when the contact assembly 1220 is closed), advantages associated with minimizing "hot plugging" likewise apply to the power connector 1200. Similarly, because the first contact 1224 and the second contact 1225 open and close within the vacuum bottle 1222, beneficial arc free operation is likewise achieved in the power connector 1200.

Figure 15:
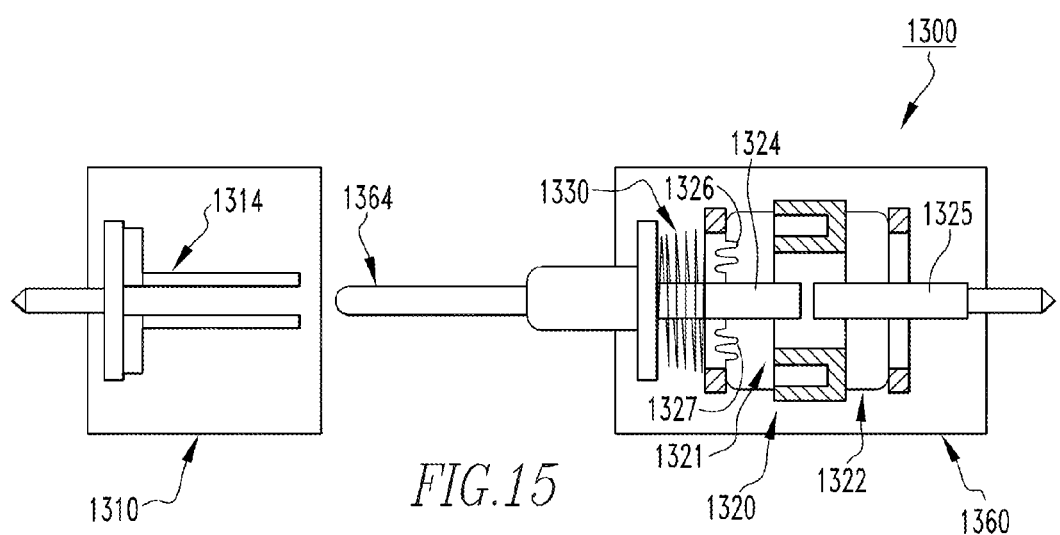
FIG. 15 is a simplified view of a portion of a power connector and electrical connection element therefor, in accordance with another non-limiting embodiment of the disclosed concept.

As seen in the non-limiting example of FIG. 15, the alternative power connector 1300 includes many of the same components as the power connector 1200 (FIG. 14), and like components are labeled with like reference numerals. However, the load side electrical receptacle 1360 includes the contact assembly 1320 and the spring 1330. Thus, it will be appreciated that the pin 1364 is structured to slide within the load side electrical receptacle 1360 and move independently with respect to the second contact 1325. That is, when the pin 1364 is fully engaged (i.e., cannot be inserted further into) with the sleeve 1314, the sleeve 1314 pushes the pin 1364, and thus the spring 1330 is able to move the first contact 1324 into engagement with the second contact 1325 to connect power. Accordingly, advantages associated with "hot plugging" and achieving arc free operation likewise apply to the power connector 1300.

Figure 16:
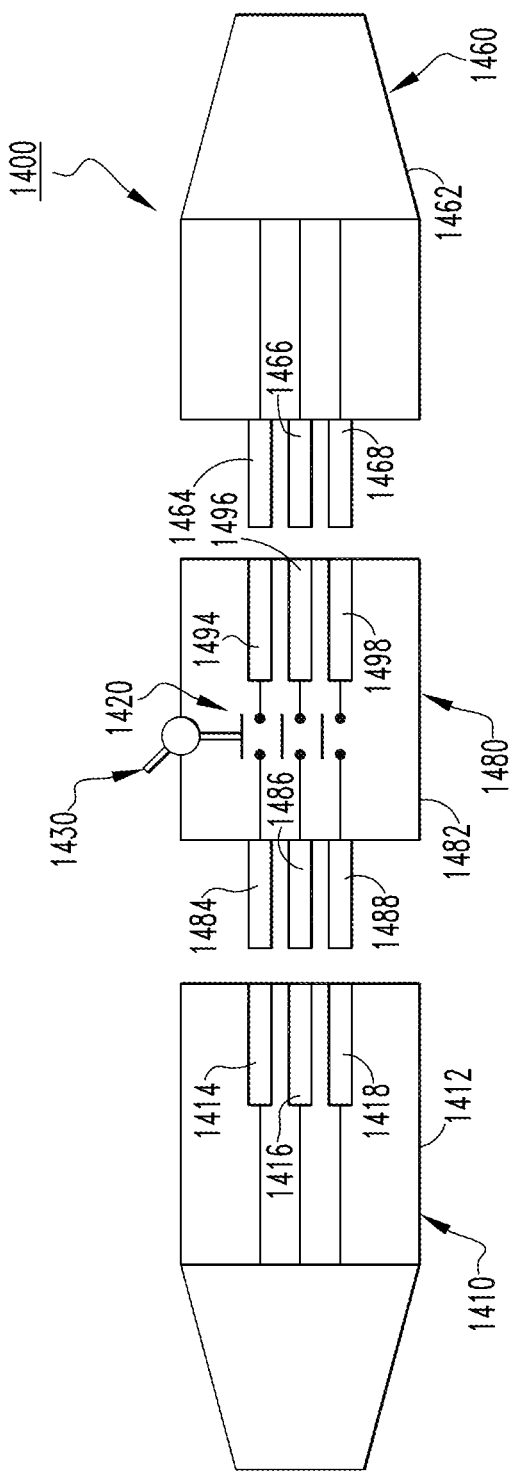
FIG. 16 is a simplified view of a power connector and electrical connection element therefor, in accordance with another non-limiting embodiment of the disclosed concept.

As seen in the non-limiting example of FIG. 16, the alternative power connector 1400 includes many of the same components as the power connector 100 (FIGS. 1 and 2), and like components are labeled with like reference numerals. However, different from the power connector 100 (FIGS. 1 and 2), the power connector 1400 further includes an electrical connection element (e.g., without limitation, adapter 1480) that mechanically couples and electrically connects the line side electrical receptacle 1410 to the load side electrical receptacle 1460. The adapter 1480 includes a housing 1482 that has a first number of electrical mating members, such as the example male conductors (e.g., without limitation, pins 1484, 1486, 1488) and a second number of electrical mating members, such as the example female conductors (e.g., without limitation, sleeves 1494, 1496, 1498).

Additionally, as shown, the adapter 1480 advantageously includes the contact assembly 1420 and the operating lever 1430 that opens and closes the contact assembly 1420. In operation, the pins 1484, 1486, 1488 remain mechanically coupled to (i.e., inserted into) and electrically connected with the sleeves 1414, 1416, 1418, and the pins 1464, 1466, 1468 remain mechanically coupled to (i.e., inserted into) and electrically connected with the sleeves 1494, 1496, 1498 when the operating lever 1430 opens and closes the contact assembly 1420. Thus, advantages associated with minimizing "hot plugging" are likewise provided for in the power connector 1400. Additionally, the adapter 1480 is a separate component from the line side electrical receptacle 1410 and the load side electrical receptacle 1460. It will be appreciated that the power connector 1400 advantageously employs known receptacles (i.e., the line side electrical receptacle 1410 and the load side electrical receptacle 1460) that advantageously require no modification. Thus, manufacturing of the power connector 1400 is advantageously simplified and "hot plugging" is minimized.

Accordingly, it will be appreciated that the disclosed concept provides for an improved (e.g., without limitation, longer-lasting, better-protected from dangerous switching energies) power connector 100, 200, 300, 400, 500, 600, 700, 800, 900, 1000, 1100, 1200, 1300, 1400 and electrical connection element 110, 260, 310, 460, 560, 610, 760, 860, 910, 1010, 1160, 1210, 1360, 1480 and associated method therefor, which among other benefits, redirects switching energy to a contact assembly 120, 220, 320, 420, 520, 620, 720, 820, 920, 1020, 1120, 1220, 1320, 1420 in order to minimize the occurrence of "hot plugging" within the power connector 100, 200, 300, 400, 500, 600, 700, 800, 900, 1000, 1100, 1200, 1300, 1400.

Figure 17:
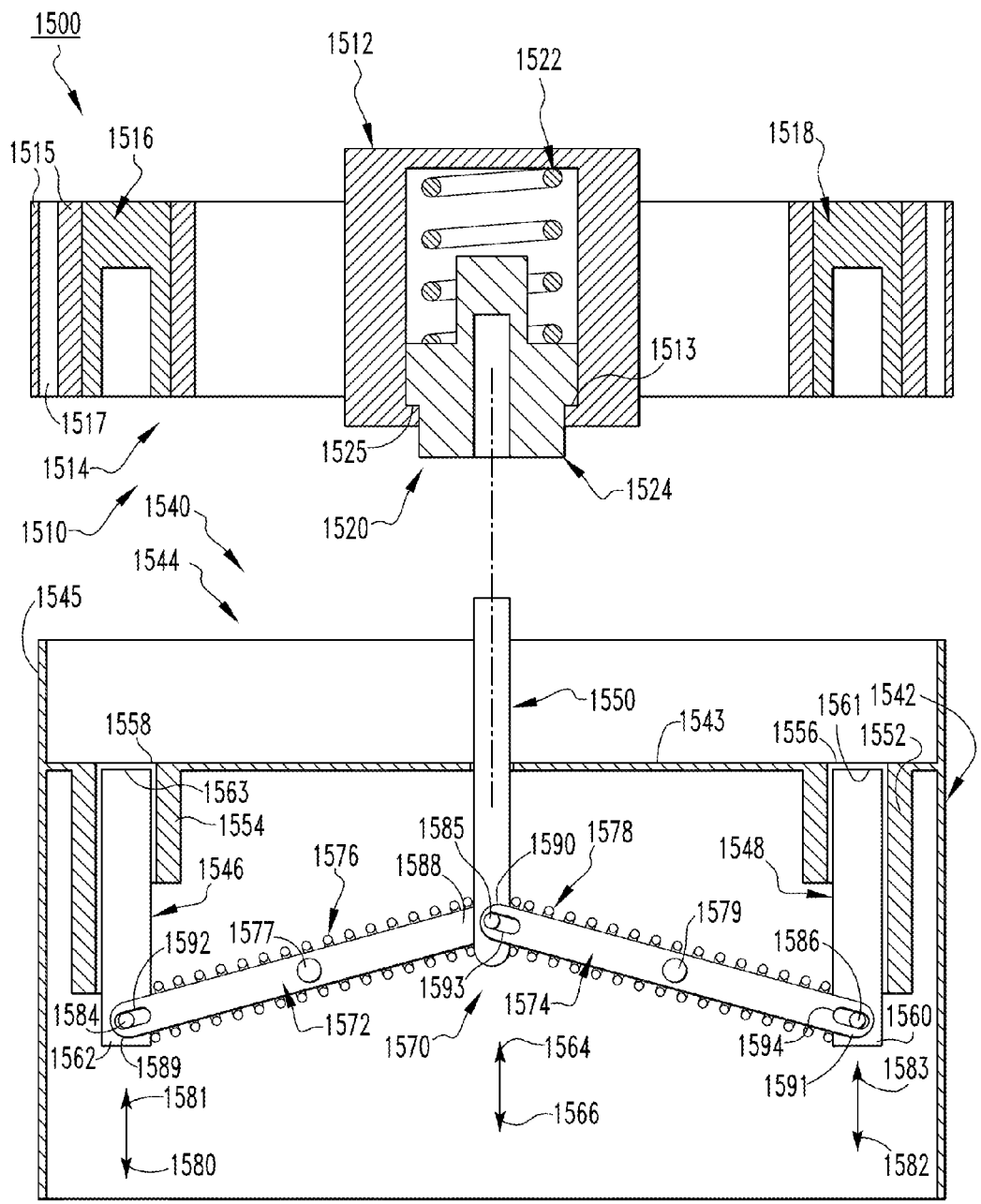
FIG. 17 is a simplified view of a power connector and electrical connection element therefor, showing the second mating assembly in a first position, in accordance with another non-limiting embodiment of the disclosed concept.

In addition to the foregoing, FIG. 17 shows a simplified view of a portion of a non-limiting example power connector 1500 in which an electrical connection element (e.g., load side electrical receptacle 1540) includes an insulative housing 1542 and a mating assembly 1544 located on the insulative housing 1542. In the example shown, the line side electrical receptacle 1510 includes an insulative housing 1512 and a mating assembly 1514 located on the insulative housing 1512. As shown, the mating assembly 1514 includes a number of electrical mating members such as the example female conductors (e.g., phase sleeves 1516, 1518) that are substantially enclosed by the insulative housing 1512.

The mating assembly 1544 includes a number of electrical mating members such as the example male conductors (e.g., phase pins 1546, 1548) that are structured to be electrically connected to the sleeves 1516, 1518. In the depicted first position of FIG. 17, the load side electrical receptacle 1540 is spaced from the line side electrical receptacle 1510. In this position, and as will be discussed in greater detail below, the pins 1546, 1548 are advantageously substantially enclosed by the insulative housing 1542. Thus, the potential for inadvertent contact with the potentially "hot" pins 1546, 1548 is significantly lessened, as the pins 1546, 1548 are well protected (i.e., as a result of being surrounded by or enclosed by the insulative housing 1542) in this position. Also, the power connector 1500 advantageously allows the pins 1546, 1548 to move to a second position (shown in FIG. 20) in which the pins 1546, 1548 engage the sleeves 1516, 1518 in order to create an electrical pathway therebetween and thus connect power. That is, the mating assembly 1544 is structured to move between a first position (FIG. 17) corresponding to the pins 1546,1548 being substantially enclosed by the insulative housing 1542, and a second position (FIG. 20) corresponding to the pins 1546,1548 being partially located external the insulative housing 1542.

Continuing to refer to FIG. 17, the mating assembly 1514 of the line side electrical receptacle 1510 further includes a driving apparatus 1520 coupled to the insulative housing 1512. The driving apparatus 1520 has a biasing element (e.g., spring 1522) and a ground sleeve 1524. The ground sleeve 1524 is slidably coupled to the insulative housing 1512. Specifically, in operation the ground sleeve 1524 is structured to move independently with respect to the insulative housing 1512. Additionally, the insulative housing 1512 has a shelf 1513 and the ground sleeve 1524 has a lip 1525 that is structured to engage the shelf 1513. The interaction between the lip 1525 of the ground sleeve 1524 and the shelf 1513 advantageously allows the ground sleeve to be maintained on the insulative housing 1512.

The spring 1522 engages the insulative housing 1512 and the ground sleeve 1524 and biases the ground sleeve 1524 in a direction 1566. The mating assembly 1544 of the load side electrical receptacle 1540 further includes a driving apparatus (e.g., ground pin 1550) that is structured to move in a first direction 1564 and a second direction (i.e., the direction 1566) opposite the first direction 1564. In operation, and as will be discussed in greater detail hereinbelow, the ground pin 1550 cooperates with the driving apparatus 1520 of the line side electrical receptacle 1510 in order to move the mating assembly 1544 between the first position (FIG. 17) corresponding to the pins 1546, 1548 being substantially enclosed by the insulative housing 1542, and the second position (FIG. 20) corresponding to the pins 1546, 1548 being partially located external the insulative housing 1542.

More specifically, the insulative housing 1542 has a generally planar insulative panel 1543, an annular-shaped peripheral rim 1545, and a number of insulative receiving portions (see, for example, two insulative receiving portions 1552, 1554). The insulative panel 1543 is located generally internal the peripheral rim 1545 (see, for example, FIG. 18). The peripheral rim 1545 cooperates with the insulative housing 1512 of the line side electrical receptacle 1510 to insulate the pins 1546,1548, as will be discussed in greater detail below. The receiving portions 1552, 1554 each extend from the panel 1543 toward a respective end portion 1560, 1562 of the pins 1546, 1548. The receiving portions 1552, 1554 have respective distal portions 1556, 1558 located at the insulative panel 1543. The pins 1546, 1548 have respective first end portions (i.e., the end portions 1560, 1562) and respective second end portions 1561, 1563 located opposite and distal the respective first end portions 1560, 1562.

As shown, when the mating assembly 1544 is in the first position (FIG. 17), the second end portions 1561, 1563 are located between the respective distal portions 1556, 1558 and the respective first end portions 1560, 1562. Although it is within the scope of the disclosed concept for the second end portions 1561,1563 to be located at the insulative panel 1543 when the mating assembly 1544 is in the first position (FIG. 17), having the second end portions 1561,1563 spaced a distance internal from the insulative panel 1543 provides advantageous additional protection. Thus, in the depicted first position of FIG. 17 (i.e., the position of the power connector 1500 when the line side electrical receptacle 1510 and the load side electrical receptacle 1540 are spaced apart and not engaging one another), the respective second end portions 1561, 1563 are substantially enclosed by (i.e., surrounded by and/or do not extend external to) the insulative housing 1542. It will thus be appreciated that the panel 1543 and the receiving portions 1552, 1554 advantageously provide a protective insulative barrier between an operator and the potentially "hot" pins 1546, 1548. This is distinct from known power connectors (not shown) in which the pins (not shown) are undesirably exposed and pose danger to operators when they are "hot." Accordingly, when the load side electrical receptacle 1540 is disconnected from (i.e., separated from and not engaging) the line side electrical receptacle 1510, operators are well protected against risks of inadvertent and dangerous contact with the potentially "hot" pins 1546, 1548.

Additionally, the power connector 1500 provides for a snap-action engagement between the pins 1546,1548 and the sleeves 1516,1518, which advantageously minimizes electrical arcing, heat dissipation, and teasing, therefore improving the life expectancy of the power connector 1500. More specifically, the mating assembly 1544 further includes a link assembly 1570 that has a number of linking members 1572,1574 and a number of biasing elements (e.g., springs 1576,1578). The linking members 1572, 1574 are each coupled to a respective one of the first end portions 1560, 1562. Furthermore, the linking members 1572, 1574 each couple a respective one of the pins 1546,1548 to the ground pin 1550, and cooperate with the pins 1546,1548 and the ground pin 1550, as will be described in greater detail below. The springs 1576, 1578 are each located on a corresponding one of the linking members 1572, 1574. More specifically, the linking members 1572, 1574 preferably, but without limitation, extend through the springs 1576, 1578. When the mating assembly 1544 is in the first position (FIG. 17), the springs 1576, 1578 exert respective biases in respective directions 1580, 1582 on the respective pins 1546, 1548 in order to maintain the pins 1546, 1548 in the first position. In the first position (FIG. 17), the respective directions 1580, 1582 are into the load side electrical receptacle 1540. In other words, when the load side electrical receptacle 1540 is in the first position (FIG. 17), the springs 1576, 1578 bias the pins 1546, 1548 toward, and thus maintain the pins 1546, 1548 in, the first position (FIG. 17). This advantageously ensures that the potentially "hot" pins 1546, 1548 remain internal, and are thus protected by, the insulative housing 1542.

Figure 20:
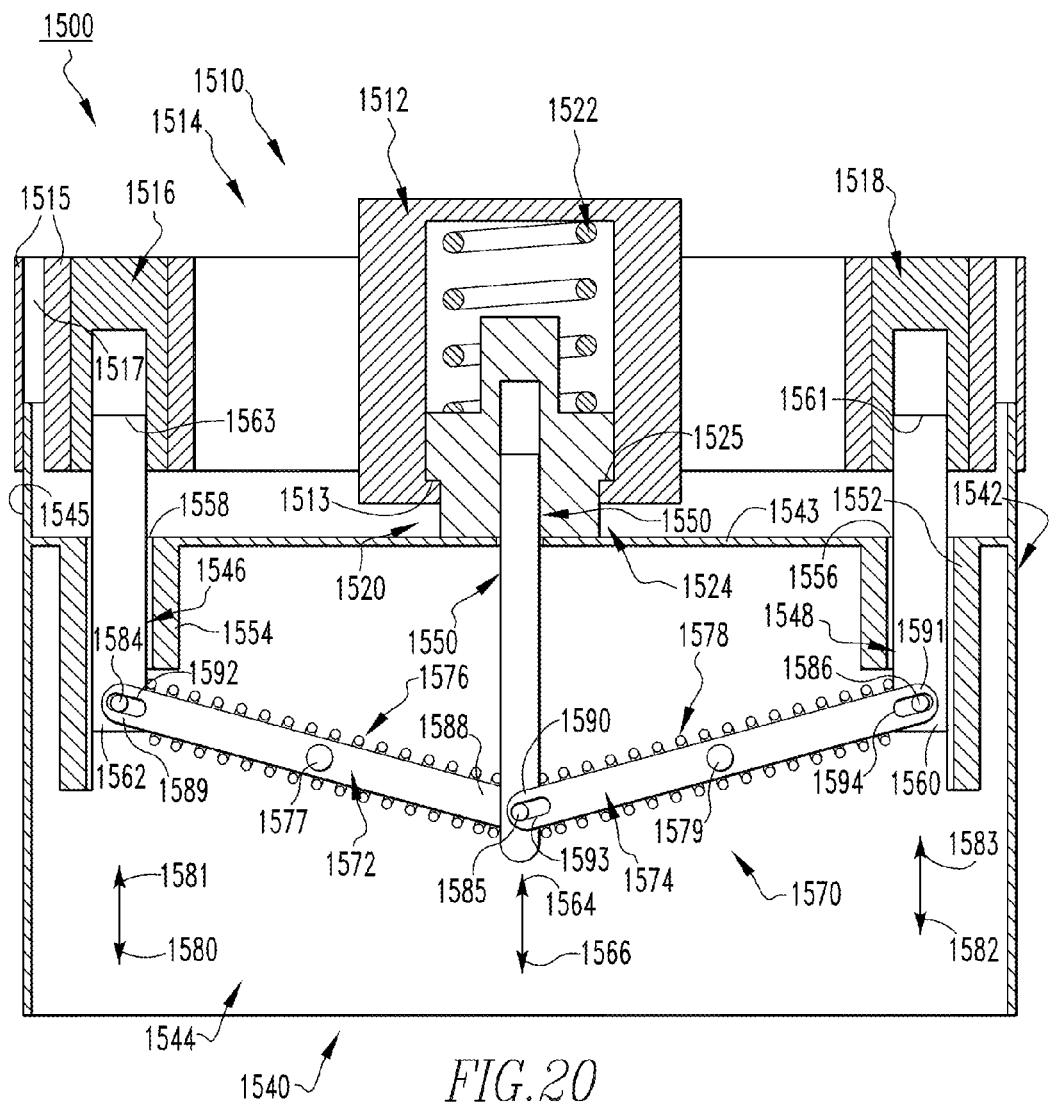
FIG. 20 is a simplified view of the portion of the power connector and electrical connection element therefor of FIG. 17, showing the second mating assembly in a second position.

As shown in FIG. 18, the mating assembly 1544 further includes another male conductor (e.g., phase pin 1547) that is structured to be electrically connected to a corresponding sleeve (not shown) of the line side electrical receptacle 1510 (FIGS. 17, 19 and 20). Thus, it will be appreciated that the pin 1547 is coupled to the ground pin 1550 by way of another linking member (not shown) of the link assembly 1570 and is biased toward the first position (FIG. 17) by another corresponding biasing element (not shown) of the link assembly 1570 in substantially the same manner in which the springs 1576, 1578 bias the pins 1546, 1548 toward the first position (FIG. 17). It will be appreciated that while the disclosed concept herein is being described in association with the three phase pins 1546, 1547, 1548, a suitable alternative power connector (not shown) may include any number of pins without departing from the scope of the disclosed concept. Continuing to refer to FIG. 18, the panel 1543 connects each of the receiving portions 1552, 1554 (and the corresponding receiving portion of the pin 1547, shown but not indicated) to one another. As a result, the panel 1543 significantly obstructs entry into the load side electrical receptacle 1540. Furthermore, because the pins 1546, 1547 (FIG. 18), 1548 are behind the panel 1543 (i.e., are spaced a distance internal and/or spaced a distance from a top surface of the panel 1543), the potential for inadvertent dangerous contact is significantly lessened.

It will be appreciated that a method of assembling the power connector 1500 includes the steps of: providing the load side electrical receptacle 1540; providing the line side electrical receptacle 1510; aligning the sleeves 1516, 1518 with the pins 1546, 1547 (FIG. 18), 1548; aligning the ground pin 1550 with the ground sleeve 1524; pushing (i.e., inserting) the ground pin 1550 into the ground sleeve 1524, thereby causing the pins 1546, 1547 (FIG. 18), 1548 to move independently with respect to the insulative housing 1542 and be partially located external the insulative housing 1542; and mechanically engaging the sleeves 1516, 1518 with the pins 1546, 1547 (FIG. 18), 1548. The method further includes the step of driving the ground sleeve 1524 in the first direction 1564 into the insulative housing 1512 until the spring 1522 drives the ground sleeve 1524 in the second direction 1566 opposite the first direction 1564. Thus, it will be appreciated that when the mating assembly 1544 moves from the first position (FIG. 17) to the second position (FIG. 20), the pins 1546, 1547 (FIG. 18), 1548 slide at least partially through the corresponding distal portions 1556, 1558 in order to be at least partially located external the insulative housing 1542.

FIG. 19 shows the mating assembly 1544 in a third position between the first position (FIG. 17) and the second position (FIG. 20). In this position, the ground pin 1550 has been inserted into the ground sleeve 1524 and has caused the ground sleeve 1524 to move independently with respect to the insulative housing 1512. Specifically, the ground sleeve 1524 has slid into the insulative housing 1512, thus being more enclosed by the insulative housing 1512 in the third position (FIG. 19) than the first position (FIG. 17). As a result, the spring 1522 is caused to compress. As the ground pin 1550 is being driven into the ground sleeve 1524, the ground pin 1550 is moving in the first direction 1564. When the ground pin 1550 moves in the first direction 1564, the mating assembly 1544 moves from the first position (FIG. 17) toward the third position (FIG. 19). When the ground pin 1550 moves in the second direction 1566, the mating assembly 1544 moves from the third position (FIG. 19) toward the second position (FIG. 20).

The compressed spring 1522 assists in moving the mating assembly 1544 from the third position (FIG. 19) toward the second position (FIG. 20). That is, when the mating assembly 1544 moves from the first position (FIG. 17) toward the third position (FIG. 19), the ground pin 1550 drives the ground sleeve 1524 in the first direction 1564 into the insulative housing 1512. When the mating assembly 1544 moves from the third position (FIG. 19) toward the second position (FIG. 20), the spring 1522 drives the ground sleeve 1524 in the second direction 1566 into the ground pin 1550 in order to force each of the pins 1546, 1547 (FIG. 18), 1548 into a corresponding one of the sleeves 1516, 1518 by a mechanism with a snap-action motion.

In addition to the force of the spring 1522, the springs 1576, 1578 advantageously assist in causing the mating assembly 1544 to move between positions by a mechanism with a snap-action motion. Specifically, as shown in the depicted orientation of FIG. 19 (i.e., the third position), the linking members 1572, 1574, and thus the springs 1576, 1578 have moved to a horizontal position. It will be appreciated that when the springs 1576, 1578 are in the horizontal position (i.e., the third position, specifically where the springs 1576, 1578 are oriented perpendicularly with respect to the pins 1546, 1547 (FIG. 18), 1548), the springs 1576, 1578 do not exert any bias on the respective pins 1546, 1547 (FIG. 18), 1548 in either the respective directions 1580, 1582 or in respective directions 1581, 1583 opposite the respective directions 1580, 1582.

When the mating assembly 1544 moves from the first position (FIG. 17) toward the second position (FIG. 20), the spring 1522, and the springs 1576, 1578, pass an equilibrium position (i.e., the third position of FIG. 19). Instantly after passing the equilibrium position (i.e., the third position of FIG. 19), the spring 1522 and the springs 1576, 1578 drive the mating assembly 1544 to the second position (FIG. 20). That is, the spring 1522 releases stored energy and drives the ground sleeve 1524 into the ground pin 1550, which causes the linking members 1572, 1574 to move beyond the third position (FIG. 19). Specifically, the linking members 1572, 1574 are pivotably coupled to the ground pin 1550. Thus, when the mating assembly 1544 moves from the third position (FIG. 19) toward the second position (FIG. 20), the linking members 1572, 1574 continue to rotate (i.e., in the depicted orientation the linking member 1572 rotates in the clockwise direction, and the linking member 1574 rotates in the counterclockwise direction).

While the linking members 1572, 1574 are rotating between positions (i.e., from the first position toward the third position, and from the third position toward the second position), the springs 1576, 1578 are storing and releasing energy. That is, when the mating assembly 1544 moves from the first position (FIG. 17) toward the third position (FIG. 19), the springs 1576, 1578 compress and store energy. When the mating assembly 1544 moves from the third position (FIG. 19) toward the second position (FIG. 20), the stored energy of the springs 1576, 1578 is able to be released and drive the pins 1546, 1547 (FIG. 18), 1548 into the sleeves 1516, 1518 by a mechanism with a snap-action motion. Accordingly, it will be appreciated that the driving step of the assembly method further includes the step of releasing the stored energy of the springs 1576, 1578 when the ground sleeve 1524 begins to move in the second direction 1566, thereby forcing each of the pins 1546, 1547 (FIG. 18), 1548 into engagement with sleeves 1516, 1518. Referring to FIG. 20, it will be appreciated that when the mating assembly 1544 is in the second position, the springs 1576, 1578 exert respective biases on the respective pins 1546, 1547 (FIG. 18), 1548 in the respective directions 1581, 1583 opposite the directions 1580, 1582 in order to maintain the pins 1546, 1547 (FIG. 18), 1548 in the second position.

In order to allow the mating assembly 1544 to move between positions, the link assembly 1570 further includes a number of sliding members 1584, 1586 each coupled to a corresponding one of the pins 1546, 1547 (FIG. 18), 1548, and at least one other sliding member 1585 coupled to the ground pin 1550. The linking members 1572, 1574 each have a respective first end portion 1588, 1590 and a respective second end portion 1589, 1591 located opposite and distal the respective first end portion 1588, 1590. The first end portions 1588, 1590 each have a respective slot (for ease of illustration, only slot 1593 of the first end portion 1590 is depicted) that (via the sliding member 1585) allows the first end portions 1588, 1590 to be pivotably coupled to the ground pin 1550. The second end portions 1589, 1591 each have a respective slot 1592, 1594. In operation, each sliding member 1584, 1585, 1586 is structured to slide within a respective slot 1592, 1593, 1594 (and the slot of the first end portion 1588) in order to allow the mating assembly 1544 to move between the first position (FIG. 17) and the second position (FIG. 20). Additionally, the linking members 1572, 1574 each have a respective pivoting location 1577, 1579 located generally midway between the respective first end portions 1588, 1590 and the second end portions 1589, 1591. It will be appreciated that when the mating assembly 1544 moves between positions, the pivoting locations 1577, 1579 remain fixed with respect to the insulative housing 1542. That is, the linking members 1572, 1574 rotate about (i.e., with respect to) the pivoting locations 1577, 1579.

The insulative housing 1512 of the line side electrical receptacle 1510 includes an annular-shaped insulative receiving portion 1515 having a slot 1517. As shown in FIG. 20, when the pins 1546, 1547 (FIG. 18), 1548 have been inserted into the sleeves 1516, 1518, the peripheral rim 1545 extends into the slot 1517 and advantageously provides a protective barrier against inadvertent contact with the electrically connected pins 1546, 1547 (FIG. 18), 1548. Additionally, when the mating assembly 1544 is in this second position, each of the pins 1546, 1547 (FIG. 18), 1548 extends into a corresponding one of the sleeves 1516,1518 in order to electrically connect the line side electrical receptacle 1510 to the load side electrical receptacle 1540.

Additionally, although the disclosed concept has been described in association with the mating assembly 1544 moving between positions in order to allow the pins 1546, 1547 (FIG. 18), 1548 to be inserted into the sleeves 1516, 1518, it will be appreciated that a suitable alternative power connector (not shown) may employ the load side electrical receptacle 1540 and another electrical component that includes phase pins (not shown) that mechanically engage the pins 1546, 1547 (FIG. 18), 1548 instead of sleeves, without departing from the scope of the disclosed concept.

Accordingly, it will be appreciated that the disclosed concept provides for an improved (e.g., without limitation, better-protected, longer-lasting) power connector 1500, and electrical connection element 1540 and assembly method therefor, which among other benefits, encloses potentially "hot" pins 1546, 1547, 1548 within an insulative housing 1542, thereby protecting operators from dangers associated with inadvertent exposure to the pins 1546, 1547, 1548. Additionally, because assembly of the power connector 1500 involves a mechanism with a snap-action motion, life expectancy of the power connector 1500 is improved, as electrical arcing, heat dissipation, and teasing are all minimized.

Figure 21:
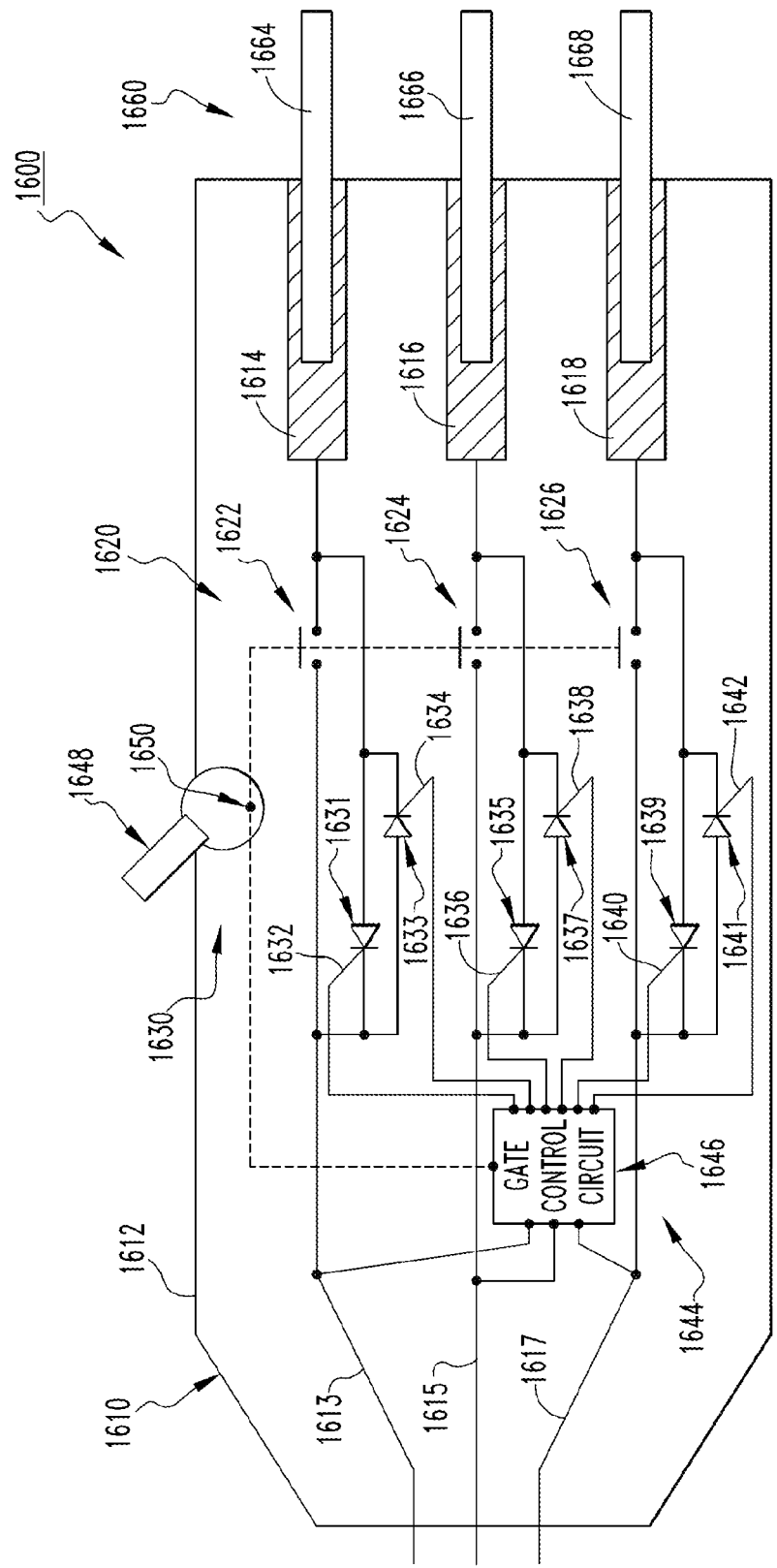
FIG. 21 is a simplified view of a portion of a power connector and electrical connection element therefor, in accordance with another non-limiting embodiment of the disclosed concept.

In addition to the foregoing, FIG. 21 shows one non-limiting example embodiment of an alternative power connector 1600 which includes many of the same components as the power connector 100 (FIGS. 1 and 2), and many of the components are labeled with like reference numbers. As shown, the contact assembly 1620 includes a number of sets of separable contacts 1622, 1624, 1626 that are each electrically connected to at least one of the sleeves 1614, 1616, 1618. However, in addition to including the contact assembly 1620, the line side electrical receptacle 1610 further includes an arc suppression system 1630 that advantageously suppresses arcing in the line side electrical receptacle 1610 when the contact assembly 1620 moves between an OPEN position and a CLOSED position.

The arc suppression system 1630 preferably includes a number of electronic devices such as the example SCRs 1631, 1633, 1635, 1637, 1639, 1641, and a control mechanism 1644 for controlling the SCRs 1631, 1633, 1635, 1637, 1639, 1641. Although the concept disclosed herein is being described in association with the SCRs 1631, 1633, 1635, 1637, 1639, 1641 as the electronic devices, it will be appreciated that any suitable alternative electronic device (e.g., FETs and/or IGBTs) (not shown) may be employed without departing from the scope of the disclosed concept.

In operation, when the contact assembly 1620 moves between the OPEN position and the CLOSED position, the control mechanism 1644 redirects current from each of the sets of separable contacts 1622, 1624, 1626 to a corresponding one of the SCRs 1631, 1633, 1635, 1637, 1639, 1641 in order to suppress arcing across the respective sets of separable contacts 1622, 1624, 1626.

More specifically, the SCRs 1631, 1633, 1635, 1637, 1639, 1641 carry current with a voltage significantly smaller than typical arc voltage. For example and without limitation, the SCRs 1631, 1633, 1635, 1637, 1639,1641 preferably carry current with a voltage of around 1 volt, whereas the voltage over an arc is generally greater than 12 volts. Because current follows the path of least resistance, the current will be redirected from the respective sets of separable contacts 1622, 1624, 1626 to the respective SCRs 1631, 1633, 1635, 1637, 1639, 1641. Thus, it will be appreciated that the arc suppression system 1630 ensures that the sets of separable contacts 1622, 1624, 1626 do not have to withstand significant arcing. Accordingly, the arc suppression system 1630 advantageously allows the size of the sets of separable contacts 1622, 1624, 1626 to be relatively small because arc erosion across the sets of separable contacts 1622, 1624, 1626 is significantly lessened. As a result, material can be saved and costs thereby reduced.

Each of the SCRs 1631, 1633, 1635, 1637, 1639, 1641 has a respective gate 1632, 1634, 1636, 1638, 1640, 1642. The control mechanism 1644 includes a gate control circuit 1646 and an operating mechanism (e.g., without limitation, operating lever 1648). The gate control circuit 1646 is structured to move each of the respective gates 1632, 1634, 1636, 1638, 1640, 1642 between an ON position and an OFF position in order to redirect current from the respective sets of separable contacts 1622, 1624, 1626 to a corresponding one of the SCRs 1631, 1633, 1635, 1637, 1639, 1641. The gate control circuit 1646 causes the gates 1632, 1634, 1636, 1638, 1640, 1642 to move between positions in response to any one of a number of input control signals, which include, for example, the position of the operating lever 1648, current magnitude, voltage across the separable contacts 1622, 1624, 1626, and/or time duration after the SCR's 1631, 1633, 1635, 1637, 1639, 1641 have been turned ON.

For example, when the sleeves 1614, 1616, 1618 and the pins 1664, 1666, 1668 are engaged, and the separable contacts 1622, 1624, 1626 move between the OPEN position and the CLOSED position, a bounce and an arc voltage is produced, which sends a signal to the gate control circuit 1646 to cause the gates 1632, 1634, 1636, 1638, 1640, 1642 to move from the OFF position to the ON position. Furthermore, a timer signal causes the gates 1632, 1634, 1636, 1638, 1640, 1642 to move to the OFF position after the current is carried by the SCR's 1631, 1633, 1635, 1637, 1639, 1641. Thus, at the instant when the contact assembly 1620 moves between the OPEN position and the CLOSED position (i.e., to disconnect power or to connect power, responsive to actuation of the operating lever 1648 after the sleeves 1614, 1616, 1618 and the pins 1664, 1666, 1668 have been mechanically coupled and electrically connected, as discussed above), the gate control circuit 1646 redirects current to a respective one of the SCRs 1631, 1633, 1635, 1637, 1639, 1641. In this manner, arcing across the respective sets of separable contacts 1622, 1624, 1626 is advantageously suppressed.

The operating lever 1648, which in the example shown, is coupled to the housing 1612 of the line side electrical receptacle 1610, is structured to move the contact assembly 1620 between the OPEN position and the CLOSED position. Additionally, the operating lever 1648 has a sensor 1650 that is structured to monitor circuit status of the contact assembly 1620. The sensor 1650 is electrically connected to the gate control circuit 1646 (e.g., without limitation, wirelessly connected) in order to provide indication of circuit status to the gate control circuit 1646. In other words, when the operating lever 1648 opens or closes the contact assembly 1620, the sensor 1650 sends a signal to the gate control circuit 1646, which in turn causes each of the respective gates 1632, 1634, 1636, 1638, 1640, 1642 to move from the OFF position to the ON position in order for current to be redirected and arcing to be advantageously suppressed.

Additionally, the housing 1612 of the line side electrical receptacle 1610 further includes a number of power cables 1613, 1615, 1617 each electrically connected to a corresponding one of the sleeves 1614, 1616, 1618. The gate control circuit 1646 is electrically connected to at least one of the power cables 1613, 1615, 1617 in order to be powered thereby. In this manner, the gate control circuit 1646 is advantageously able to be powered by the line side electrical receptacle 1610 without the need to employ a separate powering mechanism.

The line side electrical receptacle 1610 allows current to flow in two opposing directions (i.e., in a first direction out of the line side electrical receptacle 1610 and into the load side electrical receptacle 1660, and in a second direction into the line side electrical receptacle 1610 from the load side electrical receptacle 1660). Additionally, the SCRs 1631, 1633, 1635, 1637, 1639, 1641 are electrically connected in parallel with the sets of separable contacts 1622, 1624, 1626. More specifically, each of the respective first SCRs 1631, 1635, 1639 are electrically connected in parallel with a respective one of the second SCRs 1633, 1637, 1641 and a respective one of the sets of separable contacts 1622, 1624, 1626. Thus, responsive to current flowing in the first direction from the line side electrical receptacle 1610 into the load side electrical receptacle 1660, current is redirected into the first SCRs 1631, 1635, 1639 when the contact assembly 1620 moves between the OPEN position and the CLOSED position. Similarly, responsive to current flowing in the second direction from the load side electrical receptacle 1660 into the line side electrical receptacle 1610, current is redirected into the second SCRs 1633, 1637, 1641 when the contact assembly 1620 moves between the OPEN position and the CLOSED position. Although the concept disclosed herein is being described in association with two respective SCRs electrically connected in parallel to one set of separable contacts, it will be appreciated that a single SCR (not shown) could be electrically connected in parallel to a single set of separable contacts (not shown) in a suitable alternative power connector (e.g., without limitation, a power connector for direct current with a fixed polarity, not shown).

Additionally, an associated method of suppressing arcing in the power connector 1600 includes the steps of: providing the load side electrical receptacle 1660; providing the line side electrical receptacle 1610; electrically connecting the pins 1664, 1666, 1668 to the sleeves 1614, 1616, 1618; moving the contact assembly 1620 between an OPEN position and a CLOSED position; and redirecting current with the control mechanism 1644 from the respective sets of separable contacts 1622, 1624, 1626 to a corresponding one of the SCRs 1631, 1633, 1635, 1637, 1639, 1641. Furthermore, the redirecting step includes moving the respective gates 1632, 1634, 1636, 1638, 1640, 1642 from an OFF position to an ON position in order to redirect current from the respective sets of separable contacts 1622, 1624, 1626 to the corresponding one of the SCRs 1631, 1633, 1635, 1637, 1639, 1641. The example method also includes the steps of: moving the contact assembly 1620 between the OPEN position and the CLOSED position with the operating lever 1648; sending a signal to the gate control circuit 1646 with the sensor 1650 in order to provide a circuit status indication; and either (a) redirecting current with the control mechanism 1644 from the respective sets of separable contacts 1622, 1624, 1626 to the first SCRs 1631, 1635, 1639 when current flows in the first direction, or (b) redirecting current with the control mechanism 1644 from the respective sets of separable contacts 1622, 1624, 1626 to the second SCRs 1633, 1637, 1641 when current flows in the second direction.

Figure 22:
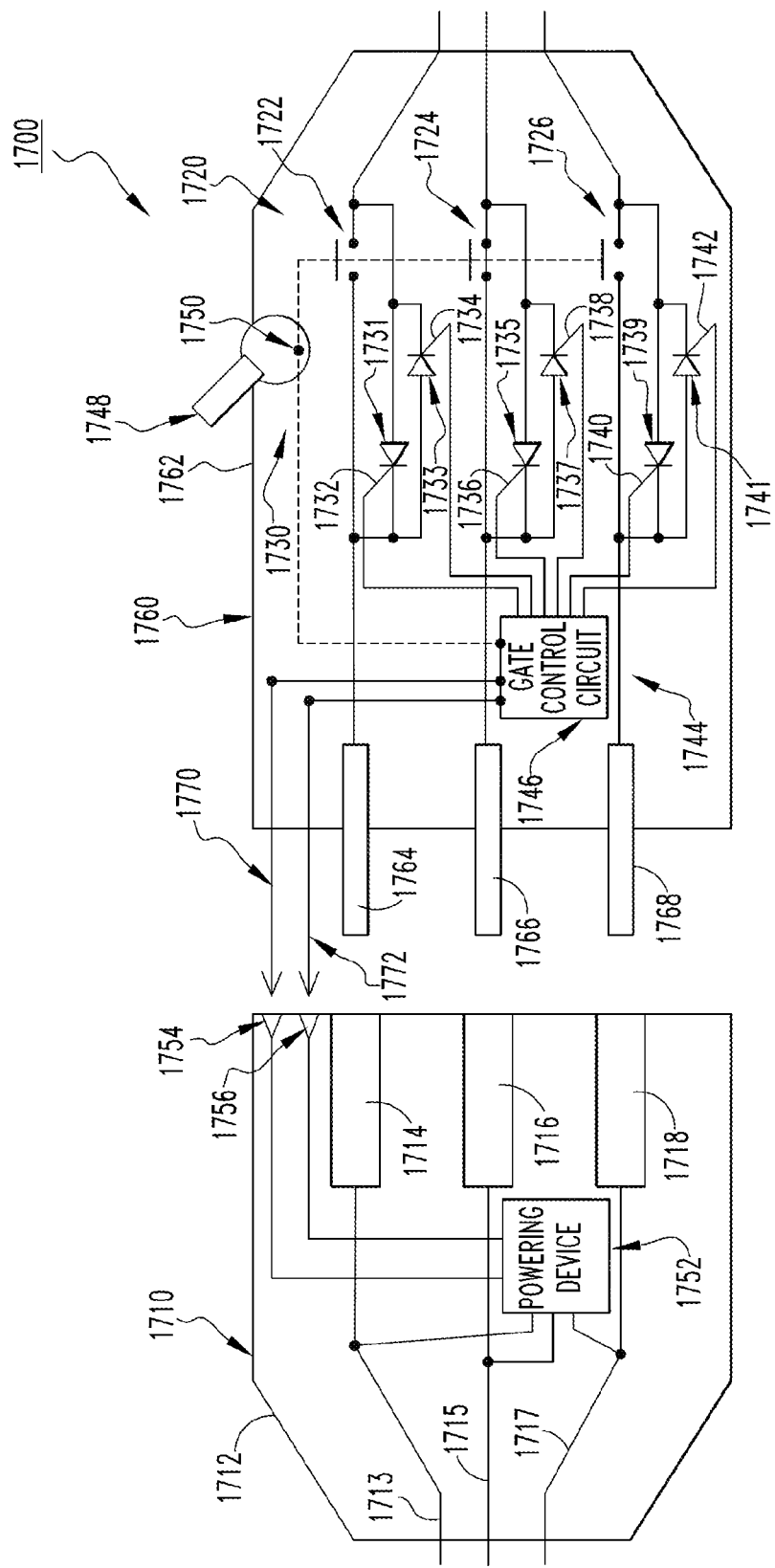
FIG. 22 is a simplified view of a power connector and electrical connection element therefor, in accordance with another non-limiting embodiment of the disclosed concept.

In addition to the foregoing, FIG. 22 shows another non-limiting example embodiment of an alternative power connector 1700 which includes many of the same components as the power connector 1600 (FIG. 21), and like components are labeled with like reference numbers. As shown, the arc suppression system 1730 is located in the load side electrical receptacle 1760. Furthermore, the housing 1762 of the load side electrical receptacle 1760 includes a number of electrical mating members, such as the example male conductors (e.g., without limitation, power pins 1770, 1772) electrically connected to the gate control circuit 1746. The line side electrical receptacle 1710 also includes a number of electrical mating members, such as the example female conductors (e.g., without limitation, power sleeves 1754, 1756), and a powering device 1752. The powering device 1752 is electrically connected to the power cables 1713, 1715, 1717 and the power sleeves 1754, 1756, and is operable to transfer power from the power cables 1713, 1715, 1717 to the power sleeves 1754, 1756.

In operation, each of the power sleeves 1754, 1756 is electrically connected to a corresponding one of the power pins 1770, 1772, thereby allowing the power cables 1713, 1715, 1717 (i.e., by way of the powering device 1752) to provide power to the gate control circuit 1746. It will be appreciated that the arc suppression system 1730 provides substantially the same advantages for the load side electrical receptacle 1760 as the arc suppression system 1630 (FIG. 21) provides for the line side electrical receptacle 1610 (FIG. 21). That is, when the contact assembly 1720 moves between the OPEN position and the CLOSED position (i.e., responsive to movement of the operating lever 1748), the gate control circuit 1746 redirects current to the SCRs 1731, 1733, 1735, 1737, 1739, 1741 in order to advantageously suppress arcing across the respective sets of separable contacts 1722, 1724, 1726. Accordingly, arc suppression of a contact assembly (i.e., the contact assemblies 1620, 1720) is advantageously able to be achieved in a line side electrical receptacle (i.e., the line side electrical receptacle 1610) and a load side electrical receptacle (i.e., the load side electrical receptacle 1760).

Additionally, although the power connectors 1600, 1700 have been described in association with the operating levers 1648, 1748 as the operating mechanisms, it will be appreciated that a suitable alternative power connector (not shown) may employ a suitable alternative operating mechanism (i.e., the operating mechanisms 330, 430, 630, 830, 930 described above) in order to perform the desired function of opening and closing a respective contact assembly (not shown). Furthermore, although the arc suppression systems 1630, 1730 have been described in association with the line side electrical receptacle 1610 and the load side electrical receptacle 1760, respectively, it will be appreciated that a suitable alternative arc suppression system (not shown)

could be employed with a suitable alternative adapter (not shown) that is substantially similar to the adapter 1480 (FIG. 16).

Accordingly, it will be appreciated that the disclosed concept provides for an improved (e.g., without limitation, longer-lasting, better-protected, less expensive) power connector 1600, 1700, and electrical connection receptacle 1610, 1760 and arc suppression method therefor, which among other benefits, redirects current from a respective set of separable contacts 1622, 1624, 1626, 1722, 1724, 1726 to a respective electronic device 1631, 1633, 1635, 1637, 1639, 1641, 1731, 1733, 1735, 1737, 1739, 1741 in order to advantageously suppress arcing across the respective sets of separable contacts 1622, 1624, 1626, 1722, 1724, 1726. Thus, the size of each of the respective sets of separable contacts 1622, 1624, 1626, 1722, 1724, 1726 can advantageously be made relatively small due to the significantly reduced arc erosion, thereby saving material and reducing cost.

Figure 23:
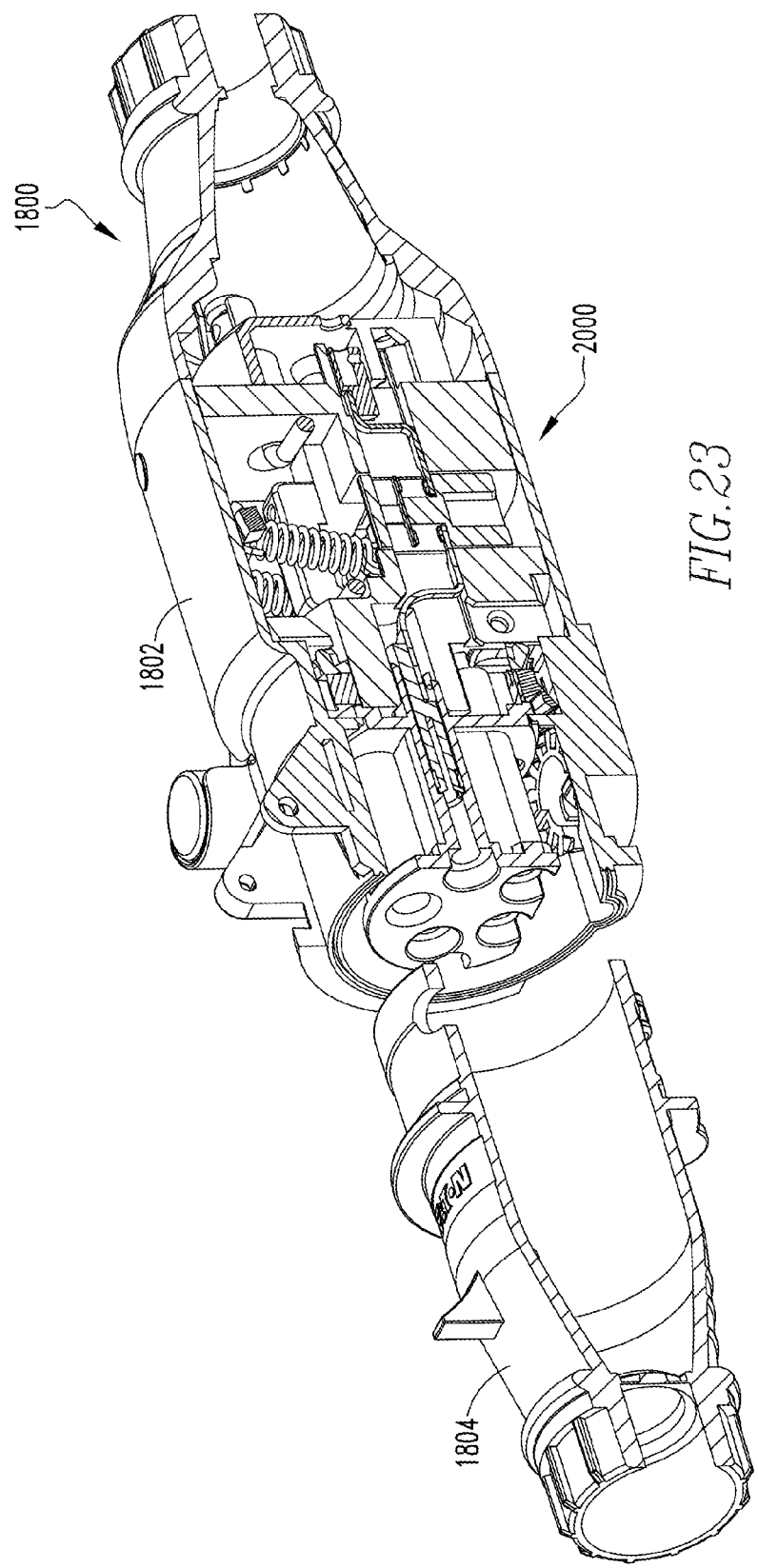
FIG. 23 is a cross-sectional, isometric view of a power connector with a toggle operating mechanism and an interlock assembly.
Figure 24:
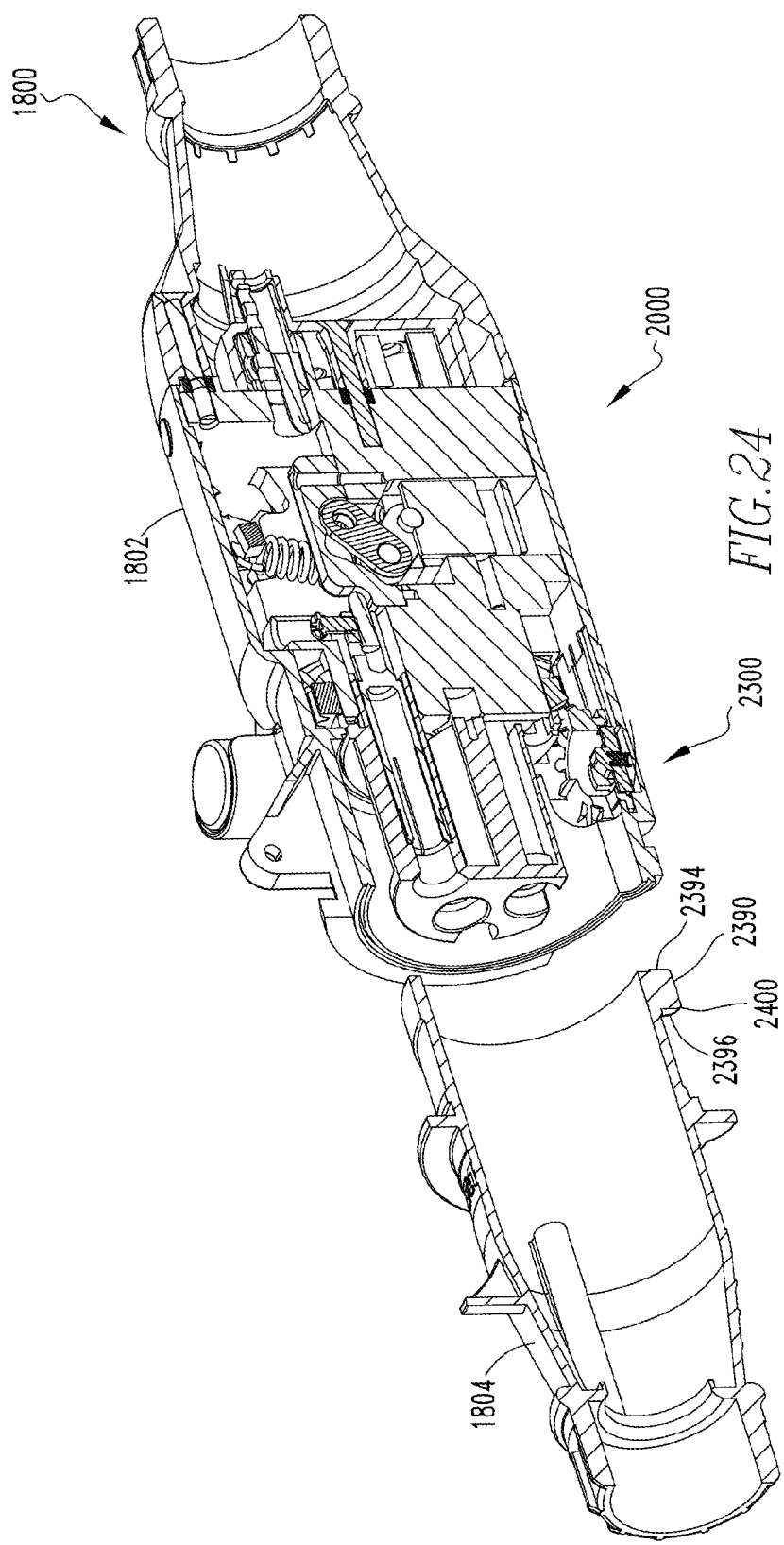
FIG. 24 is another cross-sectional, isometric view of a power connector with a toggle operating mechanism and an interlock assembly.
Figure 25:
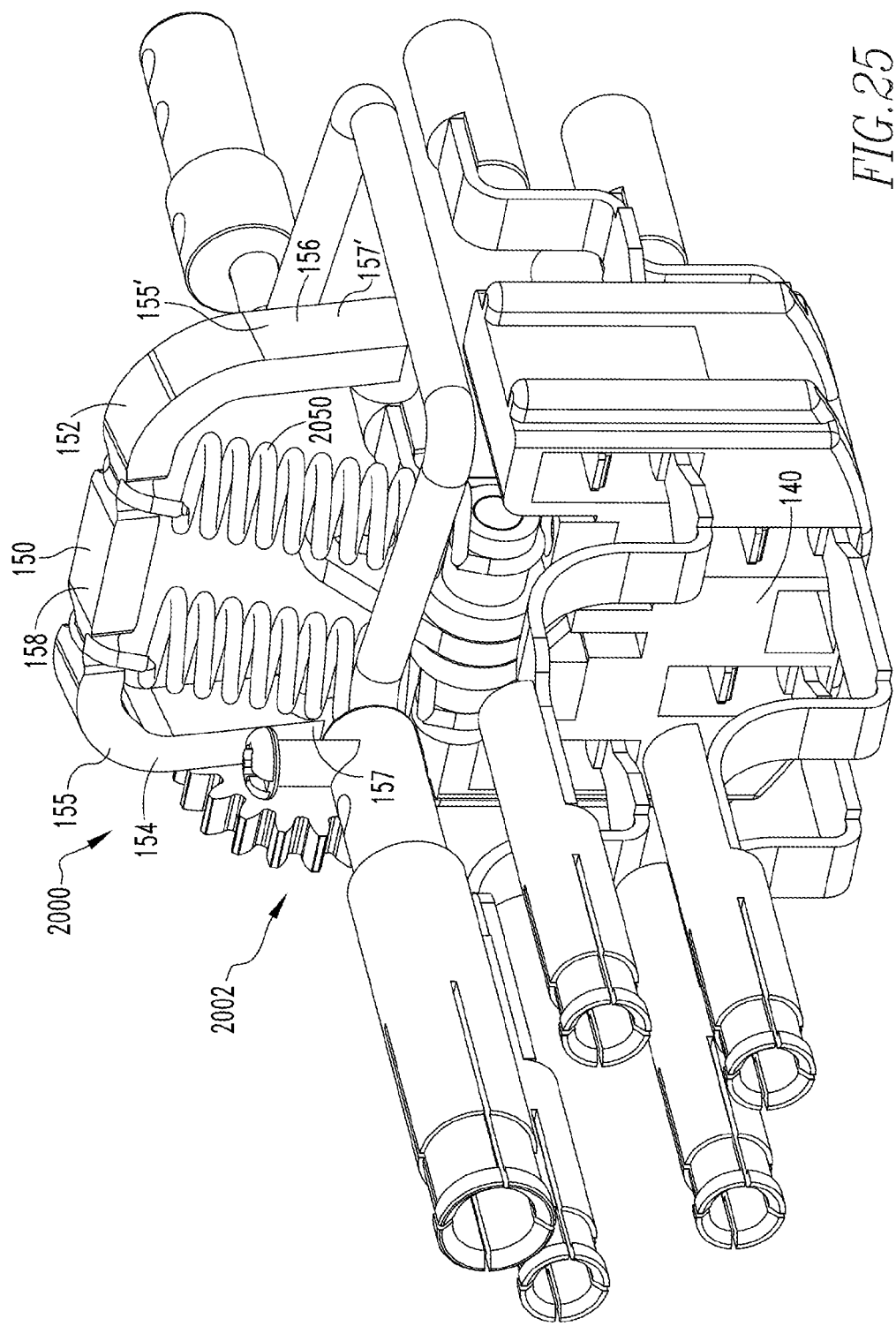
FIG. 25 is an isometric view of a toggle operating mechanism in a first configuration.
Figure 27:
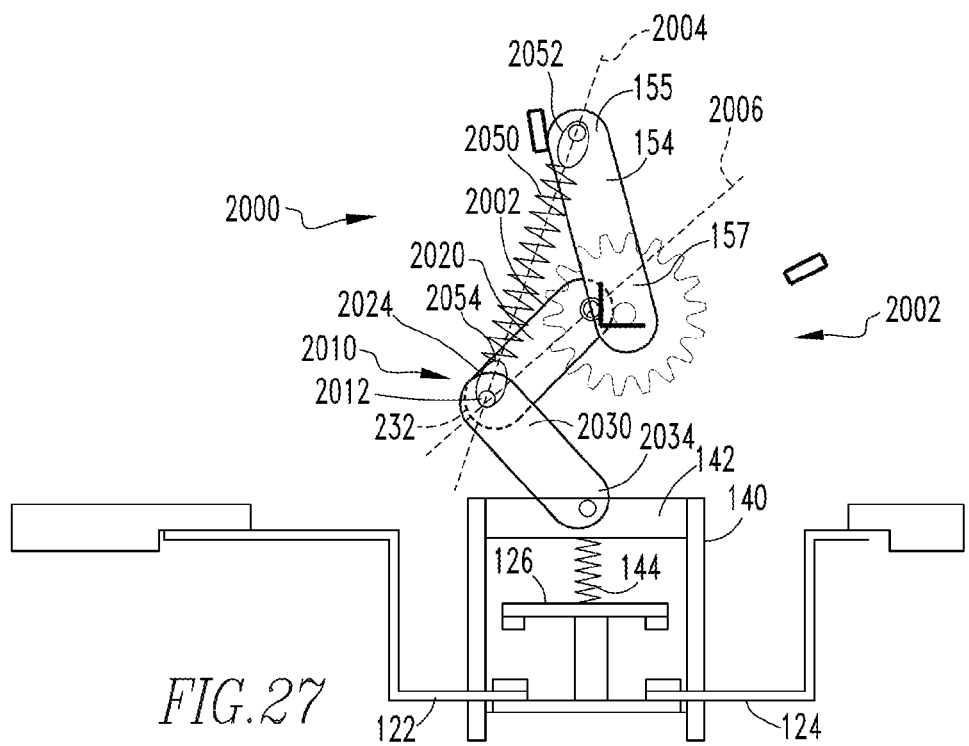
FIG. 27 is a schematic view of a toggle operating mechanism in a first configuration.
Figure 28:
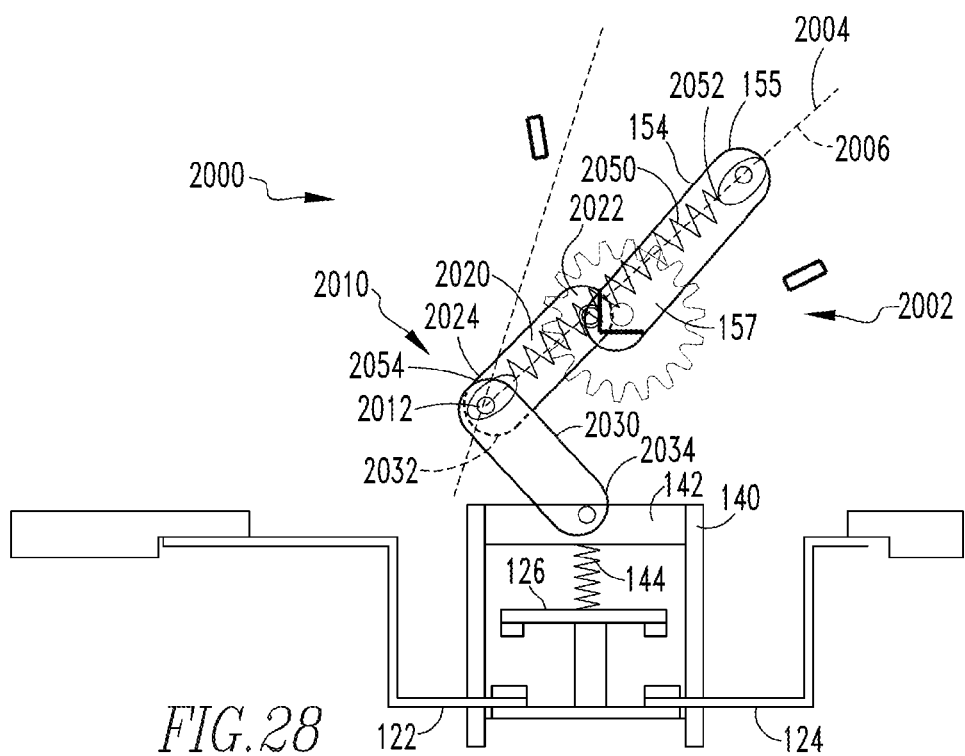
FIG. 28 is a schematic view of a toggle operating mechanism between a first configuration and a second configuration.
Figure 29:
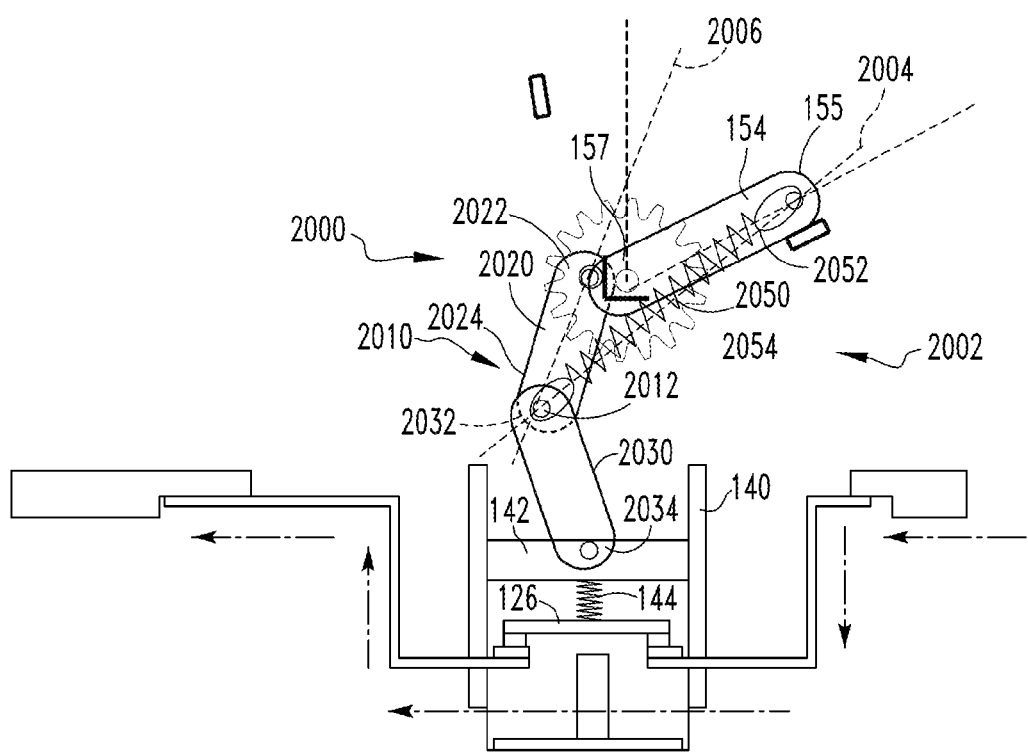
FIG. 29 is a schematic view of a toggle operating mechanism in a second configuration.
Figure 30:
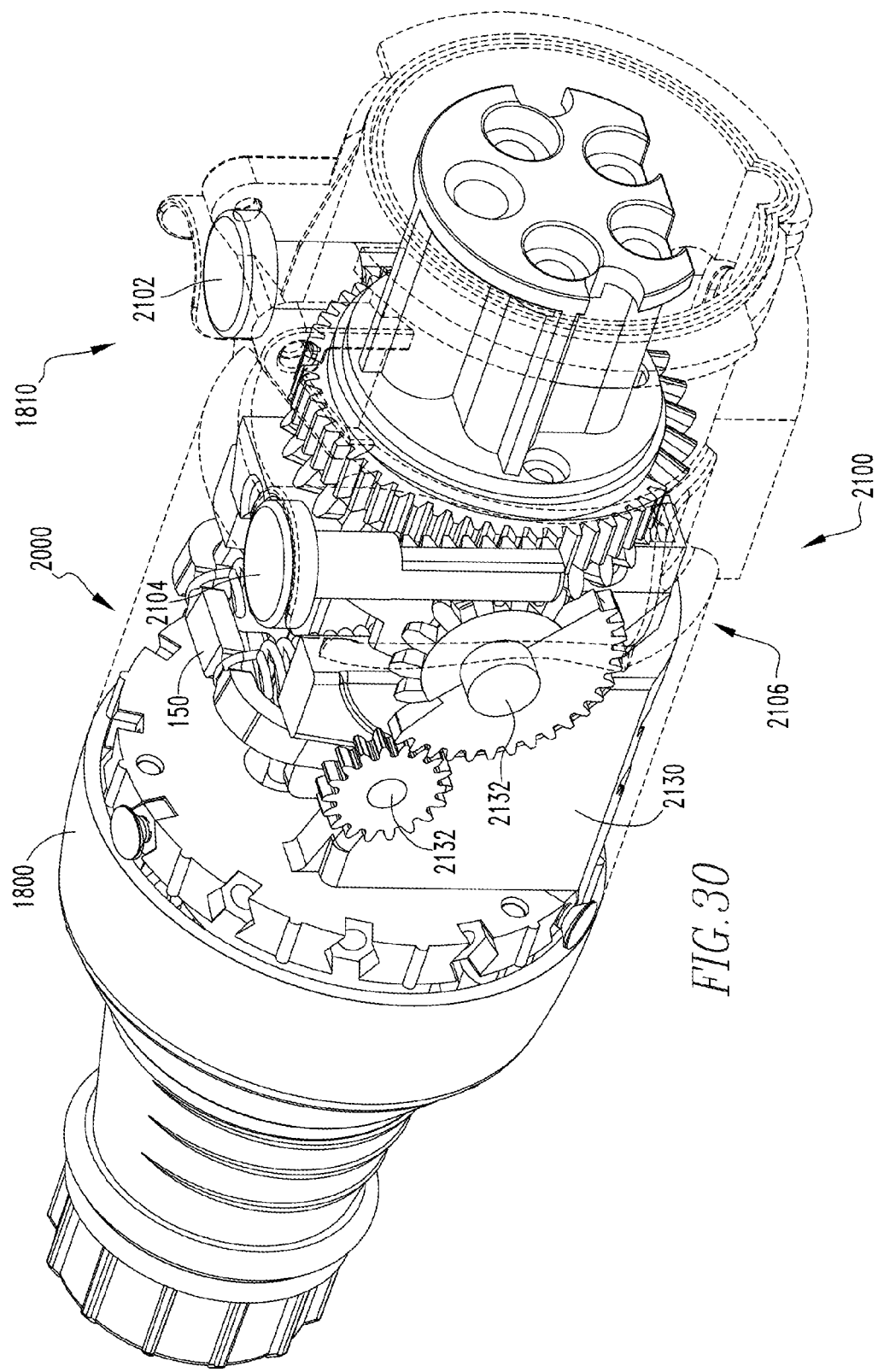
FIG. 30 is an isometric view of a power connector with an actuating assembly.
Figure 31:
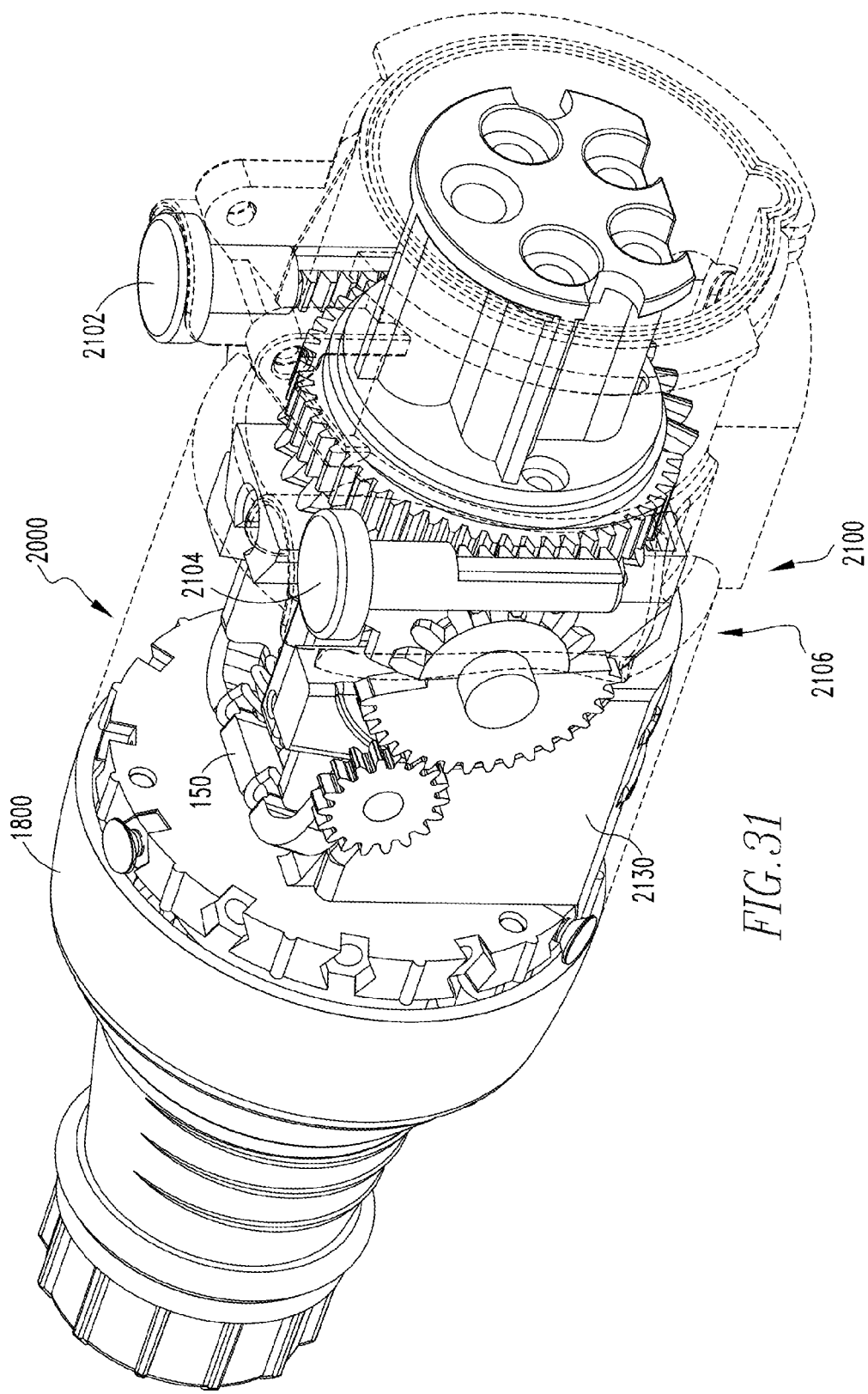
FIG. 31 is another isometric view of a power connector with an actuating assembly.

In another exemplary embodiment, shown in FIGS. 23-25 as well as schematically in FIGS. 27-29, the contact assembly 120 (shown schematically in FIG. 1) includes, and is structured to be open and closed by, a toggle operating mechanism 2000. As with the embodiments described above, the contact assembly 120, and therefore the toggle operating mechanism 2000, may be disposed in either the line side electrical receptacle 110 or the load side electrical receptacle 160. That is, the contact assembly 120, and therefore the toggle operating mechanism 2000, may be disposed in either the line side electrical receptacle housing 112 or the load side electrical receptacle housing 162. As such, the housings 112, 162 shall be identified hereinafter, and as used herein, as an elongated "housing 1800," See FIGS. 1, 23 and 24. It is understood that "housing 1800" is either the line side electrical receptacle housing 112 or the load side electrical receptacle housing 162. Alternatively, the either the line side electrical receptacle housing 112 and the load side electrical receptacle housing 162 are identified, as used herein, as the "power connector first housing 1802," or "first housing 1802," and the "power connector second housing 1804," or "second housing 1804." When using these terms it is understood that when one of the line side electrical receptacle housing 112 or the load side electrical receptacle housing 162 is identified as the "first housing 1802," then the other of the line side electrical receptacle housing 112 or the load side electrical receptacle housing 162 is identified as the "second housing 1804."

Further, as shown in FIGS. 1 and 27-29, the contact assembly 120 includes a number of line-side contacts 122, a number of load-side contacts 124, and a number of movable conductor members 126. Each conductor member 126 is associated with one line-side contact 122 and one load-side contact 124. That is, each conductor member 126 is associated with a pair of contacts 122, 124 wherein the pair of contacts includes one line-side contact 122 and one load-side contact 124. Each conductor member 126 is movable between a first position, wherein the associated line-side contact 122 and the associated load-side contact 124 are not electrically connected, and a second position, wherein the associated line-side contact 122 and the associated load-side contact 124 are electrically connected. Thus, the contact assembly 120 is structured to electrically connect and disconnect power while the number of first electrical mating members, e.g., pins 164, 166, 168, remain mechanically coupled to the number of second electrical mating members, e.g., sleeves 114, 116, 118. A problem with prior art contact assemblies is that the conductor members do not move between the first and second position rapidly. The disclosed toggle operating mechanism 2000 solves this problem.

The toggle operating mechanism 2000 is structured to open and close the contact assembly 120. In an exemplary embodiment, the toggle operating mechanism 2000 is a snap-action mechanism that is structured to open and close the contact assembly 120 by a snap-action. As shown in FIGS. 27-29, the toggle operating mechanism 2000 includes a toggle linkage 2002. The toggle linkage 2002 defines a "line of action" 2004 and a "toggle line" 2006. As used herein, a "line of action," when used in relation to a toggle assembly, means a line of force or bias acting on the toggle elements of a toggle assembly. As used herein, a "toggle line" is a line defined by the pivot points of the toggle elements of a toggle assembly. As is known, and as used herein, the "line of action," is disposed on either first side of the "toggle line," a second side of the "toggle line," or is on, or aligned with, the "toggle line." As used herein, and as shown in the figures, the "first side" and "second side" are relative to the "toggle line" when viewed from a position generally on, or parallel to, the axis of rotation between the toggle elements of a toggle assembly. As is known, when the "line of action" is disposed on a first side of the "toggle line," the toggle elements of a toggle assembly collapse in a first configuration. Conversely, when the "line of action" is disposed on a second side of the "toggle line," the toggle elements of a toggle assembly collapse in a second configuration. When the "line of action" is disposed on, or aligned with, the "toggle line," the toggle elements of a toggle assembly do not collapse. It is noted, however, that the toggle elements of a toggle assembly are rarely disposed exactly on, or aligned with, the "toggle line." Further, it is understood that when the toggle elements of a toggle assembly are moving, e.g., from a configuration wherein the "line of action" is disposed on a first side of the "toggle line" toward the "toggle line," when the line of action" is disposed on, or aligned with, the "toggle line," the momentum of the elements carry the toggle elements of a toggle assembly to a configuration wherein the "line of action" is disposed on a second side of the "toggle line." Further, as used herein, the "line of action," i.e., the force/bias, may be generated by a bias element, such as but not limited to a spring, or, by the configuration of the toggle elements of a toggle assembly. That is, as is known, and in an exemplary embodiment (not shown), the toggle elements of a toggle assembly interact with each other in a manner wherein force is generated therebetween.

In an exemplary embodiment, shown best in schematic FIGS. 27-29, the toggle linkage 2002 is operatively coupled to the conductor members 126 and is structured to move the conductor members 126 between the first and second positions. That is, the toggle linkage 2002 is movable between a first configuration, wherein each conductor member is in its first position, and a second configuration wherein, each conductor member is in its second position. Thus, when the toggle linkage line of action 2004 is on a first side of the toggle line 2006, the toggle linkage 2002 is biased toward the toggle linkage 2002 first configuration, when the toggle linkage line of action 2004 is on a second side of the toggle line 2006, the toggle linkage 2002 is biased toward the toggle linkage 2002 second configuration. Further, when the toggle linkage line of action 2004 moves from one side of the toggle line in a direction to align with the toggle line 2006, the toggle linkage line of action 2004 continues to move in the same direction until the toggle linkage line of action 2004 is on the other side of the toggle line 2006. That is, as used herein, "when the toggle linkage line of action 2004 moves from one side of the toggle line in a direction to align with the toggle line 2006, the toggle linkage line of action 2004 continues to move in the same direction until the toggle linkage line of action 2004 is on the other side of the toggle line 2006 means that when the toggle linkage line of action 2004 is on the first side of the toggle line 2006 and moves in a direction to aligned with the toggle line 2006, the toggle linkage line of action 2004 continues to move in the same direction until the toggle linkage line of action 2004 is on the second side of the toggle line 2006, and, when the toggle linkage line of action 2004 is on the second side of the toggle line 2006 and moves in a direction to align with the toggle line 2006, the toggle linkage line of action 2004 continues to move in the same direction until the toggle linkage line of action 2004 is on the first side of the toggle line 2006. In an exemplary embodiment, the toggle operating mechanism 2000, and more specifically the toggle linkage 2002, includes a "knee joint" 2010. As used herein, a "knee joint" means an assembly of two elongated rigid elements that are rotatably coupled to each other. Further, in an exemplary embodiment, the toggle operating mechanism knee joint 2010, hereinafter, "knee joint" 2010, includes an elongated upper link 2020 and an elongated lower link 2030. The upper link 2020 includes a first end 2022 and a second end 2024. In an exemplary embodiment, the upper link first end 2022 is coupled, directly coupled, or rotatably coupled to the housing 1800 (coupling not visible in the Figures).

Further, in an exemplary embodiment (not shown), upper link first end 2022 is attached to the housing 1800 or to an interlock tripping assembly (not shown). The interlock tripping assembly is, in an exemplary embodiment, a sliding or rotating member (not shown) that is held in a fixed first position when the line side electrical receptacle 110 is connected to the load side electrical receptacle 160. In the first position upper link first end 2022 is, generally, in the position shown in FIG. 27 and the toggle operating mechanism 2000 is capable of performing the snap action closing and opening of the contact member 126. When the two receptacles are parted, the interlock tripping assembly tripping member moves to a second position which causes the first position upper link first end 2022 to move and to change the angle of toggle line 2006. This change in the toggle line makes the toggle operating mechanism 2000 unstable in the second position (contacts closed position). If the contacts are closed at the moment that the two receptacles are parted, the movement of the interlock trip feature takes the end 2022 to the other side of the line of action 2004, thus causing the toggle operating mechanism 2000 to move to the first position and open the contacts 122, 124. This interlock tripping feature also prevents the toggle operating mechanism 2000 from moving to the second position (contacts closed) if the two receptacles 110, 160 are not connected.

The lower link 2030 includes a first end 2032 and a second end 2034. The upper link second end 2024 is rotatably coupled to the lower link first end 2032. In an exemplary embodiment, the upper link second end 2024 and the lower link first end 2032 each include an opening (not shown). In this embodiment, the knee joint 2010 also includes a knee pin 2012 that extends through the openings in the upper link second end 2024 and the lower link first end 2032. The toggle line 2006 extends through the knee pin 2012.

The lower link second end 2034 is rotatably coupled, or rotatably directly coupled, to the conductor member(s) 126. In an exemplary embodiment, the contact assembly 120 also includes a frame assembly 140, a number of slider members 142 and a number of contact springs 144 (FIGS. 27-29). The contact assembly frame assembly 140 is coupled, directly coupled, or fixed to the housing 1800. The contact assembly frame assembly 140 defines a number of slots or channels (not shown). Each contact assembly slider member 142 is movably disposed in a slot and thereby movably coupled to the contact assembly frame assembly 140. Each contact assembly contact spring 144 is disposed between a contact assembly slider member 142 and a conductor member 126. Each contact assembly contact spring 144 is structured to, and does, bias the conductor member 126 away from the associated contact assembly slider member 142. It is noted that the contact assembly contact springs 144 have a sufficiently limited length so that each conductor member 126 is spaced from the associated contacts 124, 126 when in the first position.

Figure 26:
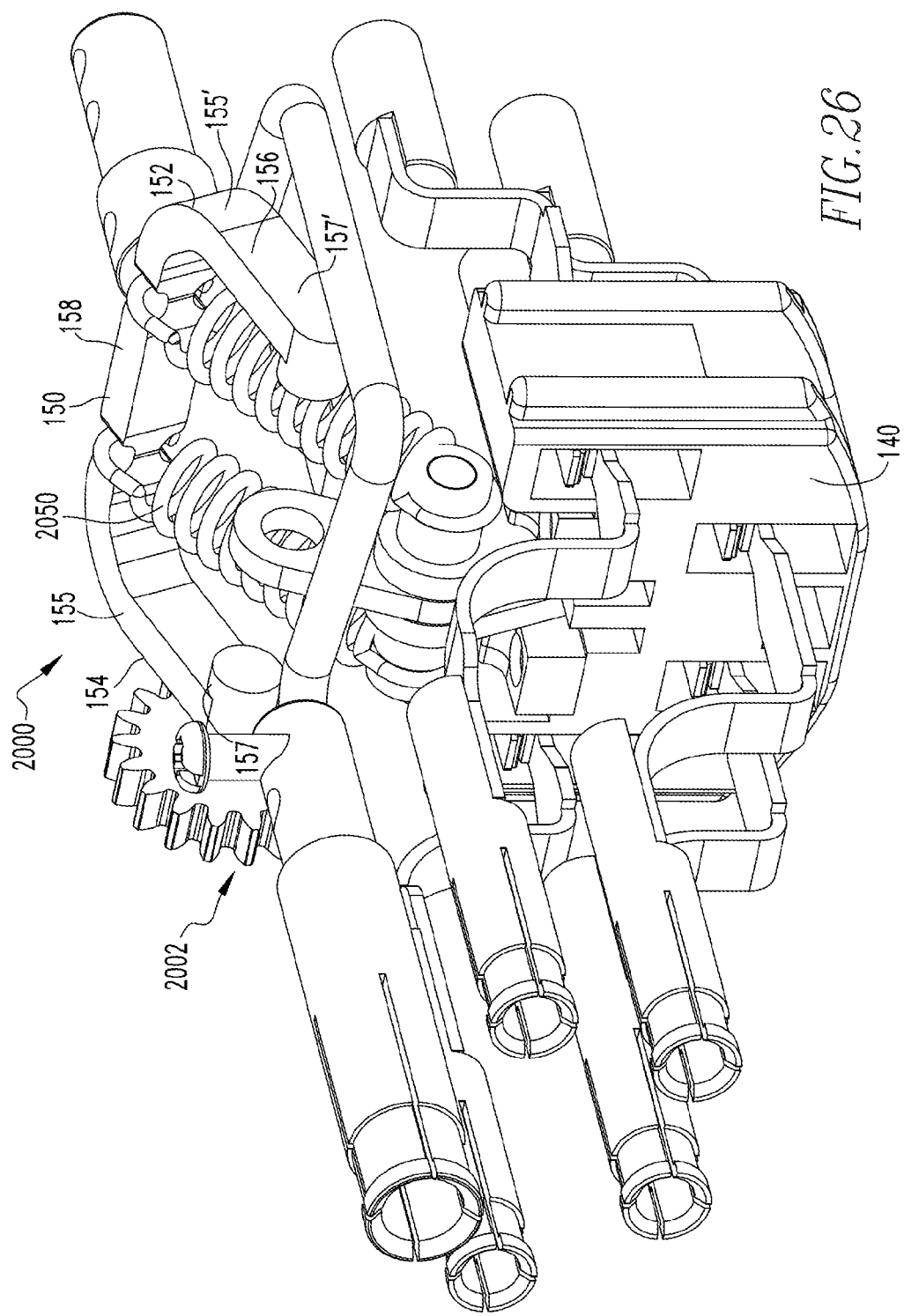
FIG. 26 is an isometric view of a toggle operating mechanism in a second configuration.

In an exemplary embodiment, the contact assembly 120 also includes an elongated handle member 150. As show in FIGS. 25-26, the contact assembly handle member 150, or "handle member 150," is a U-shaped body 152 having a first and second tine 154, 156 and a bight 158 that extends laterally across the contact assembly frame assembly 140. For the purpose of discussing the toggle operating mechanism 2000, the handle member 150 is considered to be a single elongated member corresponding to a tine 154. That is, as used herein, the handle tine 154 is identified as the elongated "handle link 154" which has a first end 155 and a second end 157. Second tine 156 has also has a first end 155' and a second end 157'.

In an exemplary embodiment, shown in schematic FIGS. 27-29, the toggle linkage 2002 includes the upper link 2020, the lower link 2030, and the handle link 154. The handle link second end 157 is rotatably coupled, or rotatably directly coupled, to the housing 1800. The upper link first end 2022 is rotatably coupled, or rotatably directly coupled, to the housing 1800. The upper link second end 2024 is rotatably coupled to the lower link first end 2032 forming the knee joint 2010, as discussed above. Further, the lower link second end 2034 is rotatably coupled, or rotatably directly coupled, to the contact assembly slider member(s) 142. In this embodiment, the toggle line 2006 generally corresponds to, i.e., is aligned with (or parallel to) the longitudinal axis of the upper link 2020. The handle link 154 moves between a first position, wherein the toggle linkage 2002 is in the first configuration, and a second position, wherein the toggle linkage 2002 is in the second configuration.

Further, in an exemplary embodiment, the toggle linkage 2002 includes an elongated spring 2050. The toggle linkage spring 2050 includes a first end 2052 and a second end 2054. In this embodiment, the toggle linkage line of action 2004 extends between the toggle linkage spring first end 2052 and the toggle linkage spring second end 2054. Further, the toggle linkage spring first end 2052 is coupled, directly coupled, rotatably coupled, or fixed to the handle link first end 155. The toggle linkage spring second end 2054 is coupled, directly coupled, rotatably coupled, or fixed to the knee joint 2010. In this configuration, the toggle operating mechanism 2000 is structured to move the contact assembly 120 into both the first and second positions by a snap-action and solves the problems stated above.

Figure 32:
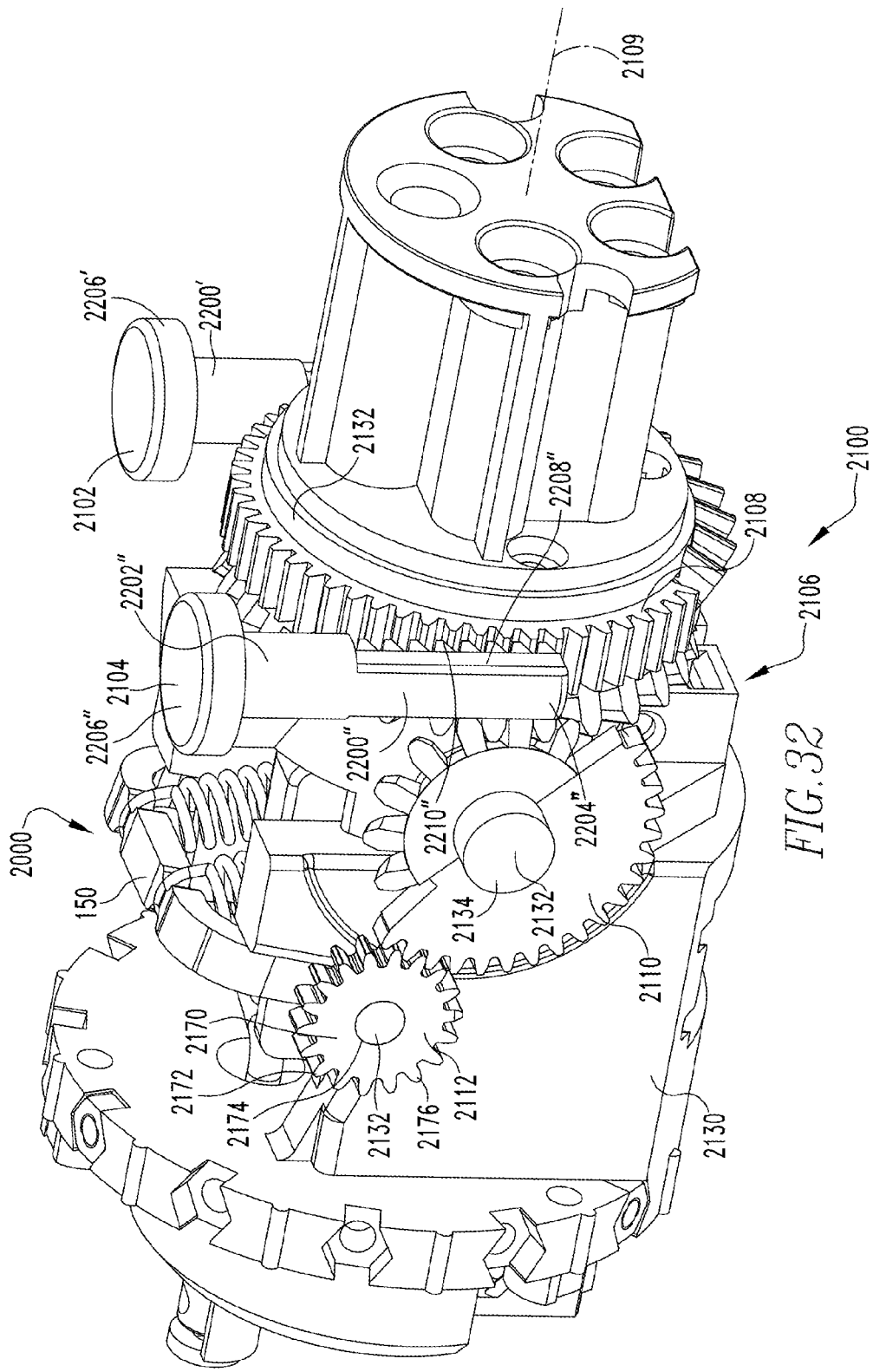
FIG. 32 is an isometric view of an actuating assembly.
Figure 33:
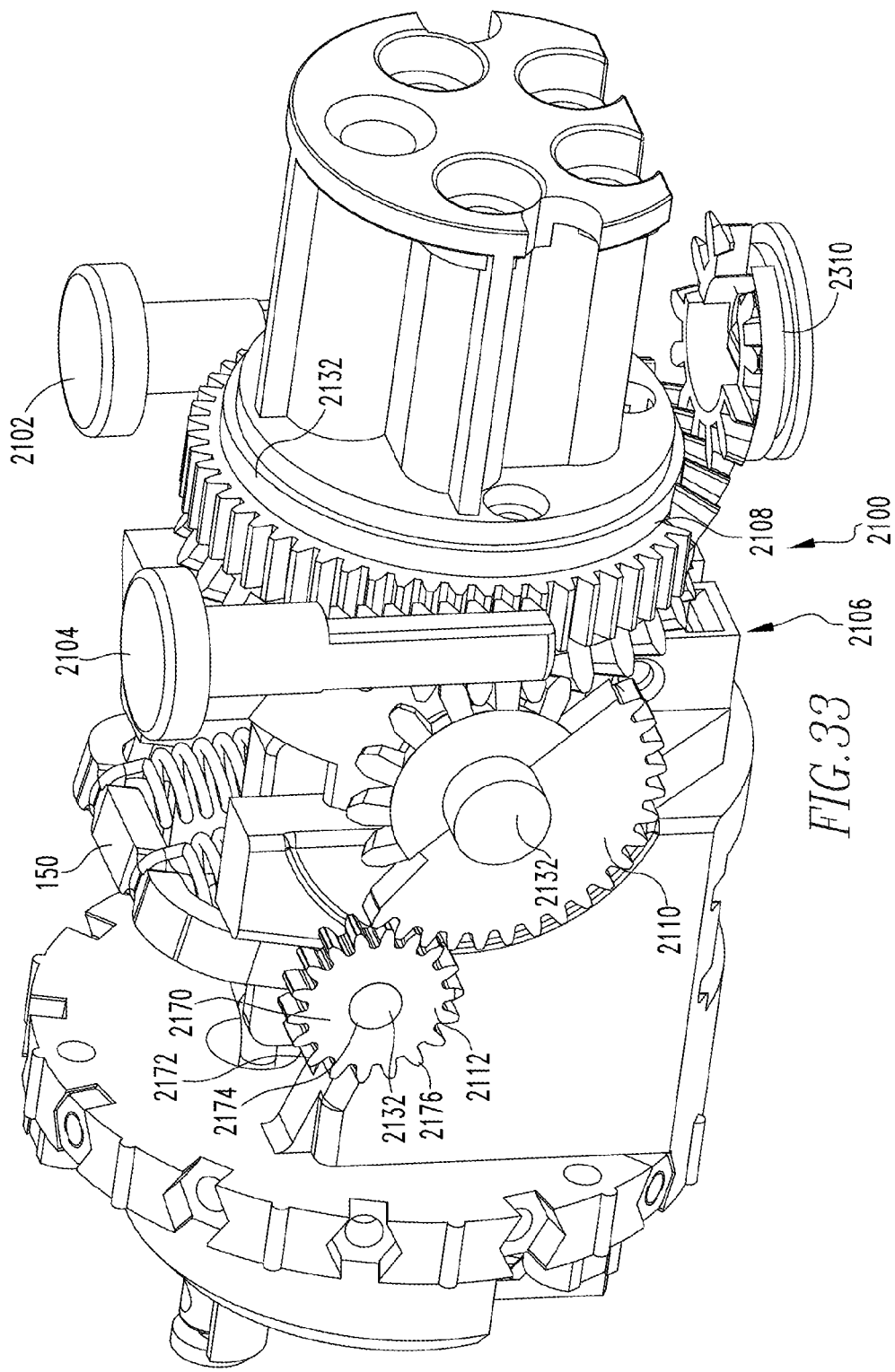
FIG. 33 is another isometric view of an actuating assembly.

Further, the contact assembly 120, in an exemplary embodiment as shown in FIGS. 30-33, includes an actuating assembly 2100 structured to move the toggle operating mechanism 2000 between the first and second positions. That is, the actuating assembly 2100 moves between a first configuration, wherein the contact assembly 120 is in its first position, and a second configuration, wherein the contact assembly 120 is in its second position. Further, as described below, when the actuating assembly 2100 is in the first configuration, the elements thereof, with the exceptions noted below, are in their first positions/configurations as described below, and, when the assembly 2100 is in the second configuration, the elements thereof, with the exceptions noted below, are in their second positions/configurations as described below. As shown, one embodiment of the actuating assembly 2100 includes a first (open/off) push button 2102, a second (close/on) push button 2104, and a number of gears 2106 which, as shown in an exemplary embodiment includes a first gear 2108, a second gear 2110 and a third gear 2112. Further, in this embodiment, the contact assembly 120 includes a carrier housing 2130. The carrier housing 2130 is structured to, and does, generally enclose the contact assembly frame assembly 140 and the toggle linkage 2002. As shown in FIGS. 32-33, the carrier housing 2130 also provide mountings 2132 suitable for the number of gears 2106. The carrier housing 2130 is also coupled, directly coupled, removably coupled or fixed to the housing 1800.

Figure 34:
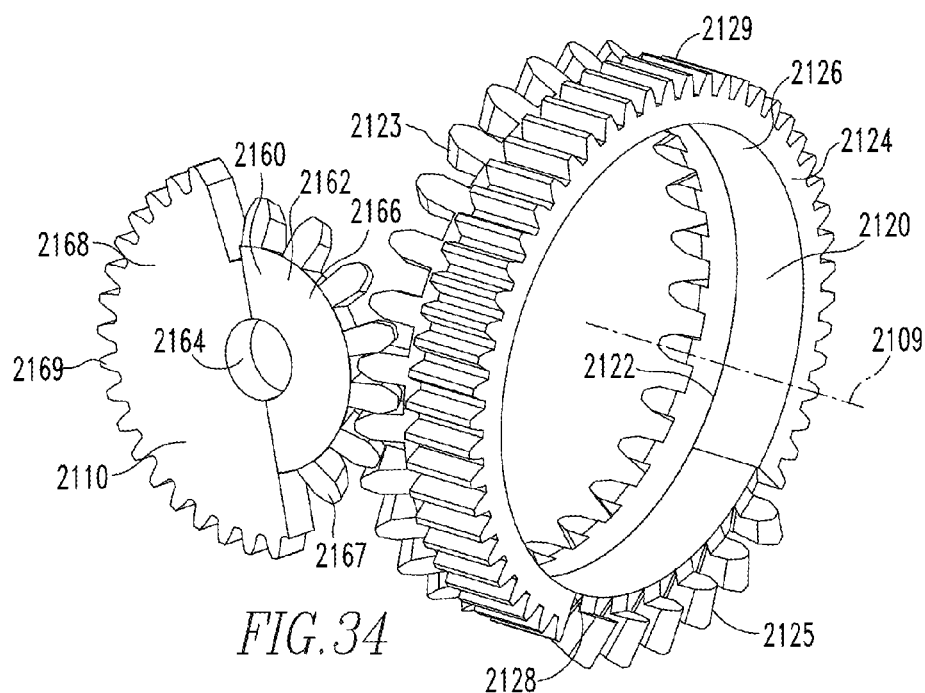
FIG. 34 is a detail isometric view of selected actuating assembly gears.
Figure 35:
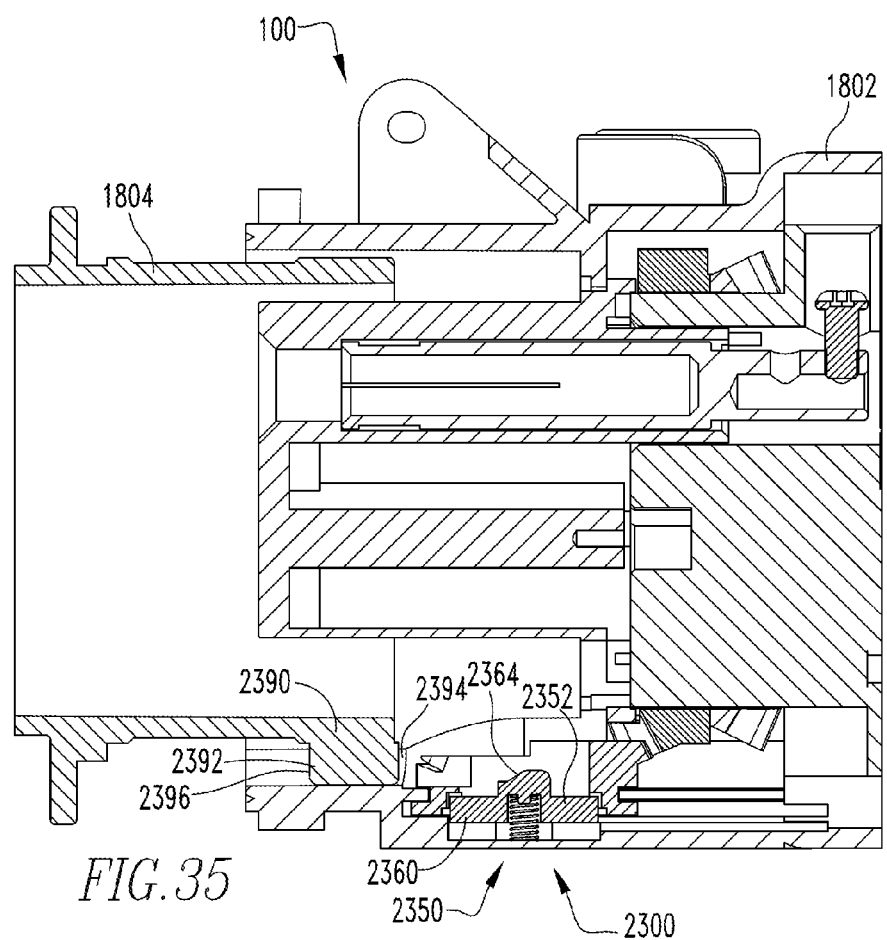
FIG. 35 is a cross-sectional side view of an interlock assembly in a transition position.
Figure 36:
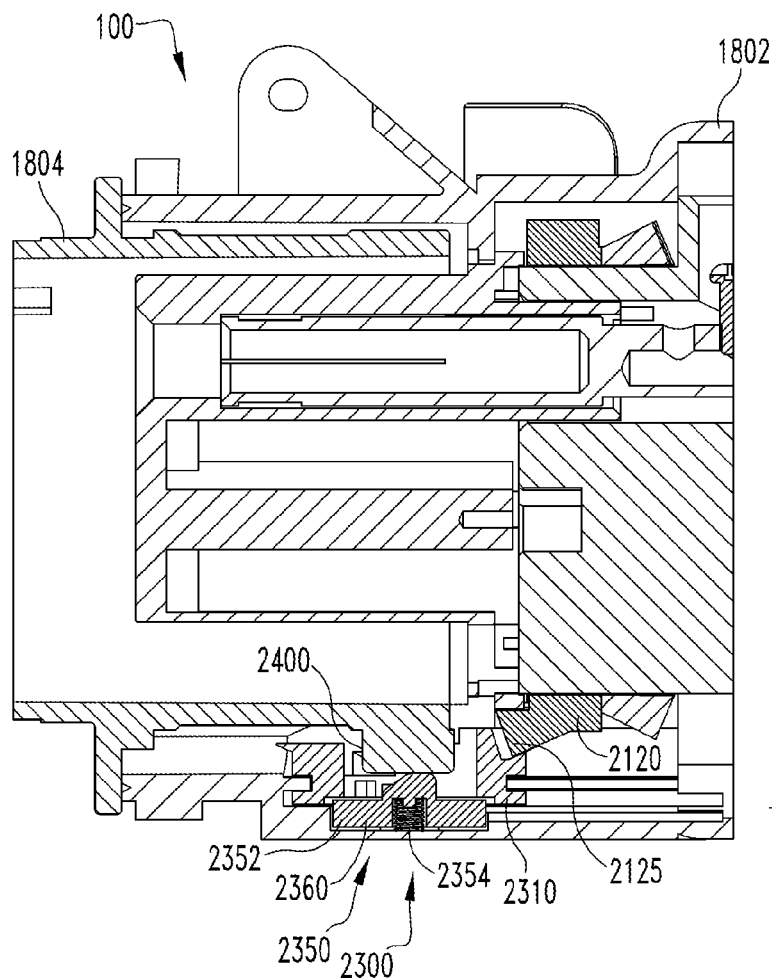
FIG. 36 is a cross-sectional side view of an interlock assembly in a second position.

In an exemplary embodiment, the actuating assembly first gear 2108 is a combination gear. As used herein, a "combination gear" is a gear that includes a plurality of different sets of teeth. As shown in FIG. 34, actuating assembly first gear 2108 includes a generally toroid body 2120 having a first axial side 2122, a second axial side 2124, a radial inner side 2126, and a radial outer side 2128. As used herein, a "radial side/surface" for a circular or cylindrical body is a side/surface that extends about, or encircles, the center thereof or a height line passing through the center thereof. As used herein, an "axial side/surface" for a circular or cylindrical body is a side that extends in a plane extending generally perpendicular to a height line passing through the center. That is, generally, for a cylindrical soup can, the "radial side/surface" is the generally circular sidewall and the "axial side(s)/surface(s)" are the top and bottom of the soup can.

The actuating assembly first gear first axial side 2122 includes bevel gear teeth 2123 which, in an exemplary embodiment, are angled outwardly from the center of the actuating assembly first gear body 2120. The actuating assembly first gear outer side 2128 includes spur gear teeth 2129. In an exemplary embodiment which includes an interlock assembly 2300, discussed below, the actuating assembly first gear second axial side 2124 also includes bevel gear teeth 2125. The various teeth 2123, 2125, 2129 extend over one of an arc, or, over the circumference of the actuating assembly first gear body 2120. The actuating assembly first gear inner side 2126 is generally smooth.

The actuating assembly first gear 2108 is rotatably coupled to the carrier housing 2130 and generally extends about, i.e., encircling, the longitudinal axis of the housing 1800. The carrier housing 2130, in an exemplary embodiment, includes a generally circular channel (not shown) that is a mounting 2132 for the actuating assembly first gear 2108. Thus, the actuating assembly first gear 2108 has an axis of rotation 2109 that is generally aligned with, or parallel to, the longitudinal axis of the housing 1800.

The actuating assembly second gear 2110 is, in an exemplary embodiment, also a combination gear. That is, the actuating assembly second gear 2110 includes a generally circular toroidal body 2160 having an outer radial side 2162 and an inner radial side 2164. The actuating assembly second gear inner side 2164 defines a generally circular mounting coupling. The actuating assembly second gear outer radial side 2162 includes a first portion 2166 and a second portion 2168. In an exemplary embodiment, each of the actuating assembly second gear outer radial side first portion 2166 and the actuating assembly second gear outer radial side second portion 2168 extend about 180° over the actuating assembly second gear outer radial side 2162. The actuating assembly second gear outer radial side first portion 2166 includes a number of bevel gear teeth 2167, hereinafter "actuating assembly second gear bevel gear teeth 2167," that correspond to the actuating assembly first gear first axial side bevel gear teeth 2123. The actuating assembly second gear outer radial side second portion 2168 includes a number of spur gear teeth 2169, hereinafter "actuating assembly second spur gear teeth 2169."

The actuating assembly second gear 2110 is rotatably coupled to a lateral side of the carrier housing 2130. That is, the carrier housing 2130 includes a first axle lug 2134 that corresponds to the opening defined by actuating assembly second gear inner side 2164. The carrier housing first axle lug 2134 is positioned so that, when the actuating assembly second gear 2110 is rotatably coupled thereto, the actuating assembly second gear bevel gear teeth 2167 operatively engage, or are operatively engaged by, the actuating assembly first gear first axial side bevel gear teeth 2123.

As shown in FIGS. 32-33, the actuating assembly third gear 2112, in an exemplary embodiment, is a spur gear. That is, the actuating assembly third gear 2112 includes a generally circular toroidal body 2170 having an outer radial side 2172 and an inner radial side 2174. The actuating assembly second gear inner side 2174 defines a generally circular mounting coupling. The actuating assembly second gear outer radial side 2172 includes a number of spur gear teeth 2176. The actuating assembly second gear body radial side spur gear teeth 2176 are structured to operatively engage or be operatively engaged by, the actuating assembly second gear actuating assembly second spur gear teeth 2169. The actuating assembly third gear 2112 is further structured to be, and is, coupled, directly coupled, or fixed to the handle member 150 and, in an exemplary embodiment, to the handle link 154. Further, in an exemplary embodiment, the actuating assembly third gear 2112 is fixed to the handle link 154. In this configuration, movement of the actuating assembly third gear 2112 is transferred to the handle link 154. That is, the actuating assembly third gear 2112 is operatively coupled the handle link 154.

In an exemplary embodiment and as noted above, the actuating assembly first and second push buttons 2102, 2104 are substantially similar and only the second push button 2102 will be described. Thereafter, any description of the first push button 2104 will use the same reference numbers followed by a single prime (') indication. The second push button 2104 includes an elongated body 2200" having a first end 2202" and a second end 2204". As shown in FIG. 32, the first push button body first end 2202", in an exemplary embodiment, includes an enlarged portion 2206', i.e., a portion with a cross-section that is larger than the other portions of the first push button body 2202'. The first push button body second end 2204' includes a rack 2208'. The first push button body rack 2208' includes a number of teeth 2210' that are structured to operatively engage, or be engaged by, the actuating assembly first gear 2108 and, in an exemplary embodiment, the actuating assembly first gear outer side spur gear teeth 2129.

The housing 1800 includes two push button openings 1810, 1812 sized to correspond to the first and second push button bodies 2200', 2200". That is, the two push button openings 1810, 1812 have a cross-sectional size and shape that generally corresponds to the first and second push button bodies 2200', 2200". The two push button openings 1810, 1812 are positioned on the housing 1800 so that, when the actuating assembly 2100 is installed in the housing 1800, the first and second push button bodies 2200', 2200" are disposed adjacent to, and operatively engage, generally opposing sides of the actuating assembly first gear 2108. That is, the first and second push button body teeth 2210', 2210" operatively engage opposing sides of the actuating assembly first gear 2108.

The first and second push buttons 2102, 2104 are collectively structured to move between a first configuration, wherein each conductor member 126 is in a first position and a second configuration, wherein each conductor member 126 is in a second position. Individually, the first and second push buttons 2102, 2104 are structured to move between an extended position, wherein one of the first and second push button bodies 2200', 2200" is extended relative to the housing 1800, and, a second position wherein one of the first and second push button bodies 2200', 2200" is retracted relative to the housing 1800. It is understood that, in an exemplary embodiment, the positions of the first and second push button bodies 2200', 2200" are opposite each other. That is, when the first push button body 2200' is in the first position, the second push button body 2200" is in the second position, and, when the first push button body 2200' is in the second position, the second push button body 2200" is in the first position.

Thus, as used herein, when the first and second push buttons 2102, 2104 are in the "first configuration," the first push button 2102, i.e., the first push button body 2200', is in the retracted, second position and the second push button 2104, i.e., second push button body 2200", is in the extended, first position. That is, colloquially, the second push button body 2200" is sticking up, and, the first push button body 2200' is pushed down. When the first and second push buttons 2102, 2104 are in the "first configuration," each conductor member 126 is in the first (open) position. Conversely, as used herein, when the first and second push buttons 2102, 2104 are in the "second configuration," the first push button 2102, i.e., the first push button body 2200', is in extended, first position, and, the second push button 2104, i.e., second push button body 2200", is in retracted, second position. That is, colloquially, the second push button body 2200" is pushed down and the first push button body 2200' is sticking up. When the first and second push buttons 2102, 2104 are in the "second configuration," each conductor member 126 is in the second (closed) position.

In this configuration, the actuating assembly 2100 operates as follows. Assuming the contact assembly 120 is in the first configuration, the toggle linkage 2002 is in the first configuration, the handle link 154 is in its first position, and the first and second push buttons 2102, 2104 are in first configuration. Thus, the second push button 2104 is sticking up. When the second push button 2104 is pushed down to the second position, i.e., toward the housing 1800, the second push button body 2200" moves into/toward the housing 1800. As stated above, the second push button body rack 2208" operatively engages the actuating assembly first gear 2108 causing the actuating assembly first gear 2108 to rotate. Rotation of the actuating assembly first gear 2108 has two effects; first, the actuating assembly first gear 2108 operatively engages the first push button 2102 causing the first push button body 2200' to move to the first position. Second, the actuating assembly first gear first axial side bevel gear teeth 2123 operatively engage the actuating assembly second gear bevel gear teeth 2167; this causes the actuating assembly second gear 2110 to rotate. As noted above, the actuating assembly second spur gear teeth 2169 operatively engage the actuating assembly third gear 2112; thus, rotation of the actuating assembly second gear 2110 causes the actuating assembly third gear 2112 to rotate. Further, as stated above, the actuating assembly third gear 2112 is, in an exemplary embodiment, fixed to the handle link 154. Thus, rotation of the actuating assembly third gear 2112 causes the handle link 154 to move from the first position to its second position. Further, as noted above, when the handle link 154 moves from the first position to its second position, the toggle linkage 2002 moves from its first configuration to its second configuration. Further, as stated above, when the toggle linkage 2002 moves from its first configuration to its second configuration, the conductor members 126 move to their second positions. Moreover, as stated above, the toggle operating mechanism 2000 is a snap-action mechanism that is structured to open and close the contact assembly 120 by a snap-action. Thus, when the second push button 2104 is actuated, i.e., pushed down, the contact assembly 120 moves into the second position by a snap-action.

At this point, the elements and assemblies are in the second configuration/positions, with the exception of the first push button 2102, i.e., the first push button body 2200', which is in its first position; that is, the first push button 2102 is sticking up. Hereinafter, it is understood that the first push button 2102, i.e., the first push button body 2200', is in its "first" position when the other elements identified above are in their "second" position/configuration and vice-versa; this is an exception to the general convention that elements are in the same position/configuration at the same time. When the first push button 2102 is moved to the second position, i.e., toward the housing 1800, the first push button body 2200' moves into/toward the housing 1800. As stated above, the first push button body rack 2208' operatively engages the actuating assembly first gear 2108 causing the actuating assembly first gear 2108 to rotate. Rotation of the actuating assembly first gear 2108 has two effects; first, the actuating assembly first gear 2108 operatively engages the second push button 2104 causing the second push button body 2200" to move to the first position. Second, the actuating assembly first gear first axial side bevel gear teeth 2123 operatively engage the actuating assembly second gear bevel gear teeth 2167; this causes the actuating assembly second gear 2110 to rotate. As noted above, the actuating assembly second spur gear teeth 2169 operatively engage the actuating assembly third gear 2112; thus, rotation of the actuating assembly second gear 2110 causes the actuating assembly third gear 2112 to rotate. Further, as stated above, the actuating assembly third gear 2112 is, in an exemplary embodiment, fixed to the handle link 154. Thus, rotation of the actuating assembly third gear 2112 causes the handle link 154 to move from the second position to its first position. Further, as noted above, when the handle link 154 moves from the second position to its first position, the toggle linkage 2002 moves from its second configuration to its first configuration. Further, as stated above, when the toggle linkage 2002 moves from its second configuration to its first configuration, the conductor members 126 move to their first positions. Moreover, as stated above, the toggle operating mechanism 2000 is a snap-action mechanism that is structured to open and close the contact assembly 120 by a snap-action. Thus, when the first push button 2102 is actuated, i.e., pushed down, the contact assembly 120 moves into the first positions by a snap-action.

Further, as noted above and as shown in FIGS. 24, 30, 33, 35-37, the power connector 100 includes an interlock, hereinafter identified as the interlock assembly 2300, that prevents engagement and disengagement of the pins 164, 166,168 and the sleeves 114,116,118 when the contact assembly 120 is in the second position. That is, the interlock assembly 2300 is structured to, and does, prevent the first and second housings 1802, 1804 from being coupled or decoupled when the contact assembly 120 is in the second position. It is understood that elements of the interlock assembly 2300 are disposed on each of the first and second housings 1802, 1804 and cooperate with each other. Further, as described above, it is understood that the contact assembly 120 may be disposed in either of the first and second housings 1802, 1804 and that the elements of the interlock assembly 2300 that are coupled to the elements of contact assembly 120, or in an exemplary embodiment the toggle operating mechanism 2000, are in the same housing 1800 as the contact assembly 120. In the following exemplary embodiment, the contact assembly 120 is shown to be in the first housing 1802. Thus, it is understood that if the contact assembly 120 were in the second housing 1804, the elements of the interlock assembly 2300 that are described below as being in the first housing 1802 would, instead, be in the second housing 1804.

Generally, the first and second housings 1802, 1804 move between a separated, first configuration (FIG. 24), wherein the first and second housings 1802, 1804 are separated, and a coupled, second configuration (FIG. 36), wherein the first and second housings 1802, 1804 are coupled or directly coupled. Further, the first and second housings 1802, 1804 move between a first transition configuration (FIG. 35), wherein the power connector first housing 1802 and the power connector second housing 1804 are moving from the first configuration to the second configuration, and a second transition configuration, wherein the power connector first housing 1802 and the power connector second housing 1804 move from the second configuration to the first configuration. That is, generally, the "first transition configuration" is when the first and second housings 1802, 1804 are being coupled together, and, the "second transition configuration" is when the first and second housings 1802, 1804 are being separated.

The interlock assembly 2300 includes elements that are movable so as to be in an "obstructing position" relative to another element. That is, as set forth below, elements of the interlock assembly 2300 move and therefore have a "path of travel" (or a "path"). As used herein, a first element is in an "obstructing position" relative to a second element when the first element is disposed in the path of a second element. Moreover, the interlock assembly 2300 is structured to, and does, maintain the conductor members 126, as well as the other assemblies identified above, in the first position (or configuration) when the first and second housings 1802, 1804 are in the separated, first configuration. Further, the interlock assembly 2300 is structured to only allow the conductor members 126, as well as the other assemblies identified above, to move to their second position (or configuration) when the first and second housings 1802, 1804 are in the coupled, second configuration.

As described more fully below, the interlock assembly locking member 2310 is movably coupled, and in an exemplary embodiment rotatably coupled, to the first housing 1802. The interlock assembly locking member 2310 is movable between a first position, wherein the interlock assembly locking member 2310 generally maintains the various elements and assemblies identified above in the first position/configuration, and a second position, wherein the various elements and assemblies identified above are structured to be moved into the second position/configuration. Thus, when the first and second housings 1802, 1804 are in the separated, first configuration, the interlock assembly 2300 is structured to maintain the conductor members 126, as well as the other assemblies identified above, in the first position (or configuration). When the first and second housings 1802, 1804 are in the coupled, second configuration, the interlock assembly 2300 is structured to allow the conductor members 126, as well as the other assemblies identified above, to be moved to the second position (or configuration).

Further, the interlock assembly 2300 is structured to, and does, maintain the first and second housings 1802, 1804 in the second configuration when the conductor members 126, as well as the other assemblies identified above, are in the second position (or configuration). The conductor members 126, as well as the other assemblies identified above, must be moved to their first position (or configuration) for the first and second housings 1802, 1804 to be separated, i.e., returned to the separated, first position. Thus, generally, the interlock assembly 2300 is structured to, and does, maintain the conductor members 126, as well as the other assemblies identified above, in their first position (or configuration) when the first and second housings 1802, 1804 are separated, and, the interlock assembly 2300 is structured to, and does, maintain the first and second housings 1802, 1804 in the coupled, second configuration when the conductor members 126, as well as the other assemblies identified above, are in their second position (or configuration).

Figure 37:
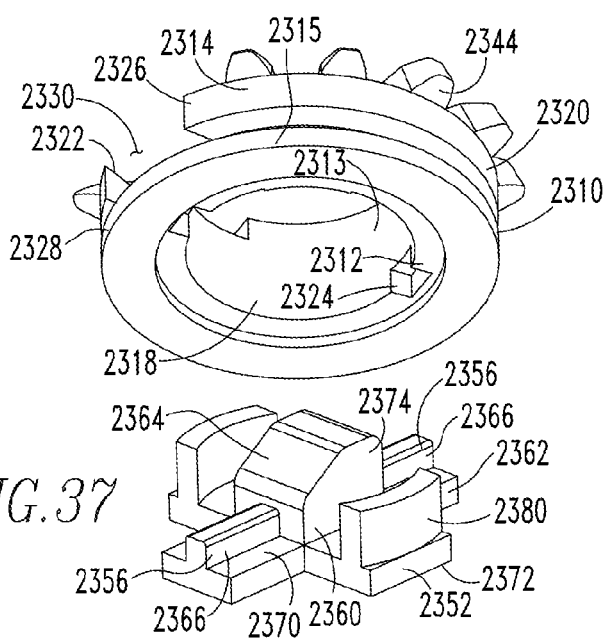
FIG. 37 is an isometric view of an interlock assembly locking member and an interlock assembly latching member.

Further, if the conductor members 126, as well as the other assemblies identified above, are in the second position (or configuration) while the first and second housings 1802, 1804 are in the separated, first configuration, the interlock assembly 2300 is structured to, and does, prevent the first and second housings 1802, 1804 from being coupled, i.e., moved in to the second configuration. In an exemplary embodiment, the interlock assembly 2300 includes a locking member 2310, an interlock assembly latching member assembly 2350, and an interlock assembly actuator member 2390. As shown in FIG. 37, the interlock assembly locking member 2310 includes a first locking surface 2312, a second locking surface 2313, and a third locking surface 2314. In an exemplary embodiment, the interlock assembly locking member 2310 includes a torus-shaped body 2315 having a first axial surface 2316, a radial inner surface 2318, a radial outer surface 2320, and a second axial surface 2322. The interlock assembly locking member body first axial surface 2316 defines a number of cavities 2324, hereinafter "interlock assembly locking member body number of cavities" 2324. As shown, and in an exemplary embodiment, the interlock assembly locking member body number of cavities 2324 includes two generally opposed interlock assembly locking member body number of cavities 2324, i.e., cavities disposed about 180° apart. In an exemplary embodiment, the interlock assembly locking member first locking surface 2312 is disposed on the interlock assembly locking member body number of cavities 2324. As used herein, and when used in relation to a locking surface or latching surface, "disposed on" means that the surface is part of, or defines part of, the identified element. Thus, in this exemplary embodiment, the interlock assembly locking member first locking surface 2312 defines part of the interlock assembly locking member body number of cavities 2324.

In an exemplary embodiment, the interlock assembly locking member body inner surface 2318 defines the interlock assembly locking member second locking surface

2313. Stated alternately, the interlock assembly locking member second locking surface 2313 is disposed on the interlock assembly locking member body inner surface 2318. The interlock assembly locking member body outer surface 2320 defines the interlock assembly locking member third locking surface 2314. Stated alternately, the interlock assembly locking member third locking surface 2314 is disposed on the interlock assembly locking member body outer surface 2320.

In an exemplary embodiment, the interlock assembly locking member body 2315 also includes an upper portion 2326 and a lower portion 2328. As shown, the interlock assembly locking member body upper portion 2326 defines an elongated, radial passage 2330 between the interlock assembly locking member body outer surface 2320 and the interlock assembly locking member body inner surface 2318; hereinafter "the interlock assembly locking member body passage" 2330. Further, the interlock assembly locking member body upper portion 2326 defines the interlock assembly locking member second locking surface 2313 and the interlock assembly locking member third locking surface 2314. The interlock assembly locking member body lower portion 2328 is, in an exemplary embodiment, a complete torus.

Further, the interlock assembly locking member body second axial surface 2322, and/or the interlock assembly locking member body radial outer surface 2320, includes a number of gear teeth 2344. As shown, and in an exemplary embodiment, the interlock assembly locking member body second axial surface gear teeth 2344, hereinafter "interlock assembly locking member body gear teeth" 2344, are bevel gear teeth. As noted above, in an embodiment with an interlock assembly 2300, the actuating assembly first gear second axial side 2124 also includes bevel gear teeth 2125. The interlock assembly locking member body gear teeth 2344 correspond to, and are structured to operatively engage, or be operatively engaged by, the actuating assembly first gear second axial side bevel gear teeth 2125.

The interlock assembly locking member 2310 is movably coupled, and in an exemplary embodiment rotatably coupled, to the first housing 1802. The interlock assembly locking member 2310 is movable between a first position wherein the interlock assembly locking member first locking surface 2312 is in a first position, the interlock assembly locking member second locking surface 2313 is in a first position and the interlock assembly locking member third locking surface 2314 is in a first position, and, a second position wherein the interlock assembly locking member first locking surface 2312 is in a second position, and the interlock assembly locking member second locking surface 2313 is in a second position, the interlock assembly locking member third locking surface 2314 is in a second position. The interactions of the interlock assembly locking member 2310 with the interlock assembly latching member assembly 2350 and the interlock assembly actuator member 2390 are described below.

The interlock assembly latching member assembly 2350 includes an interlock assembly latching member 2352, hereinafter the "interlock assembly latching member" 2352, and a biasing device 2354. The interlock assembly latching member 2352 includes a first latching surface 2356. In an exemplary embodiment, the interlock assembly latching member 2352 includes a body 2360 with a base member 2362, an angled engagement surface 2364 and a number of protrusions 2366. The interlock assembly latching member base member 2362 is, in an exemplary embodiment, a generally planar member including an upper surface 2370 and a lower surface 2372. The interlock assembly latching member angled engagement surface 2364 is disposed on a lug 2374 that protrudes from the interlock assembly latching member base member upper surface 2370. Similarly, the interlock assembly latching member number of protrusions 2366 also protrude from the interlock assembly latching member base member upper surface 2370. Each of the interlock assembly latching number of protrusions 2366 is sized and shaped to correspond to one of the interlock assembly locking member body number of cavities 2324. Thus, in an exemplary embodiment, there are two elongated interlock assembly latching protrusions 2366 wherein the longitudinal axis of the interlock assembly latching protrusions 2366 are generally aligned. The interlock assembly latching member first latching surface 2356 is disposed on the interlock assembly latching number of protrusions 2366. Further, in an exemplary embodiment, the interlock assembly latching member body 2360 includes a number of guides or, as used herein, "bumpers" 2380. The interlock assembly latching member body bumpers 2380 protrude from the interlock assembly latching member base member upper surface 2370 and each has a lower surface 2372 shaped to generally correspond to the interlock assembly locking member body inner surface 2318.

The interlock assembly latching member 2352 is movably coupled to the first housing 1802. The interlock assembly latching member 2352 is movable between a first position, wherein the interlock assembly latching member first latching surface 2356 is in a first position, and a second position, wherein the interlock assembly latching member first latching surface 2356 is in a second position. In an exemplary embodiment, the interlock assembly latching member assembly biasing device 2354 is a spring 2378 disposed between the interlock assembly latching member 2352 and the power connector first housing 1802. The interlock assembly latching member assembly biasing device 2354 biases the interlock assembly latching member 2352 to the first position. The interactions of the interlock assembly latching member assembly 2350 with the interlock assembly locking member 2310 and the interlock assembly actuator member 2390 are described below.

The interlock assembly actuator member 2390 (FIGS. 24, 35, 36), in an exemplary embodiment, is a body 2392 that is coupled, directly coupled, or fixed to the second housing 1804. Further, in an exemplary embodiment, the interlock assembly actuator member 2390 is unitary with the second housing 1804. That is, as used herein, "unitary" elements are also said to be coupled, directly coupled, or fixed to each other. In an exemplary embodiment, the interlock assembly actuator member 2390 is a protrusion extending generally radially from a generally circular second housing 1804. The leading edge 2394 of the interlock assembly actuator member 2390 is tapered. As used herein, a "leading edge" or a "trailing edge" is a surface rather than an intersection of a number of surfaces. That is, as used herein, the "interlock assembly actuator member leading edge 2394" is that surface that is closest to the first housing 1802 as the first and second housing 1802, 1804 move from the first position to the second position. The trailing edge 2396 of the interlock assembly actuator member 2390 is a generally axial surface relative to the second housing 1804. The interlock assembly actuator member 2390 includes a second latching surface 2400; in an exemplary embodiment, the interlock assembly actuator member trailing edge 2396 is the interlock assembly actuator member second latching surface 2400.

The interlock assembly actuator member 2390 is movable between a first position, wherein the interlock assembly actuator member 2390 is spaced from interlock assembly latching member 2352, and a second position, wherein the interlock assembly actuator member 2390 operatively engages the interlock assembly latching member 2352. The interlock assembly actuator member 2390 first and second positions correspond to the first and second housings 1802, 1804 first and second positions. Further, the interlock assembly actuator member 2390 also moves between a first transition position, wherein the interlock assembly actuator member 2390 moves from the first position to the second position and wherein the interlock assembly actuator member 2390 operatively engages the interlock assembly latching member 2352 and moves the interlock assembly latching member 2352 from its first position to its second position, and, a second transition position, wherein the interlock assembly actuator member 2390 moves from its second position to its first position and wherein the interlock assembly actuator member 2390 disengages the interlock assembly latching member 2352 and moves the interlock assembly latching member 2352 from its second position to its first position. It is noted that the interlock assembly actuator member 2390 first transition position corresponds to the power connector first housing 1802 and the power connector second housing 1804 first transition configuration, and, the interlock assembly actuator member 2390 second transition position corresponds to the power connector first housing 1802 and the power connector second housing 1804 second transition configuration.

In an exemplary embodiment, the interlock assembly 2300 is assembled as follows. The interlock assembly locking member 2310 is rotatably coupled to the first housing 1802 with the interlock assembly locking member body first axial side 2316 disposed facing, and immediately adjacent, the interlock assembly latching member assembly 2350. The interlock assembly latching member 2352 is movably coupled to the first housing 1802 and transitions, i.e., moves without changing orientation, relative to the first housing 1802. Further, the actuating assembly first gear second axial side gear teeth 2125 are coupled to, and when moved operatively coupled to, the interlock assembly locking member body gear teeth 2344. As noted above, when the first and second push buttons 2102, 2104 are moved, the actuating assembly first gear 2108 rotates. Thus, the first and second push buttons 2102, 2104 are operatively coupled to the interlock assembly locking member 2310. It is understood that the motion of the actuating assembly first gear 2108 drives the motion of the interlock assembly 2300.

When the first and second housings 1802, 1804 are in the first configuration, i.e., separated, the contact assembly 120 is in the first configuration, the toggle linkage 2002 is in the first configuration, the handle link 154 is in its first position, and the first and second push buttons 2102, 2104 are in first configuration. Further, the interlock assembly 2300 is assembled so that when the first and second housings 1802, 1804 are in the first configuration, i.e., separated, the various elements of the interlock assembly 2300 are in their first positions or configurations. Thus, the locking member 2310 is in its first position with the interlock assembly locking member first locking surface 2312 is in a first position and the interlock assembly locking member second locking surface 2313 is in a first position. In an exemplary embodiment, when the interlock assembly locking member second locking surface 2313 is in a first position, the interlock assembly locking member body passage 2330 faces outwardly from the first housing 1802. That is, longitudinal axis of the interlock assembly locking member body passage 2330 is generally aligned with the path of travel of the second housing 1804 and the path of travel of the interlock assembly actuator member 2390. Thus, the interlock assembly actuator member 2390 is able to pass through the interlock assembly locking member body passage 2330.

Further, the interlock assembly latching member 2352 is in its first position (and is biased to that position by the interlock assembly latching member assembly biasing device 2354). When the interlock assembly latching member 2352 is in its first position, the interlock assembly latching member number of protrusions 2366 are disposed in the interlock assembly locking member body number of cavities 2324. Thus, the interlock assembly latching member first latching surface 2356 is disposed in an obstructing position relative to the interlock assembly locking member second locking surface 2313. In this configuration, the interlock assembly locking member body 2315 cannot rotate. If the interlock assembly locking member body 2315 cannot rotate, all elements operatively coupled thereto also cannot rotate; thus, the elements of the interlock assembly 2300 as well as the contact assembly 120 and the actuating assembly 2100 are in, and are maintained in, their respective first positions/configurations.

Further, at this point it is noted that, if the first and second housings 1802, 1804 are in the first configuration, i.e., separated, and the contact assembly 120 is in the second configuration, the interlock assembly 2300 is structured to, and does, prevent the first and second housings 1802, 1804 from being coupled, i.e., moved in to the second configuration. That is, if the second push button 2104 is pushed down to the second position while overcoming the lock of the interlock assembly locking member body 2315, (colloquially, if the conductor members 126 and other assemblies noted above, are forced into the closed, second position/configuration while the first and second housings 1802, 1804 are separated) the actuating assembly first gear 2108 rotates thereby moving the locking member 2310 to its second position with the interlock assembly locking member first locking surface 2312 in a second position, the interlock assembly locking member second locking surface 2313 is in a second position, and the interlock assembly locking member third locking surface 2314 disposed in a second position. That is, the interlock assembly locking member body passage 2330 is rotated so that it does not face the second housing 1804. Thus, in this position, the interlock assembly locking member third locking surface 2314 is disposed in an obstructing position relative to the interlock assembly actuator member 2390. When the interlock assembly actuator member 2390 cannot pass through the interlock assembly locking member body passage 2330, the first and second housings 1802, 1804 cannot be moved into their second configuration. That is, the interlock assembly 2300 prevents the coupling of the first and second housings 1802, 1804 when the contact assembly is in the second configuration.

The interlock assembly 2300 elements interact with each other as follows. Again, when the first and second housings 1802, 1804 are in the first configuration, i.e., separated, the contact assembly 120 is in the first configuration, the toggle linkage 2002 is in the first configuration, the handle link 154 is in its first position, and the first and second push buttons 2102, 2104 are in first configuration. Further, as noted above, the interlock assembly 2300 is assembled so that when the first and second housings 1802, 1804 are in the first configuration, i.e., separated, the various elements of the interlock assembly 2300 are in their first positions or configurations. Thus, as described above, the interlock assembly actuator member 2390 is able to pass through the interlock assembly locking member body passage 2330. Accordingly, when the interlock assembly actuator member 2390 is moving into the second position, i.e., when the interlock assembly actuator member 2390 is in the first transition position, the interlock assembly actuator member 2390 passes through the interlock assembly locking member body passage 2330 and the interlock assembly actuator member 2390 operatively engages the interlock assembly latching member 2352 and moves the interlock assembly latching member 2352 from its first position to its second position. That is, in an exemplary embodiment, the interlock assembly actuator member leading edge 2394 engages the interlock assembly latching member angled engagement surface 2364. This engagement causes the interlock assembly latching member 2352 to move to its second position. When the interlock assembly latching member 2352 is in its second position, the interlock assembly latching member number of protrusions 2366 are not disposed in the interlock assembly locking member body number of cavities 2324. Thus, the interlock assembly latching member first latching surface 2356 is not disposed in an obstructing position relative to the interlock assembly locking member second locking surface 2313. In this configuration, the interlock assembly locking member body 2315 can rotate. Moreover, when the interlock assembly actuator member 2390 completes the first transition position, the first and second housings 1802, 1804 are in their second configuration, i.e., the first and second housings 1802, 1804 are coupled.

At this point, the actuating assembly 2100 is moved from the first configuration to the second configuration. That is, as described above, the second push button 2104 is pushed down to the second position which, among other actions, causes the actuating assembly first gear 2108 to rotate. The actuating assembly first gear 2108 is operatively coupled to the interlock assembly locking member 2310 and causes the interlock assembly locking member 2310 to move to its second position wherein the interlock assembly locking member first locking surface 2312 is in a second position, the interlock assembly locking member second locking surface 2313 is in a second position, and the interlock assembly locking member third locking surface 2314 is in a second position. As noted above, in this position the interlock assembly locking member body passage 2330 is rotated so that it does not face the second housing 1804. Thus, in this position, the interlock assembly locking member second locking surface 2313 is disposed in an obstructing position relative to the interlock assembly actuator member 2390. That is, in an exemplary embodiment, the interlock assembly locking member second locking surface 2313 is disposed in an obstructing position relative to interlock assembly actuator member second latching surface 2400. Thus, the interlock assembly actuator member 2390, and therefore the second housing 1804, cannot be moved to the first position/configuration, i.e., separated, while the contact assembly 120 is in the second position.

When the first push button 2102 is moved to the second position, as described above, generally the reverse motions occur. That is, the actuating assembly first gear 2108 rotates and operatively engages the interlock assembly locking member 2310 and causes the interlock assembly locking member 2310 to move to its first position wherein the interlock assembly locking member first locking surface 2312 is in a first position, the interlock assembly locking member second locking surface 2313 is in a first position, and the interlock assembly locking member third locking surface 2314 is in a first position. When the interlock assembly locking member 2310 is in the first position, the interlock assembly latching member assembly biasing device 2354 biases the interlock assembly latching member 2352 to the first position as described above. Further, when the interlock assembly locking member 2310 is in the first position, the interlock assembly locking member second locking surface 2313 is in a first position and the interlock assembly locking member body passage 2330 faces outwardly from the first housing 1802. That is, the interlock assembly locking member second locking surface 2313 is no longer in an obstructing position relative to the interlock assembly actuator member 2390. Thus, the obstructing position relative to the interlock assembly actuator member 2390, as well as the second housing 1804 can be, and are, moved to their first position/configuration; that is, the first and second housings 1802, 1804 are separated. Thus, the interlock assembly 2300 solves the problems stated above.

Further, or alternately, the interlock assembly 2300 provides a configuration of elements wherein, when the interlock assembly actuator member is in the first position, the interlock assembly latching member is in the first position, and the interlock assembly locking member is in the first position. Further, when the interlock assembly latching member 2352 is in the first position the interlock assembly latching member first latching surface 2356 is disposed in an obstructing position relative to the interlock assembly locking member first locking surface, wherein the interlock assembly locking member 2310 is maintained in the first position. Further, when the interlock assembly locking member 2310 is in the first position, the interlock assembly locking member second locking surface 2313 is not in an obstructing position relative to the interlock assembly actuator member 2352. Further, when the interlock assembly latching member 2352 is in the second position, the interlock assembly latching member first latching surface 2356 is not disposed in an obstructing position relative to the interlock assembly locking member first locking surface 2312, wherein the interlock assembly locking member 2310 is movable to the second position. Further, when the interlock assembly locking member 2310 is in the second position, the interlock assembly locking member second locking surface 2313 is in an obstructing position relative to the interlock assembly actuator member second latching surface 2400, wherein the interlock assembly actuator member 2352 is maintained in the second position.

Further, when the interlock assembly actuator member 2390 moves between a first transition position, wherein the interlock assembly actuator member 2390 moves from its first position to its second position and wherein the interlock assembly actuator member 2390 operatively engages the interlock assembly latching member 2352 and moves the interlock assembly latching member 2352 from its first position to its second position, and, a second transition position, wherein the interlock assembly actuator 2390 member moves from its second position to its first position and wherein the interlock assembly actuator member 2352 disengages the interlock assembly latching member 2352 and moves the interlock assembly latching member from its second position to its first position, and, wherein the interlock assembly actuator member first transition position corresponds to the power connector first housing 1802 and the power connector second housing 1804 first transition configuration, and, the interlock assembly actuator member second transition position corresponds to the power connector first housing 1802 and the power connector second housing 1804 second transition configuration.

While specific embodiments of the disclosed concept have been described in detail, it will be appreciated by those skilled in the art that various modifications and alternatives to those details could be developed in light of the overall teachings of the disclosure. For example, while specific types of gear teeth are identified above, it is understood that any type of gear teeth may be used, so long as the identified gears operatively engage the elements identified. Accordingly, the particular arrangements disclosed are meant to be illustrative only and not limiting as to the scope of the disclosed concept which is to be given the full breadth of the claims appended and any and all equivalents thereof.

What is claimed is:

1. An electrical connection element for a power connector, said power connector comprising an electrical component, said electrical connection element comprising:
   a housing;
   a contact assembly enclosed by said housing;
   a toggle operating mechanism structured to open and close said contact assembly,
   wherein said contact assembly is structured to electrically connect and disconnect power while a number of first electrical mating members remain mechanically coupled to a number of second electrical mating members;
   said contact assembly electrically connected to said number of second electrical mating members;
   said contact assembly includes a number of line-side contacts, a number of load-side contacts, and a number of movable conductor members, each conductor member associated with one line-side contact and one load-side contact;
   each said conductor member movable between a first position, wherein said associated line-side contact and said associated load-side contact are not electrically connected, and a second position, wherein said associated line-side contact and said associated load-side contact are electrically connected;
   said toggle operating mechanism includes a toggle linkage, said toggle linkage defining a line of action and a toggle line;
   said toggle linkage operatively coupled to said conductor members and structured to move said conductor members between said first and second positions;
   said toggle linkage movable between a first configuration, wherein each said conductor member is in its first position, and a second configuration wherein, each said conductor member is in its second position; and
   wherein when said toggle linkage line of action is on a first side of said toggle line, said toggle linkage is biased toward said toggle linkage first configuration, when said toggle linkage line of action is on a second side of said toggle line, said toggle linkage is biased toward said toggle linkage second configuration, and when said toggle linkage line of action moves from one side of said toggle line in a direction to be aligned with said toggle line, said toggle linkage line of action continues to move in the same direction until said toggle linkage line of action is on the other side of said toggle line.

2. The electrical connection element of claim 1 wherein:
   said toggle linkage includes a knee joint having an axis of rotation; and
   said toggle line extending through said knee joint axis of rotation.

3. The electrical connection element of claim 1 wherein:
   said toggle linkage includes an elongated spring;
   said toggle linkage spring including a first end and a second end; and
   wherein said toggle linkage line of action extends between said toggle linkage spring first end and said toggle linkage spring second end.

4. The electrical connection element of claim 1 wherein:
   said toggle linkage includes an elongated handle link, an elongated upper link, an elongated lower link, and an elongated spring;
   said handle link including a first end and a second end;
   said upper link including a first end and a second end;
   said lower link including a first end and a second end;
   said toggle linkage spring including a first end and a second end;
   said handle link second end rotatably coupled to said housing;
   said upper link first end rotatably coupled to said housing;
   said upper link second end rotatably coupled to said lower link first end defining a knee joint;
   said lower link first end rotatably coupled to contact assembly conductor members;
   said toggle linkage spring first end coupled to said handle link first end;
   said toggle linkage spring second end coupled to said knee joint.

5. A power connector comprising:
   an electrical component having a number of first electrical mating members;
   an electrical connection element comprising:
      a housing including a number of second electrical mating members electrically connected to said number of first electrical mating members,
      a contact assembly enclosed by said housing and being electrically connected to said number of second electrical mating members;
      a toggle operating mechanism for opening and closing said contact assembly;
   wherein said contact assembly is structured to electrically connect and disconnect power while said number of first electrical mating members remain mechanically coupled to said number of second electrical mating members;
   said contact assembly includes a number of line-side contacts, a number of load-side contacts, and a number of movable conductor members, each conductor member associated with one line-side contact and one load-side contact;
   each said conductor member movable between a first position, wherein said associated line-side contact and said associated load-side contact are not electrically connected, and a second position, wherein said associated line-side contact and said associated load-side contact are electrically connected;
   said toggle operating mechanism including a toggle linkage, said toggle linkage defining a line of action and a toggle line;
   said toggle linkage operatively coupled to said movable conductor members and structured to move said movable conductor members between said first and second positions;
   said toggle linkage movable between a first configuration, wherein said conductor member is in its first position, and a second configuration wherein, said conductor member is in its second position; and
   wherein when said toggle linkage line of action is on a first side of said toggle line, said toggle linkage is biased toward said toggle linkage first configuration, when said toggle linkage line of action is on a second side of said toggle line, said toggle linkage is biased toward said toggle linkage second configuration, and when said toggle linkage line of action moves in a direction to a position aligned with said toggle line, said toggle linkage line of action continues to move in the same direction until said toggle linkage line of action is on one of said first side of said toggle line or said second side of said toggle line.

6. The power connector of claim 5 wherein:
said toggle linkage includes an elongated handle link, an elongated upper link, an elongated lower link, and an elongated spring;
said handle link including a first end and a second end;
said upper link including a first end and a second end;
said lower link including a first end and a second end;
said toggle linkage spring including a first end and a second end;
said handle link second end rotatably coupled to said housing;
said upper link first end rotatably coupled to said housing;
said upper link second end rotatably coupled to said lower link first end defining a knee joint;
said lower link first end rotatably coupled to contact assembly conductor members;
said toggle linkage spring first end coupled to said handle link first end;
said toggle linkage spring second end coupled to said knee joint.

7. An interlock assembly for a power connector, said power connector including a contact assembly, a first housing and a second housing, said contact assembly including a number of line-side contacts, a number of load-side contacts, and a number of movable conductor members, each conductor member associated with one line-side contact and one load-side contact, each said conductor member movable between a first position, wherein said associated line-side contact and said associated load-side contact are not electrically connected, and a second position, wherein said associated line-side contact and said associated load-side contact are electrically connected, said power connector first housing and said power connector second housing movable between a first configuration, wherein said power connector first housing and said power connector second housing are separated, and a second configuration, wherein said power connector first housing and said power connector second housing are coupled, said power connector first housing defining a partially enclosed space, said power connector second housing defining a partially enclosed space, said power connector first housing including an actuator assembly, said actuator assembly including a first gear, said actuator assembly first gear operatively coupled to said contact assembly, said first gear movable between a first position, wherein each said conductor member is in the first position, and a second position, wherein each said conductor member is in the second position, said interlock assembly comprising:
an interlock assembly locking member, said interlock assembly locking member including a first locking surface and a second locking surface, said interlock assembly locking member structured to be operatively coupled said movable actuator member;
said interlock assembly locking member movably coupled to said first housing, said interlock assembly locking member movable between a first position wherein said interlock assembly locking member first locking surface is in a first position and said interlock assembly locking member second locking surface is in a first position, and a second position wherein said interlock assembly locking member first locking surface is in a second position and said interlock assembly locking member second locking surface is in a second position;
an interlock assembly latching member assembly, said interlock assembly latching member assembly including an interlock assembly latching member;
said interlock assembly latching member including a first latching surface;
said interlock assembly latching member movably coupled to said first housing, said interlock assembly latching member movable between a first position, wherein said interlock assembly latching member first latching surface is in a first position, and a second position, wherein said interlock assembly latching member first latching surface is in a second position;
an interlock assembly actuator member, said interlock assembly actuator member coupled to said second housing, said interlock assembly actuator member including a second latching surface;
said interlock assembly actuator member movable between a first position, wherein said interlock assembly actuator member is spaced from said interlock assembly latching member, and a second position, wherein said interlock assembly actuator member operatively engages said interlock assembly latching member;
said interlock assembly actuator member first position corresponding to said power connector first housing and said power connector second housing first configuration, and, said interlock assembly actuator member second position corresponding to said power connector first housing and said power connector second housing second configuration;
wherein, when said interlock assembly actuator member is in said first position, said interlock assembly latching member is in said first position, and said interlock assembly locking member is in said first position;
wherein, when said interlock assembly latching member is in said first position said interlock assembly latching member first latching surface is disposed in an obstructing position relative to said interlock assembly locking member first locking surface, wherein said interlock assembly locking member is maintained in said first position;
wherein, when said interlock assembly locking member is in said first position, said interlock assembly locking member second locking surface is not in an obstructing position relative to said interlock assembly actuator member;
wherein, when said interlock assembly latching member is in said second position, said interlock assembly latching member first latching surface is not disposed in an obstructing position relative to said interlock assembly locking member first locking surface, wherein said interlock assembly locking member is movable to said second position; and
wherein, when said interlock assembly locking member is in said second position, said interlock assembly locking member second locking surface is in an obstructing position relative to said interlock assembly actuator member second latching surface, wherein said interlock assembly actuator member is maintained in said second position.

8. The interlock assembly of claim 7 wherein said power connector first housing and said power connector second housing further move between a first transition configuration, wherein said power connector first housing and said power connector second housing move from said first configuration to said second configuration, and a second transition configuration, wherein said power connector first housing and said power connector second housing move from said second configuration to said first configuration, and wherein:
- said interlock assembly actuator member further moves between a first transition position, wherein said interlock assembly actuator member moves from its first position to its second position and wherein said interlock assembly actuator member operatively engages said interlock assembly latching member and moves said interlock assembly latching member from its first position to its second position, and, a second transition position, wherein said interlock assembly actuator member moves from its second position to its first position and wherein said interlock assembly actuator member disengages said interlock assembly latching member and moves said interlock assembly latching member from its second position to its first position; and
- wherein said interlock assembly actuator member first transition position corresponds to said power connector first housing and said power connector second housing first transition configuration, and, said interlock assembly actuator member second transition position corresponds to said power connector first housing and said power connector second housing second transition configuration.

9. The interlock assembly of claim 7 wherein:
- said interlock assembly latching member assembly includes a biasing device;
- said interlock assembly latching member assembly biasing device disposed between said interlock assembly latching member and said power connector first housing; and
- said interlock assembly latching member assembly biasing device biases said interlock assembly latching member to said first position.

10. The interlock assembly of claim 7 wherein:
- said interlock assembly latching member including a body with a base member, an angled engagement surface and a number of protrusions;
- said interlock assembly latching member first latching surface disposed on said interlock assembly latching member body number of protrusions;
- said interlock assembly locking member including a body defining a number of cavities; and
- said interlock assembly locking member first locking surface disposed on said interlock assembly locking member body number of cavities.

11. The interlock assembly of claim 10 wherein:
- said interlock assembly locking member body is generally torus-shaped including a first axial surface, a radial inner surface, a radial outer surface, and a second axial surface;
- said interlock assembly locking member body is structured to be rotatably coupled to said first housing;
- said interlock assembly locking member body first axial surface defining said interlock assembly locking member body number of cavities;
- said interlock assembly locking member body defining a passage between said interlock assembly locking member body outer surface and said interlock assembly locking member body inner surface; and
- said interlock assembly locking member second locking surface disposed on said interlock assembly locking member body inner surface.

12. The interlock assembly of claim 10 wherein said interlock assembly locking member body second axial surface defines a number of gear teeth.

13. The interlock assembly of claim 10 wherein said actuator assembly first gear is a combination gear including a torus shaped body, said actuator assembly first gear body including a first axial surface, an radial inner surface, a radial outer surface, and an second axial surface, said actuator assembly first gear body first axial surface including a number of bevel gear teeth, said actuator assembly first gear body outer surface including a number of spur gear teeth, said actuator assembly first gear body second axial surface including a number of bevel gear teeth, and wherein said interlock assembly locking member body first axial surface define a number of bevel gear teeth.

14. The interlock assembly of claim 7 wherein said interlock assembly actuator member protrudes from said second housing.

15. The interlock assembly of claim 7 wherein said interlock assembly actuator member is unitary with said second housing.

16. The interlock assembly of claim 7 wherein said second housing is a generally circular housing and wherein:
- said interlock assembly actuator member is unitary with said second housing;
- said interlock assembly actuator member protrudes generally radially from said second housing; and
- said interlock assembly actuator member interlock assembly actuator member second latching surface is a generally axial surface relative to said second housing.

* * * * *